(12) United States Patent
Pyo et al.

(10) Patent No.: US 10,886,318 B2
(45) Date of Patent: Jan. 5, 2021

(54) IMAGE SENSOR

(71) Applicant: Samsung Electronics Co., Ltd., Suwon-si (KR)

(72) Inventors: Junghyung Pyo, Seoul (KR); Kyungho Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/699,150

(22) Filed: Nov. 29, 2019

(65) Prior Publication Data
US 2020/0243579 A1     Jul. 30, 2020

Related U.S. Application Data

(63) Continuation-in-part of application No. 16/566,943, filed on Sep. 11, 2019.

(30) Foreign Application Priority Data

Jan. 30, 2019  (KR) .......................... 10-2019-0011793
Nov. 27, 2019  (KR) .......................... 10-2019-0154528

(51) Int. Cl.
  *H01L 27/146*     (2006.01)
(52) U.S. Cl.
  CPC .... *H01L 27/1463* (2013.01); *H01L 27/14609* (2013.01); *H01L 27/14627* (2013.01); *H01L 27/14645* (2013.01); *H01L 27/14621* (2013.01)

(58) Field of Classification Search
  CPC ................................................. H01L 27/1463
  See application file for complete search history.

(56) References Cited

U.S. PATENT DOCUMENTS

| | | | |
|---|---|---|---|
| 9,437,645 B1* | 9/2016 | Chou | ................ H01L 27/14627 |
| 9,490,281 B2 | 11/2016 | Fukuda et al. | |
| 9,661,194 B2 | 5/2017 | Sakano et al. | |
| 9,876,044 B2 | 1/2018 | Lee et al. | |
| 9,911,777 B2 | 3/2018 | Lee et al. | |
| 10,073,239 B1 | 9/2018 | Jung et al. | |
| 10,249,666 B2 | 4/2019 | Pyo et al. | |
| 2016/0276394 A1* | 9/2016 | Chou | ................ H01L 27/14621 |
| 2016/0307943 A1* | 10/2016 | Cheng | ................ H01L 27/1464 |
| 2017/0047367 A1 | 2/2017 | Lee et al. | |
| 2017/0092684 A1 | 3/2017 | Chang et al. | |

(Continued)

*Primary Examiner* — George R Fourson, III
(74) *Attorney, Agent, or Firm* — Muir Patent Law, PLLC

(57) ABSTRACT

An image sensor is disclosed. The image sensor may include a semiconductor substrate including a first pixel group region and a second pixel group region, the first pixel group region including first pixel regions to sense a first light, the second pixel group region including second pixel regions to sense a second light, each of the first and second pixel regions arranged in n columns and m rows, a pixel isolation structure disposed in the semiconductor substrate to separate the first and second pixel regions from each other, first and second photoelectric conversion regions disposed in each of the first and second pixel regions of the semiconductor substrate, and a first separation structure disposed in each of the first pixel regions and in the semiconductor substrate between the first and second photoelectric conversion regions. The first separation structure may be spaced apart from the pixel isolation structure.

20 Claims, 59 Drawing Sheets

(56) References Cited

U.S. PATENT DOCUMENTS

| | | |
|---|---|---|
| 2018/0047766 A1* | 2/2018 | Pyo .................. H01L 27/14605 |
| 2019/0045111 A1 | 2/2019 | Galor |
| 2019/0131328 A1 | 5/2019 | Kim et al. |
| 2019/0165009 A1 | 5/2019 | Wu et al. |
| 2020/0058684 A1 | 2/2020 | Wu et al. |
| 2020/0059618 A1* | 2/2020 | Watanabe ......... H01L 27/14627 |

* cited by examiner

IMAGE SENSOR

CROSS-REFERENCE TO RELATED APPLICATIONS

This U.S. non-provisional patent application is a continuation-in-part application of U.S. patent application Ser. No. 16/566,943, filed Sep. 11, 2019, which claims priority under 35 U.S.C. § 119 to Korean Patent Application No. 10-2019-0011793, filed on Jan. 30, 2019, in the Korean Intellectual Property Office, the entire contents of each of which are hereby incorporated by reference. This application also claims priority under 35 U.S.C. § 119 to Korean Patent Application No. 10-2019-0154528, filed on Nov. 27, 2019, in the Korean Intellectual Property Office, the entire contents of which is hereby incorporated by reference.

BACKGROUND OF THE INVENTION

The present disclosure relates to an image sensor, and in particular, to an image sensor with an auto-focusing (AF) function.

An image sensor is a device that converts optical images into electrical signals. With increased development of the computer and communications industries, there is an increasing demand for high performance image sensors in a variety of applications such as smart phones, wearable devices, digital cameras, personal communication systems, gaming machines, security cameras, micro-cameras for medical applications, and/or robots.

The image sensors may be generally classified into charge-coupled-device (CCD) sensors and complementary metal-oxide-semiconductor (CMOS) image sensors. Since the CMOS image sensor can be operated in a simple manner and can be provided as a single chip integrated with signal processing circuits, a size of a product therewith can be reduced. In addition, due to its relatively low power consumption property, the CMOS image sensor is easily applicable to an electronic device with a limited battery capacity. Furthermore, the resolution of the CMOS image sensor is increasing with technology development, and thus, the use of the CMOS image sensor is increasing rapidly.

SUMMARY

An embodiment of the inventive concept provides an image sensor with improved optical and electrical characteristics.

According to an embodiment of the inventive concept, an image sensor may include a semiconductor substrate including a first pixel group region and a second pixel group region, the first pixel group region including first pixel regions arranged in n columns and m rows to sense a first light, the second pixel group region including second pixel regions arranged in n columns and m rows to sense a second light, a pixel isolation structure disposed in the semiconductor substrate to separate the first and second pixel regions from each other, first and second photoelectric conversion regions disposed in each of the first and second pixel regions of the semiconductor substrate, and a first separation structure disposed in each of the first pixel regions and in the semiconductor substrate between the first and second photoelectric conversion regions. The numbers n and m may be each independently a natural number that is greater than or equal to 2, and the first separation structure may be spaced apart from the pixel isolation structure.

According to an embodiment of the inventive concept, an image sensor may include a semiconductor substrate including a first pixel group region and a second pixel group region, the first pixel group region including first pixel regions arranged in n columns and m rows to sense a first light, the second pixel group region including second pixel regions arranged in n columns and m rows to sense a second light, and first micro lenses respectively disposed on the first pixel regions of the semiconductor substrate. The numbers n and m may be each independently a natural number that is greater than or equal to 2, and centers of the first micro lenses may be spaced apart from centers of the first pixel regions, respectively, when viewed in a plan view.

According to an embodiment of the inventive concept, an image sensor may include a semiconductor substrate including a first pixel group region, a second pixel group region, and a third pixel group region, the first pixel group region including first pixel regions arranged in n columns and m rows to sense a first light, the second pixel group region including second pixel regions arranged in n columns and m rows to sense a second light, the third pixel group region including third pixel regions arranged in n columns and m rows to sense a third light, a pixel isolation structure disposed in the semiconductor substrate to separate the first to third pixel regions from each other, first and second photoelectric conversion regions disposed in each of the first to third pixel regions of the semiconductor substrate, a first separation structure disposed in each of the first pixel regions and in the semiconductor substrate between the first and second photoelectric conversion regions, a second separation structure disposed in each of the second pixel regions and in the semiconductor substrate between the first and second photoelectric conversion regions, and a third separation structure disposed in each of the third pixel regions and in the semiconductor substrate between the first and second photoelectric conversion regions. The numbers n and m may be each independently a natural number that is greater than or equal to 2. The first separation structure and the second separation structure may be spaced apart from the pixel isolation structure.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

5A to illustrate an active pixel sensor array of an image sensor according to an embodiment of the inventive concept.

Figure 5A:
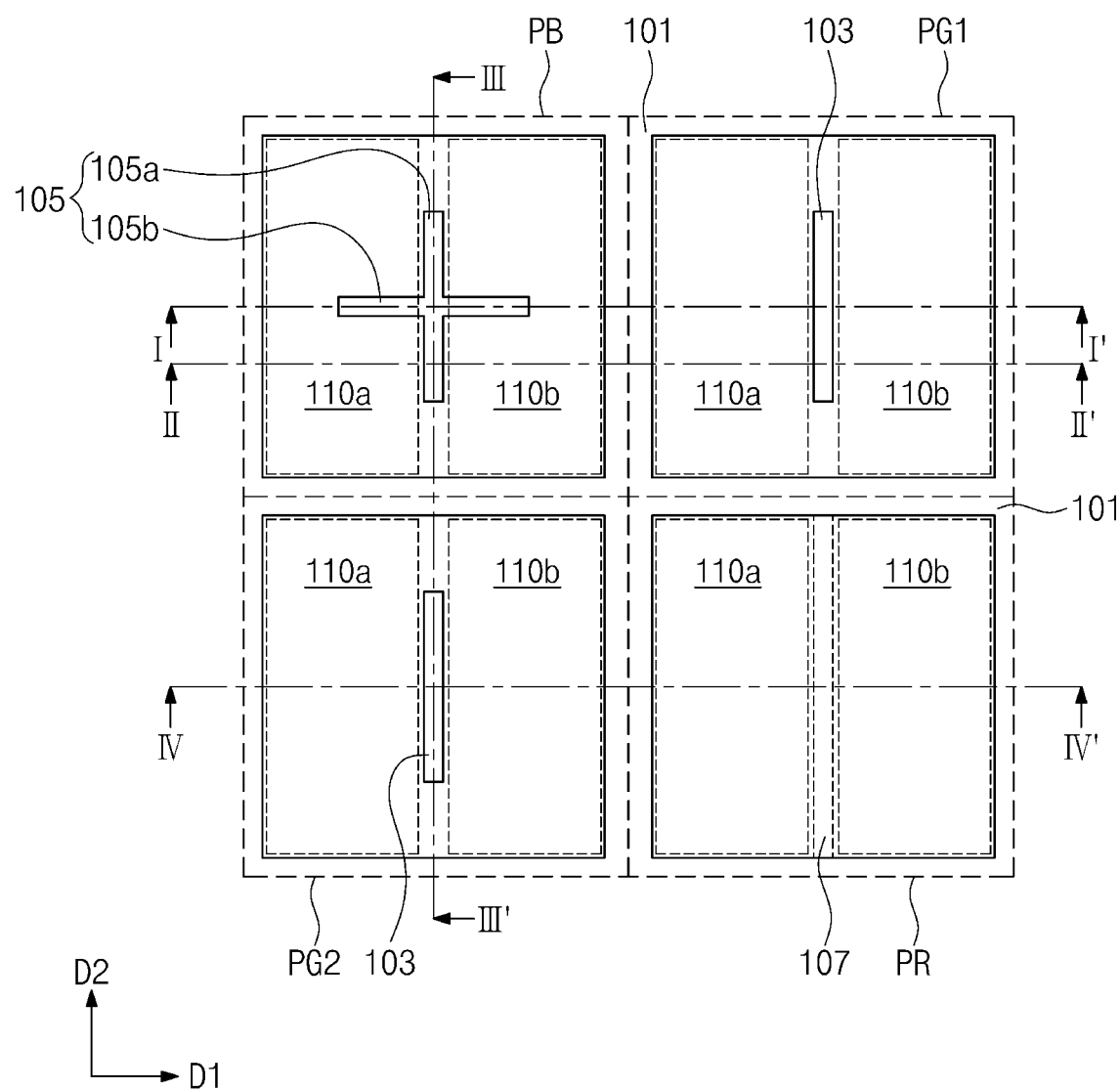
FIGS. 5A, 5C, 5D, and 5E are plan views, each illustrating an active pixel sensor array of an image sensor according to an embodiment of the inventive concept.
Figure 7A:
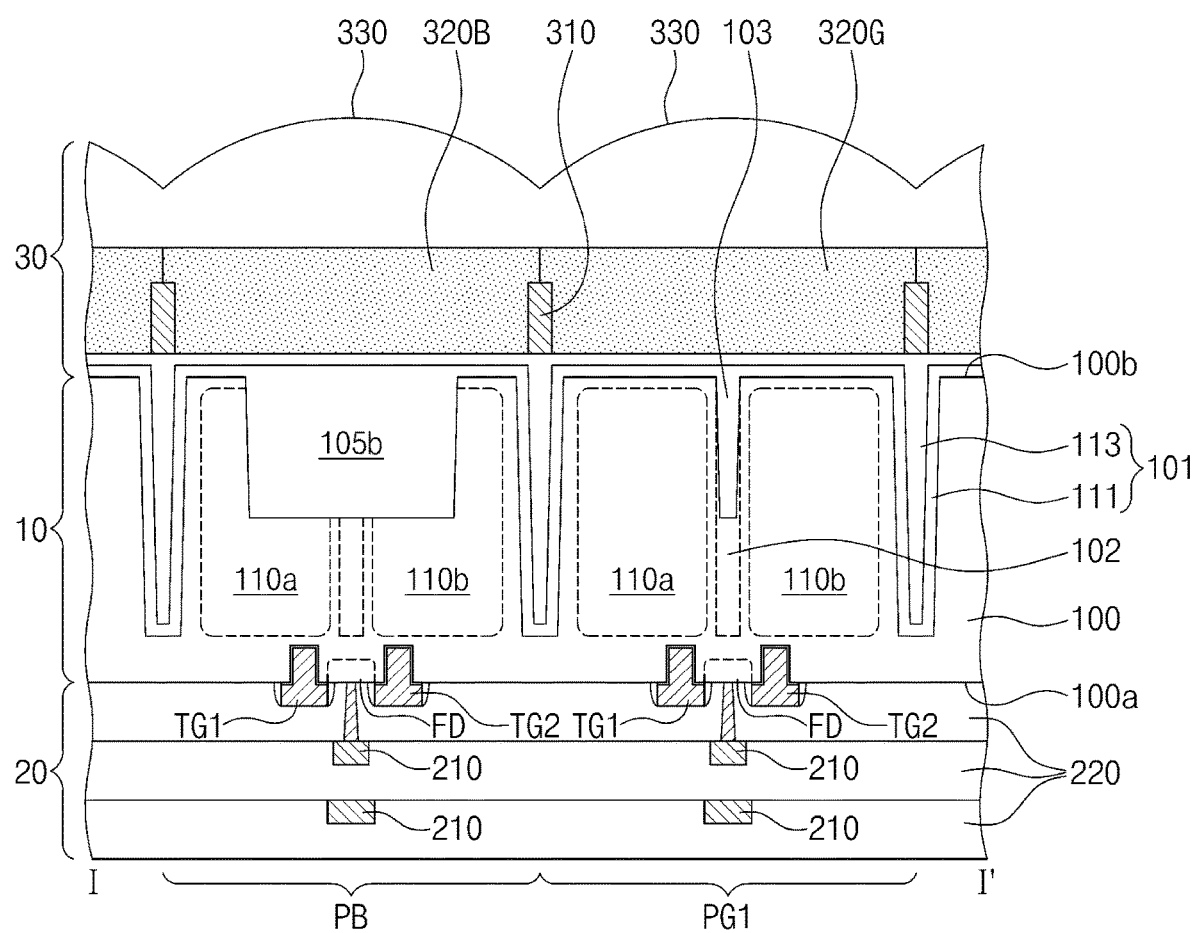
Figure 7B:
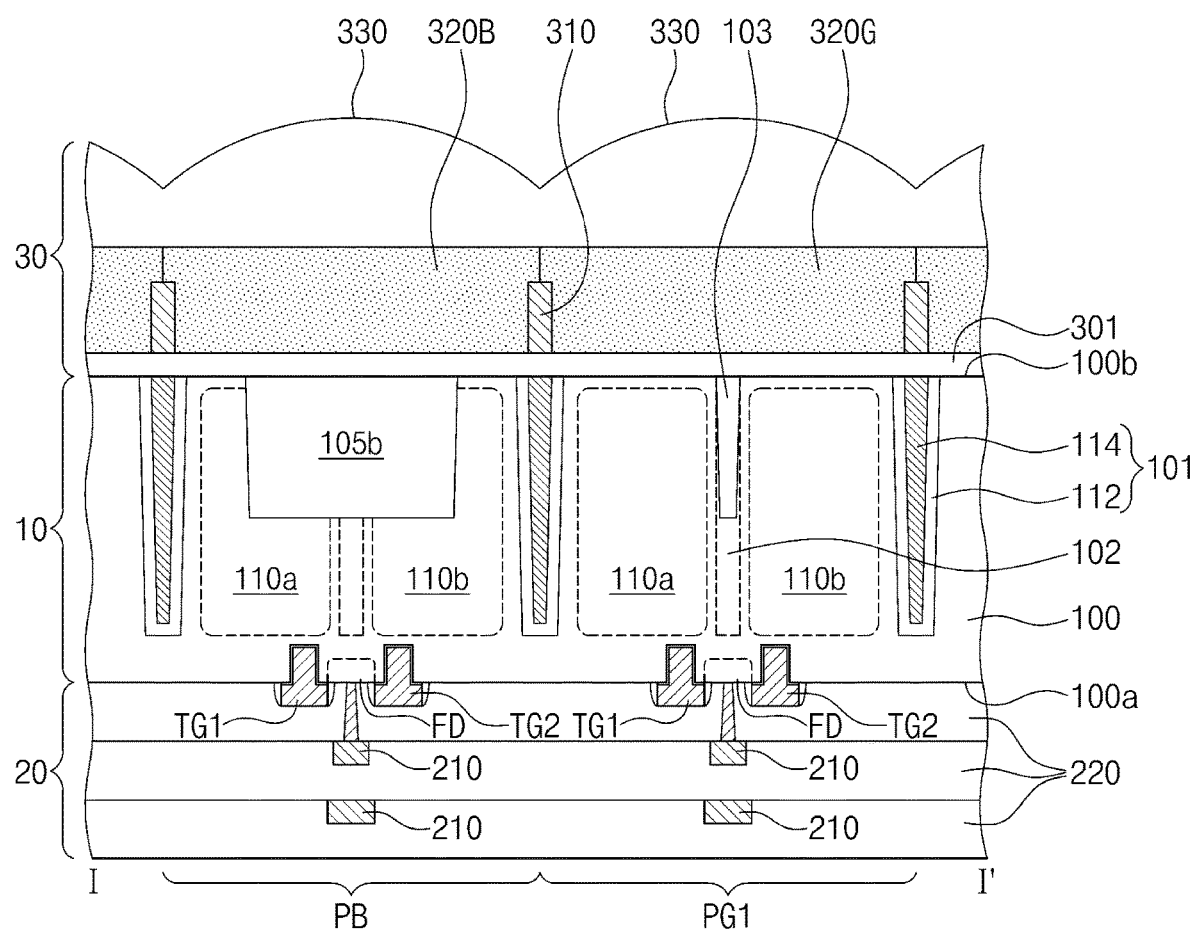
Figure 7C:
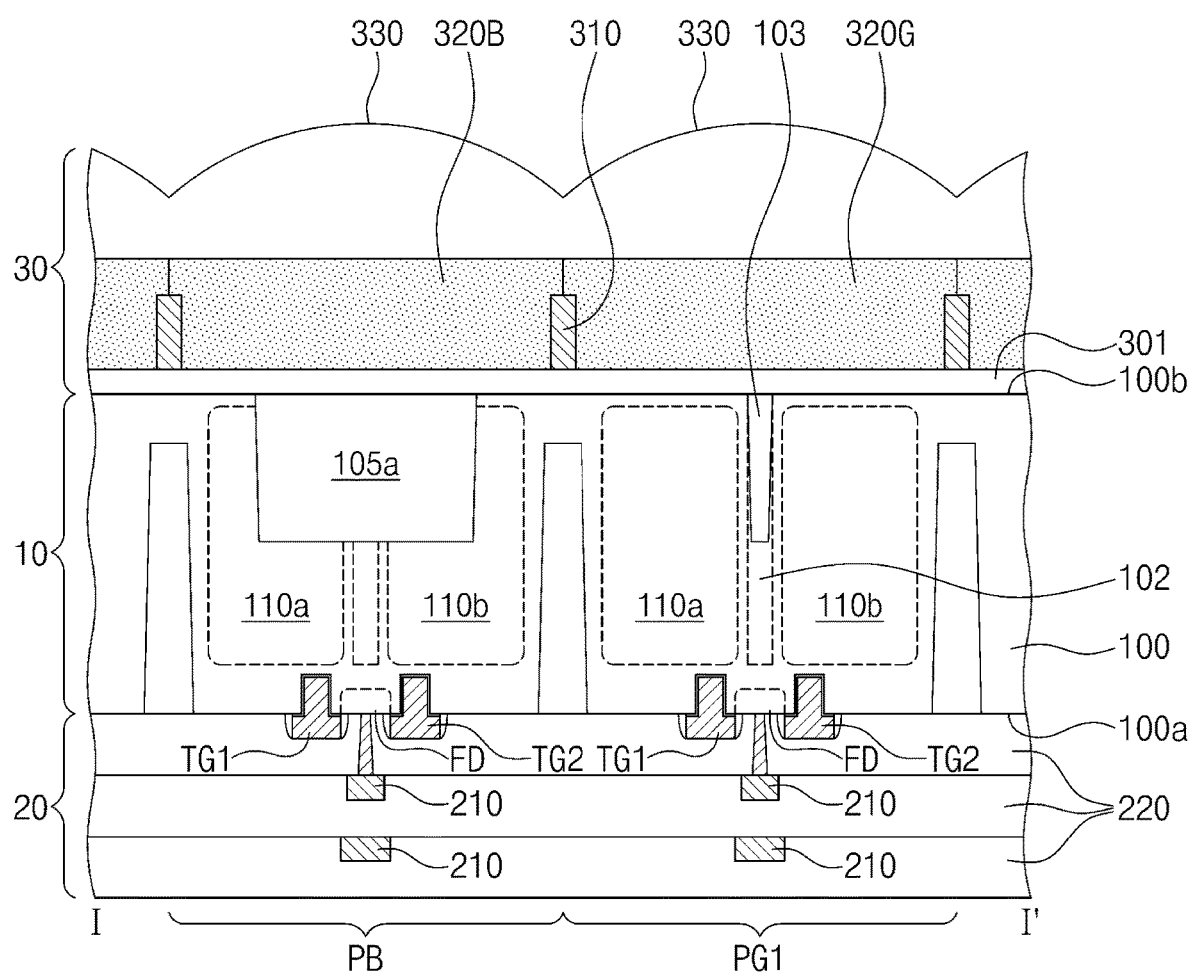

FIGS. 7A, 7B, and 7C are sectional views, each of which is taken along a line I-I' of FIG. 5A to illustrate an image sensor according to an embodiment of the inventive concept.

FIGS. 8A, 9A, 10A, and 10C are plan views, each illustrating an active pixel sensor array of an image sensor according to an embodiment of the inventive concept.

Figure 8A:
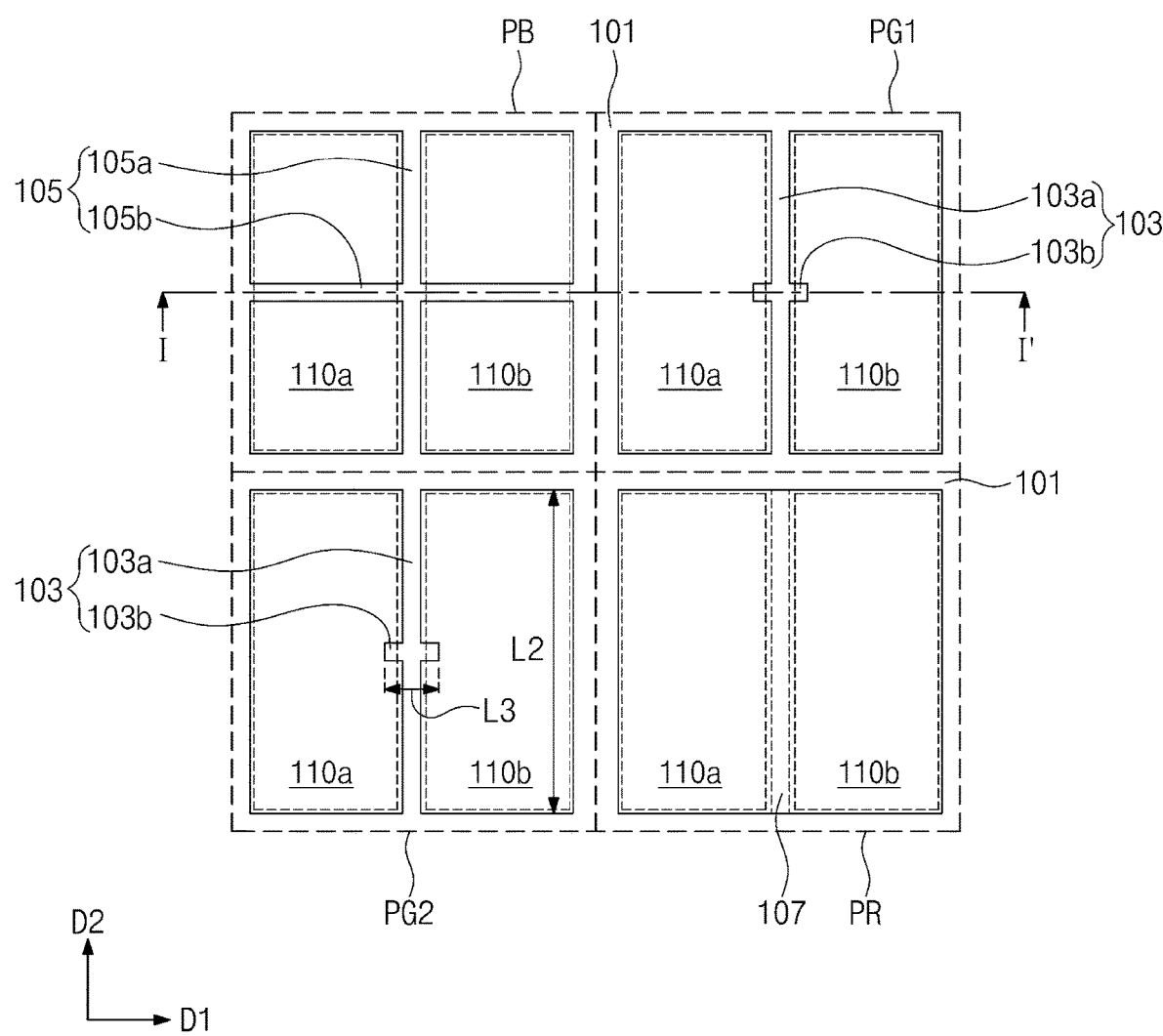
Figure 8B:
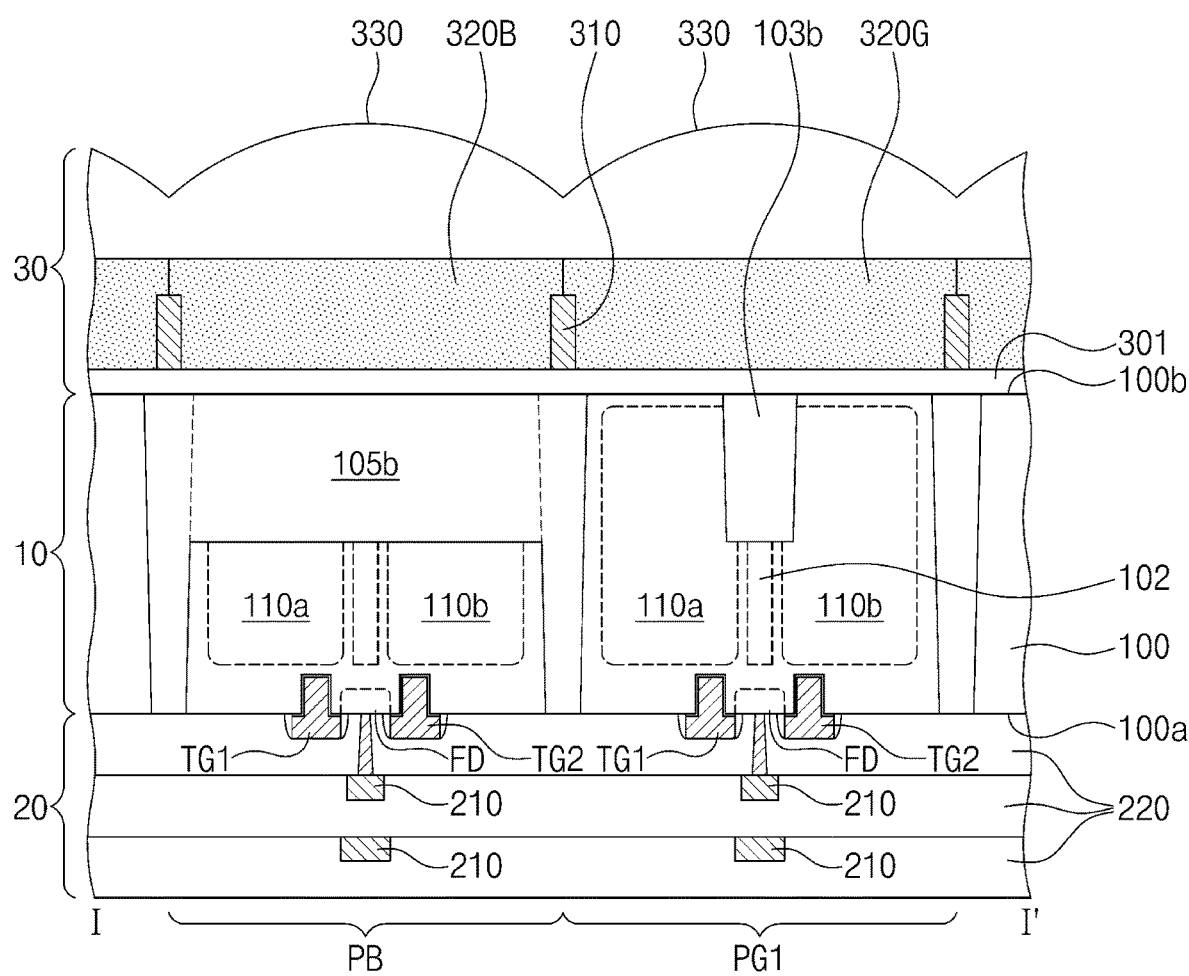
Figure 9A:
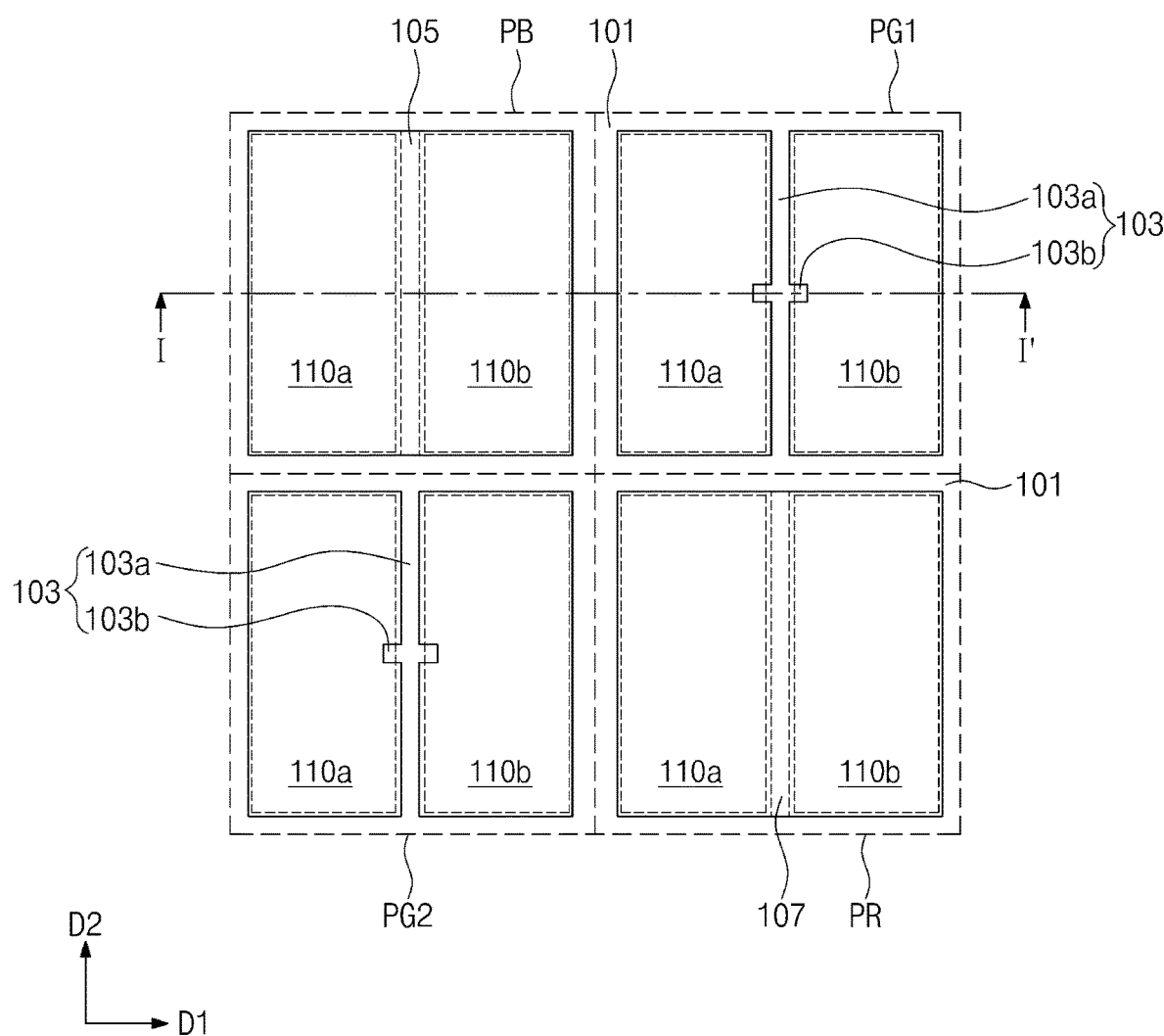
Figure 9B:
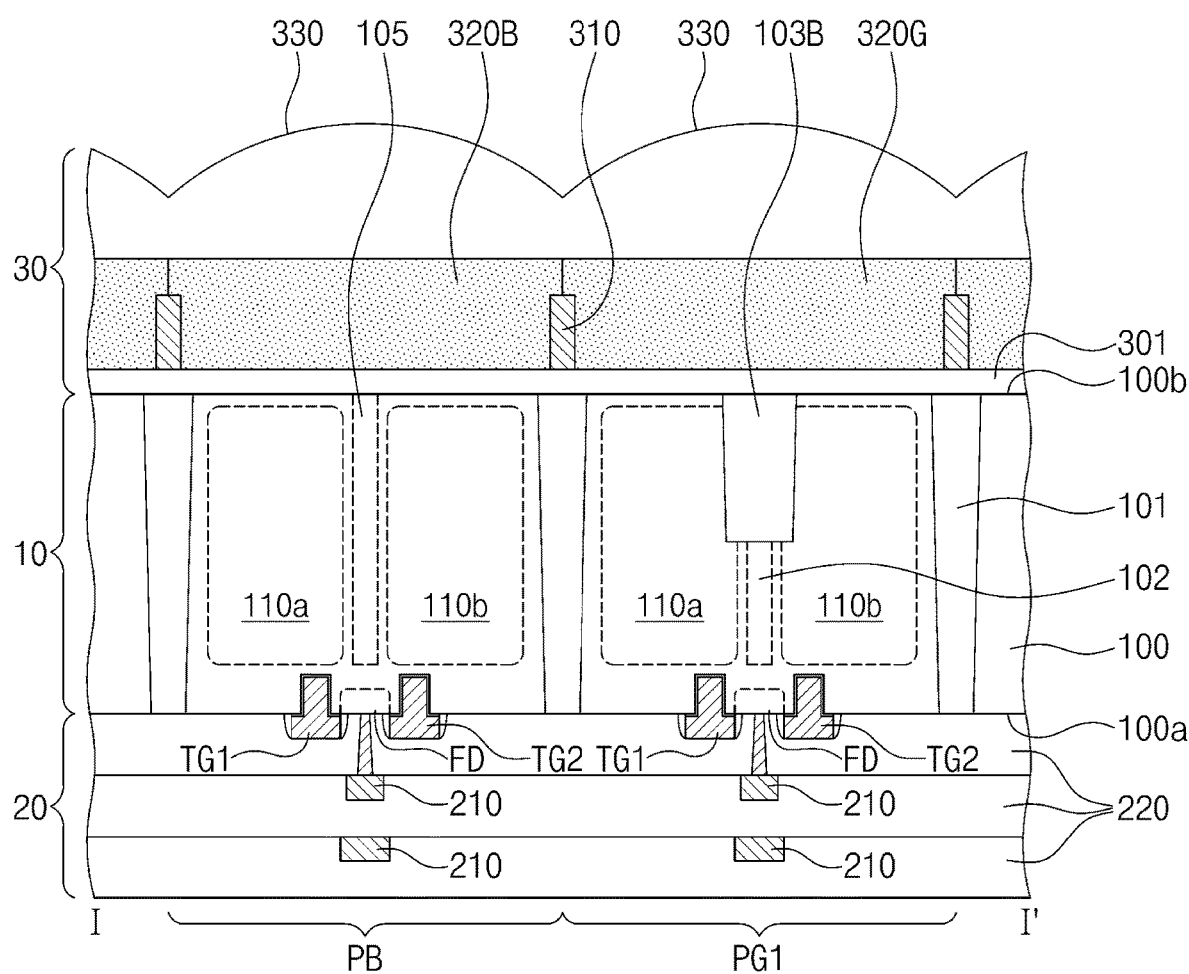
Figure 10A:
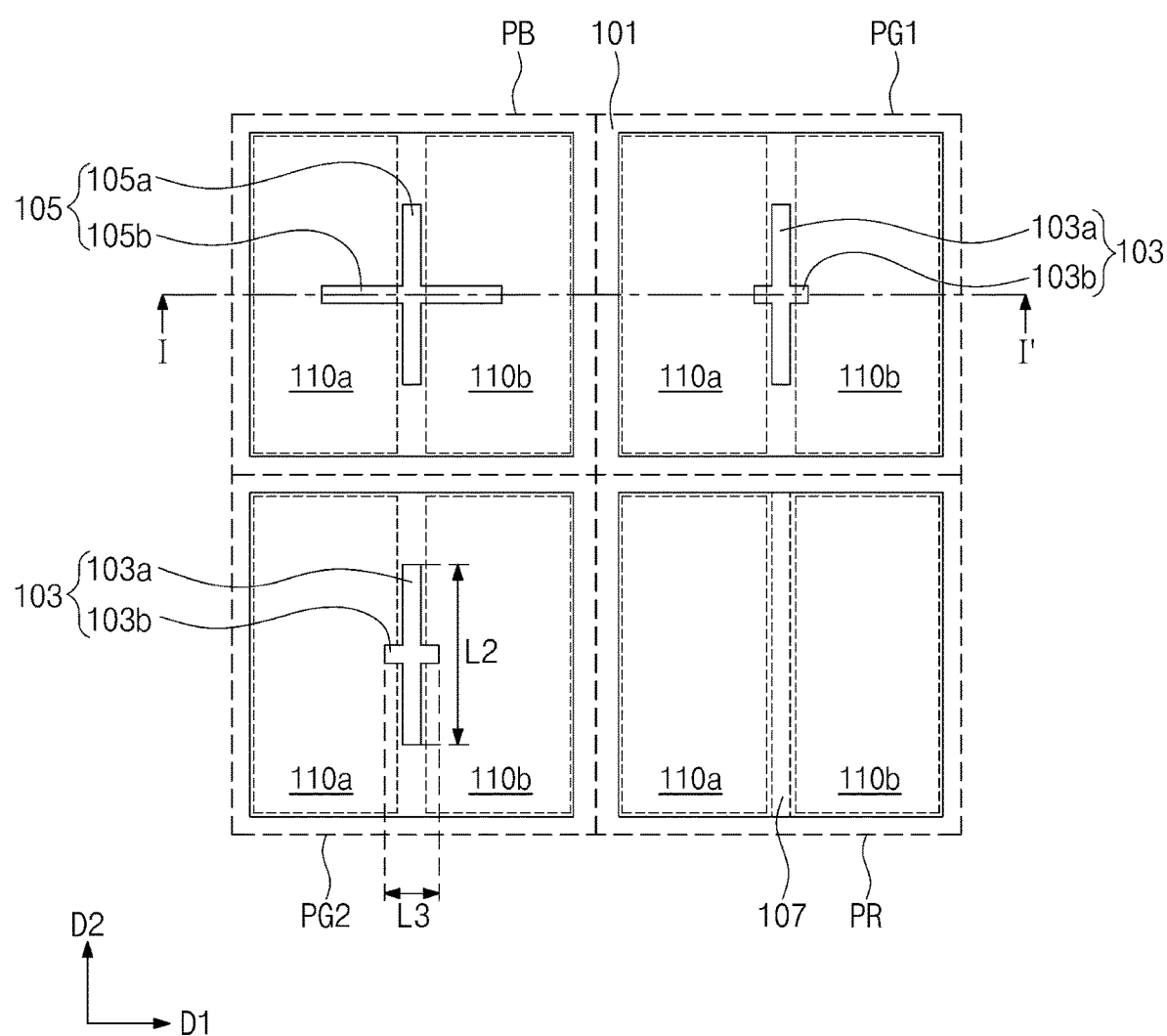
Figure 10B:
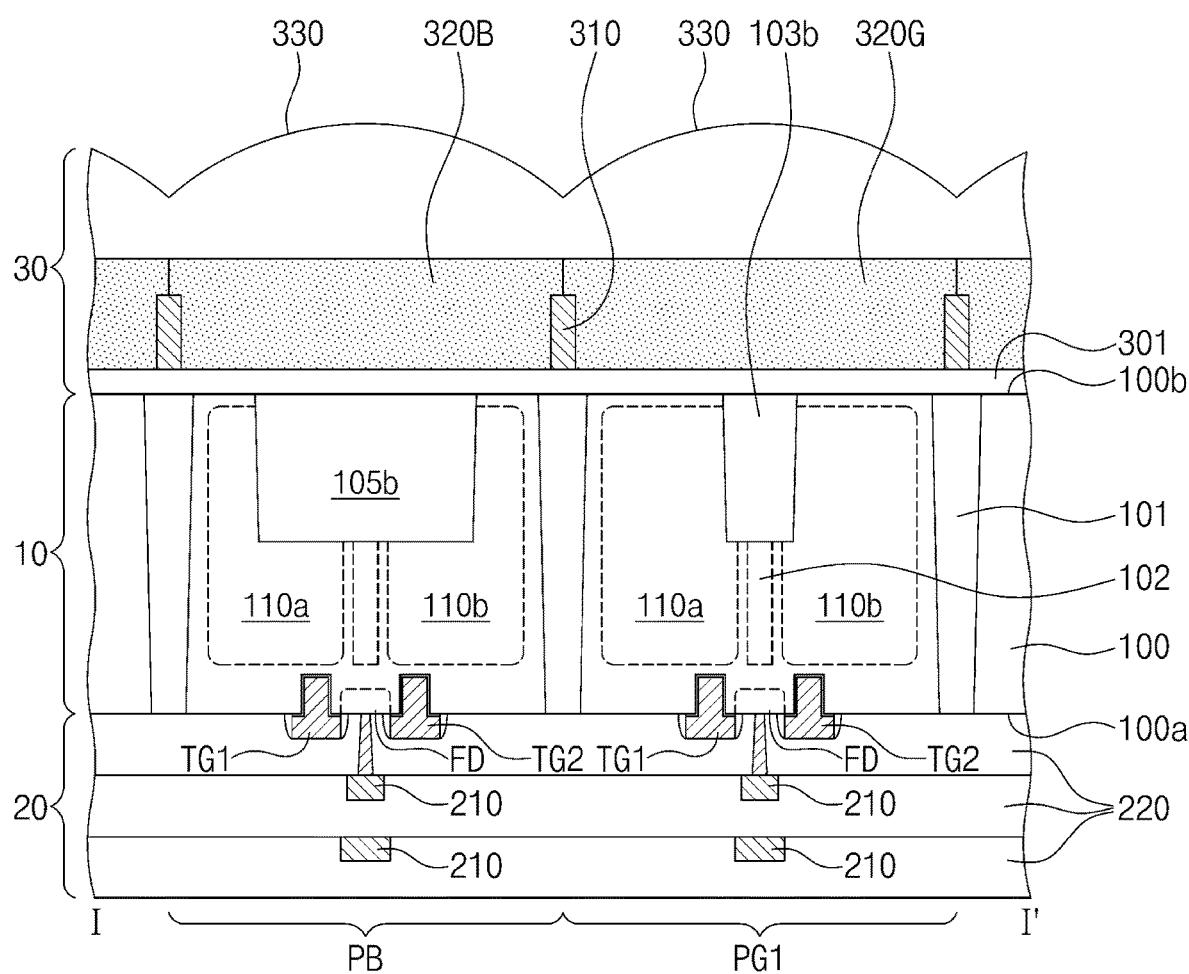

FIGS. 8B, 9B, and 10B are sectional views, which are respectively taken along lines I-I' of FIGS. 8A, 9A, and 10A to illustrate an active pixel sensor array of an image sensor according to an embodiment of the inventive concept.

Figure 11A:
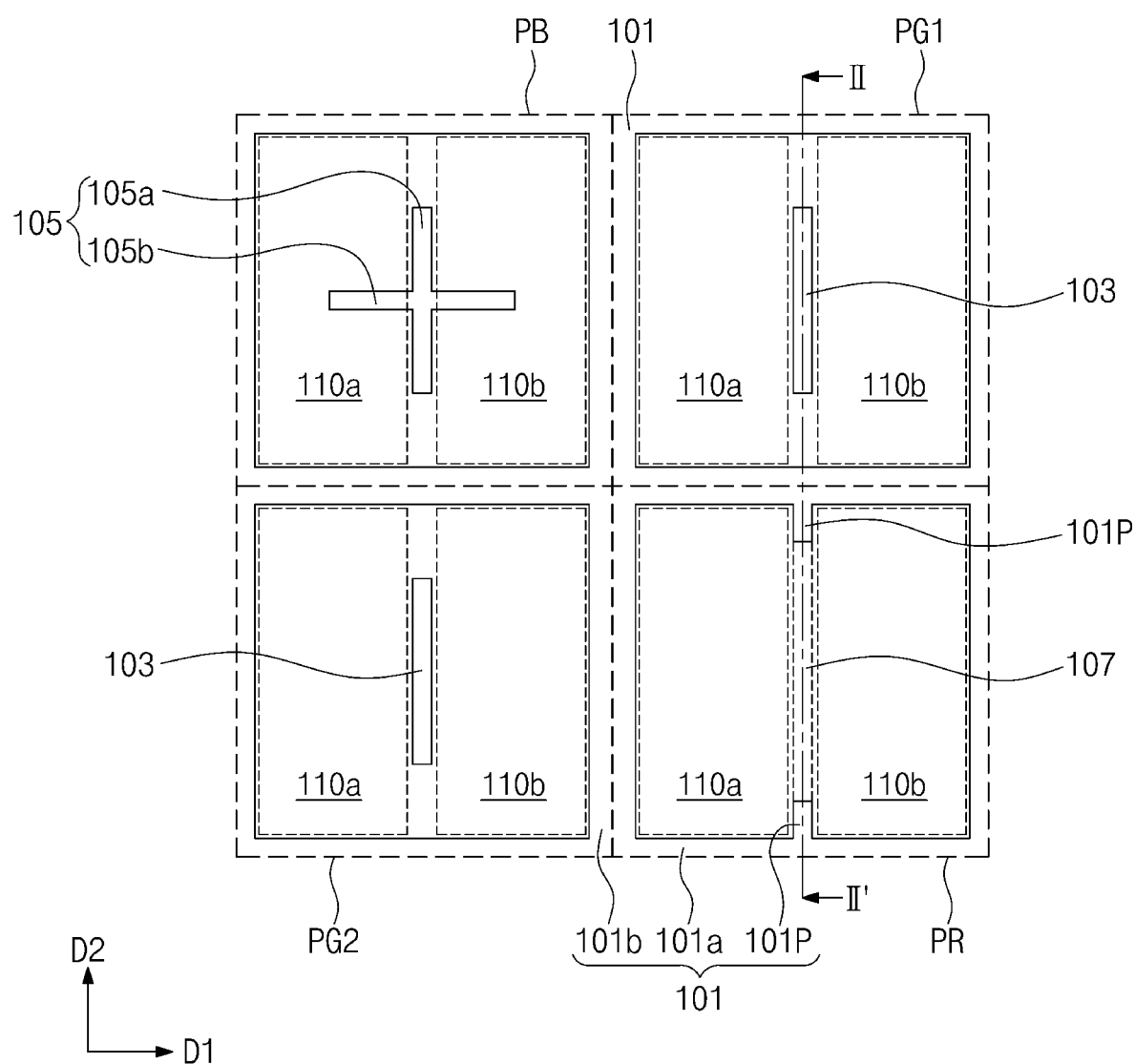
Figure 11B:
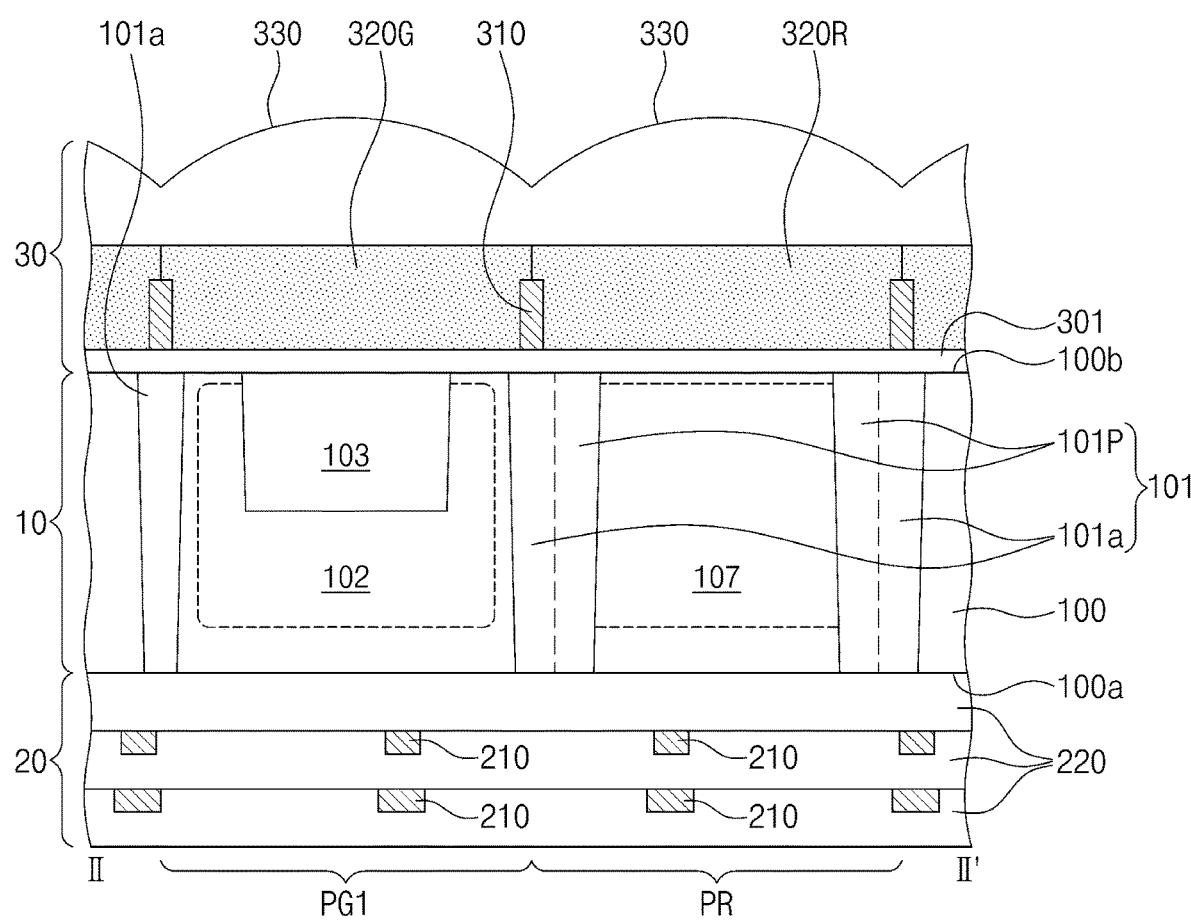

FIGS. 11A and 11B are plan and sectional views illustrating an active pixel sensor array of an image sensor according to an embodiment of the inventive concept, and FIG. 11B is a section view taken along a line I-I' of FIG. 11A.

FIGS. 12A, 12B, 12C, and 12D are plan views, each illustrating an image sensor according to according to an embodiment of the inventive concept.

Figure 13A:
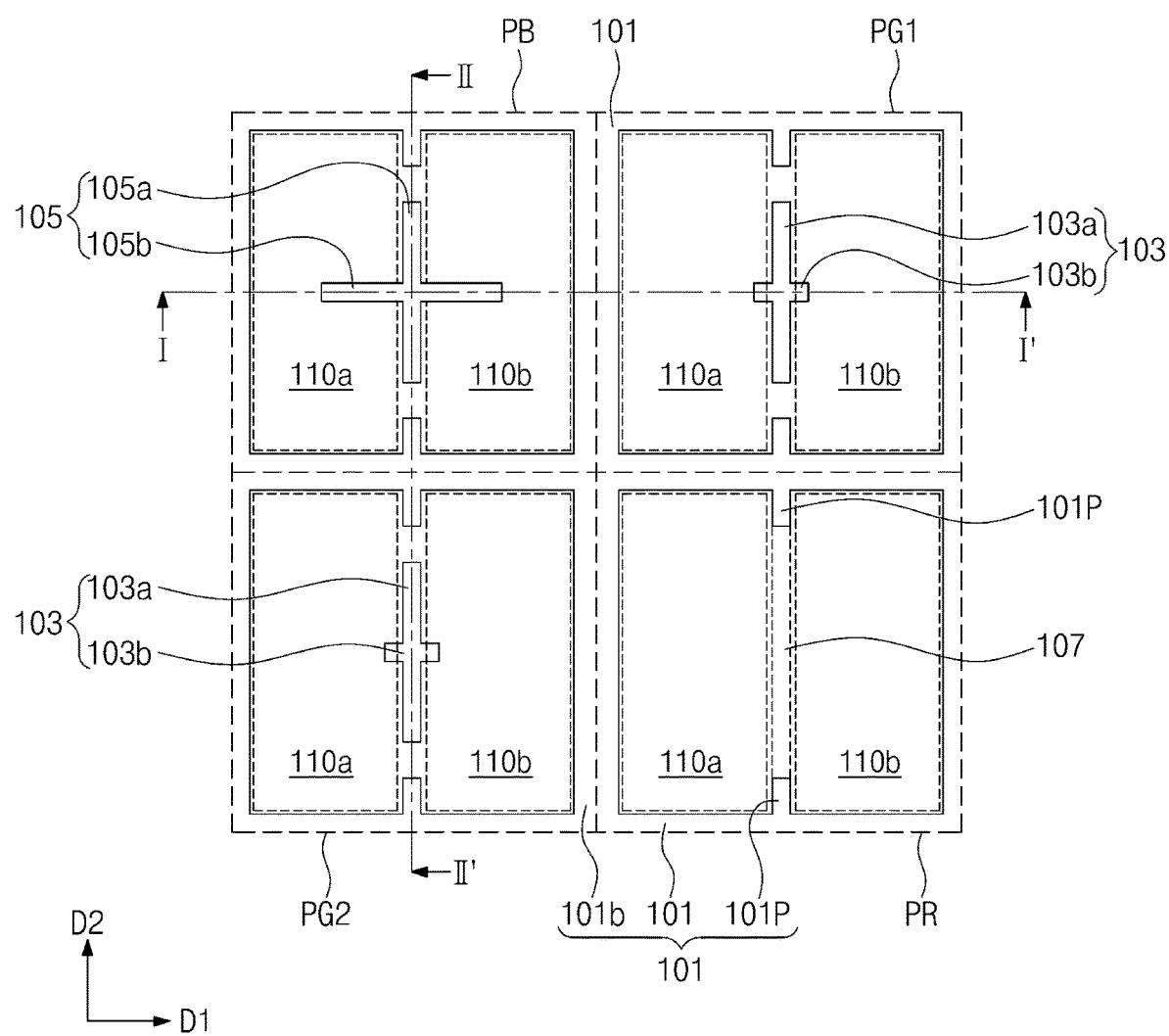
Figure 13B:
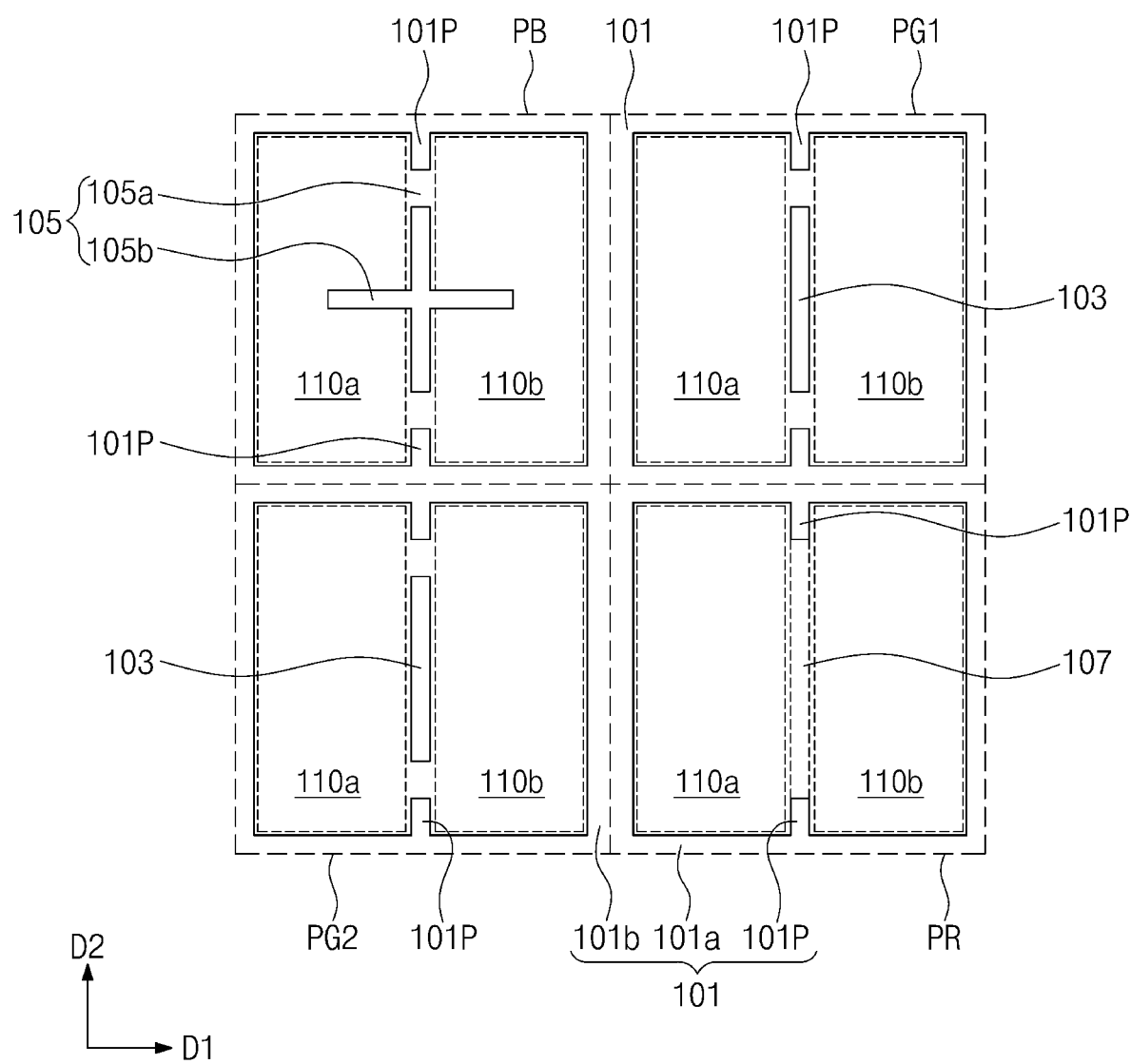

FIGS. 13A and 13B are plan views, each illustrating an active pixel sensor array of an image sensor according to an embodiment of the inventive concept.

Figure 14A:
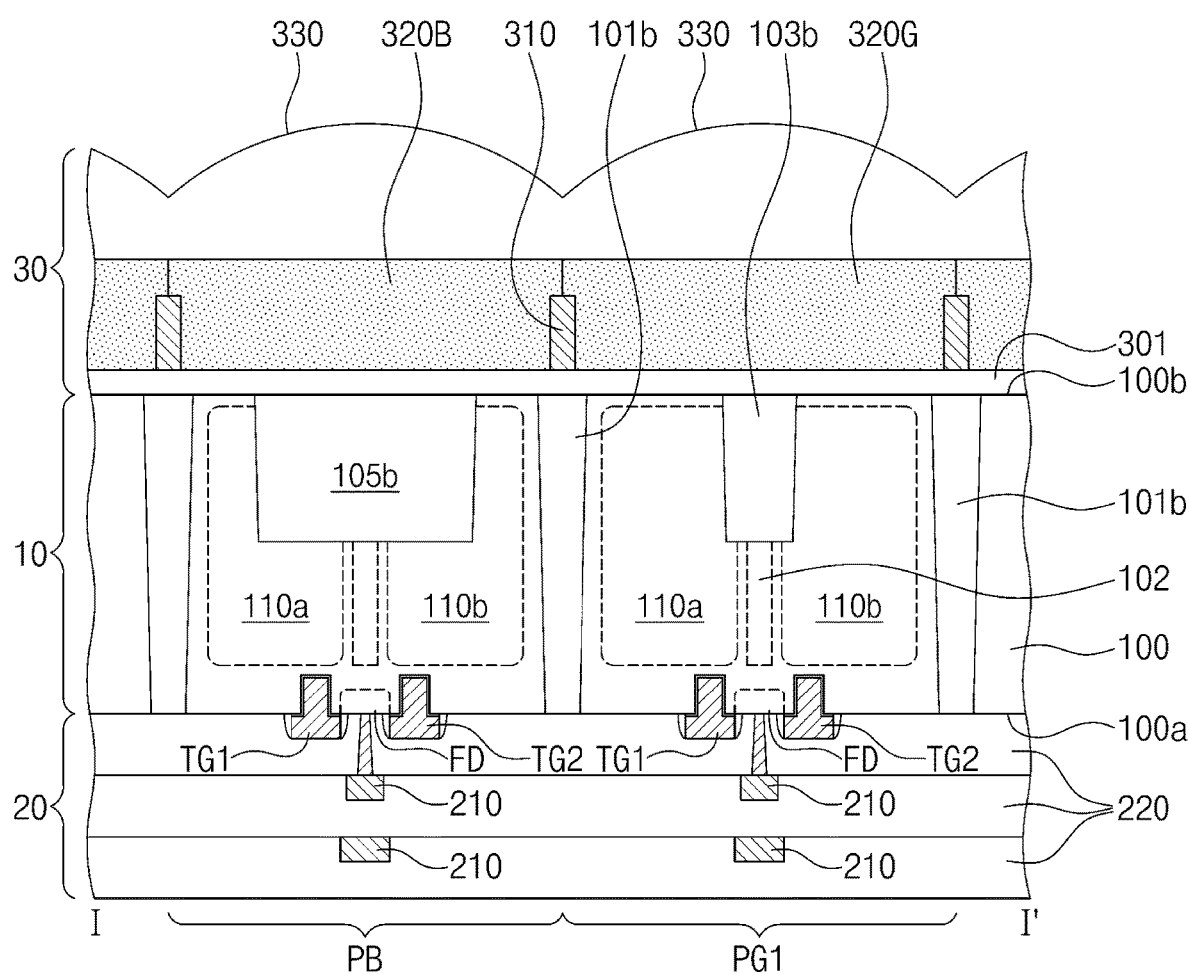
Figure 14B:
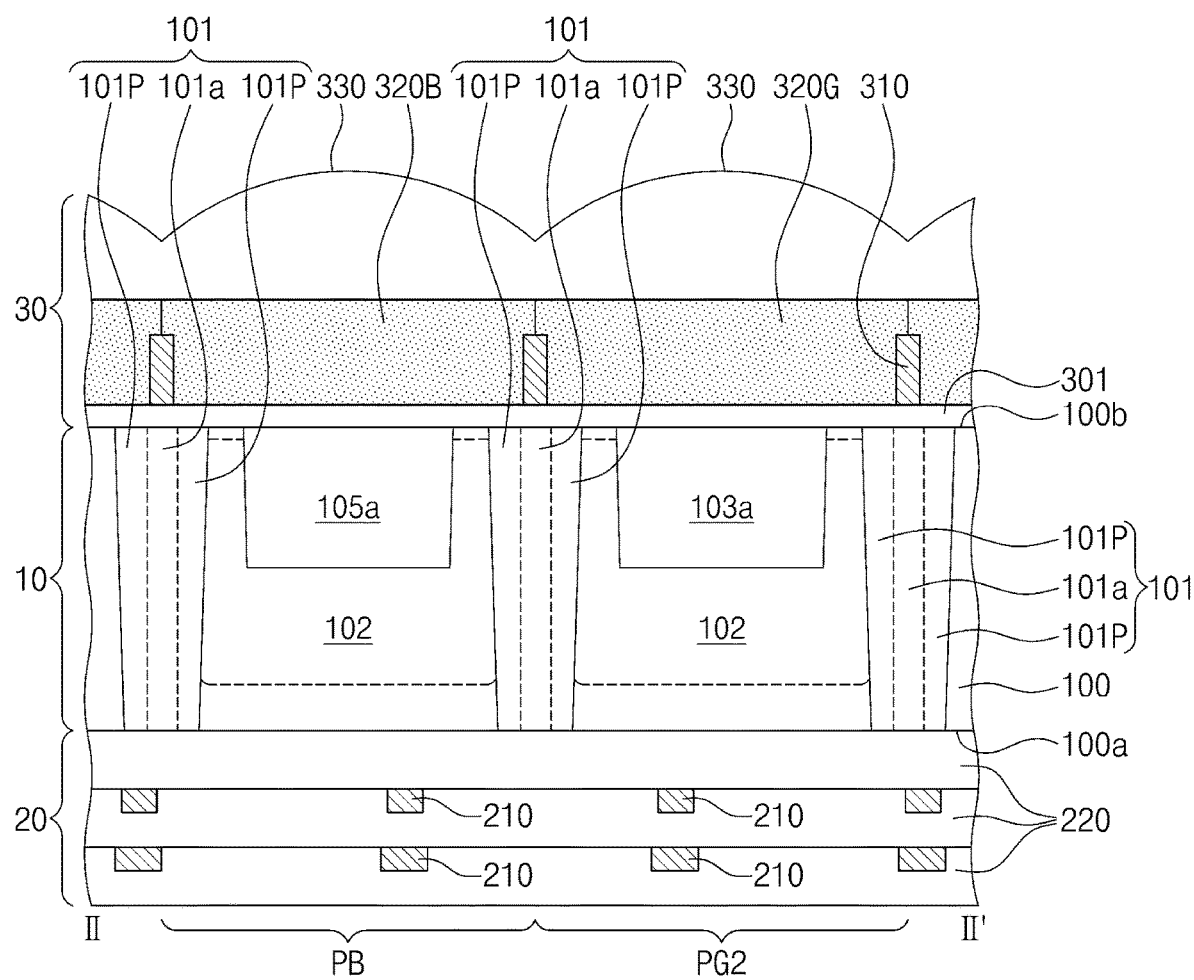

FIGS. 14A and 14B are sectional views, which are taken along lines I-I' and II-II' of FIG. 13A to illustrate an active pixel sensor array of an image sensor according to an embodiment of the inventive concept.

FIGS. 15A, 15B, 15C, and 15D are plan views, each illustrating an active pixel sensor array of an image sensor according to an embodiment of the inventive concept.

FIGS. 16A, 16B, 16C, and 16D are plan views, each illustrating an active pixel sensor array of an image sensor according to an embodiment of the inventive concept.

Figure 16A:
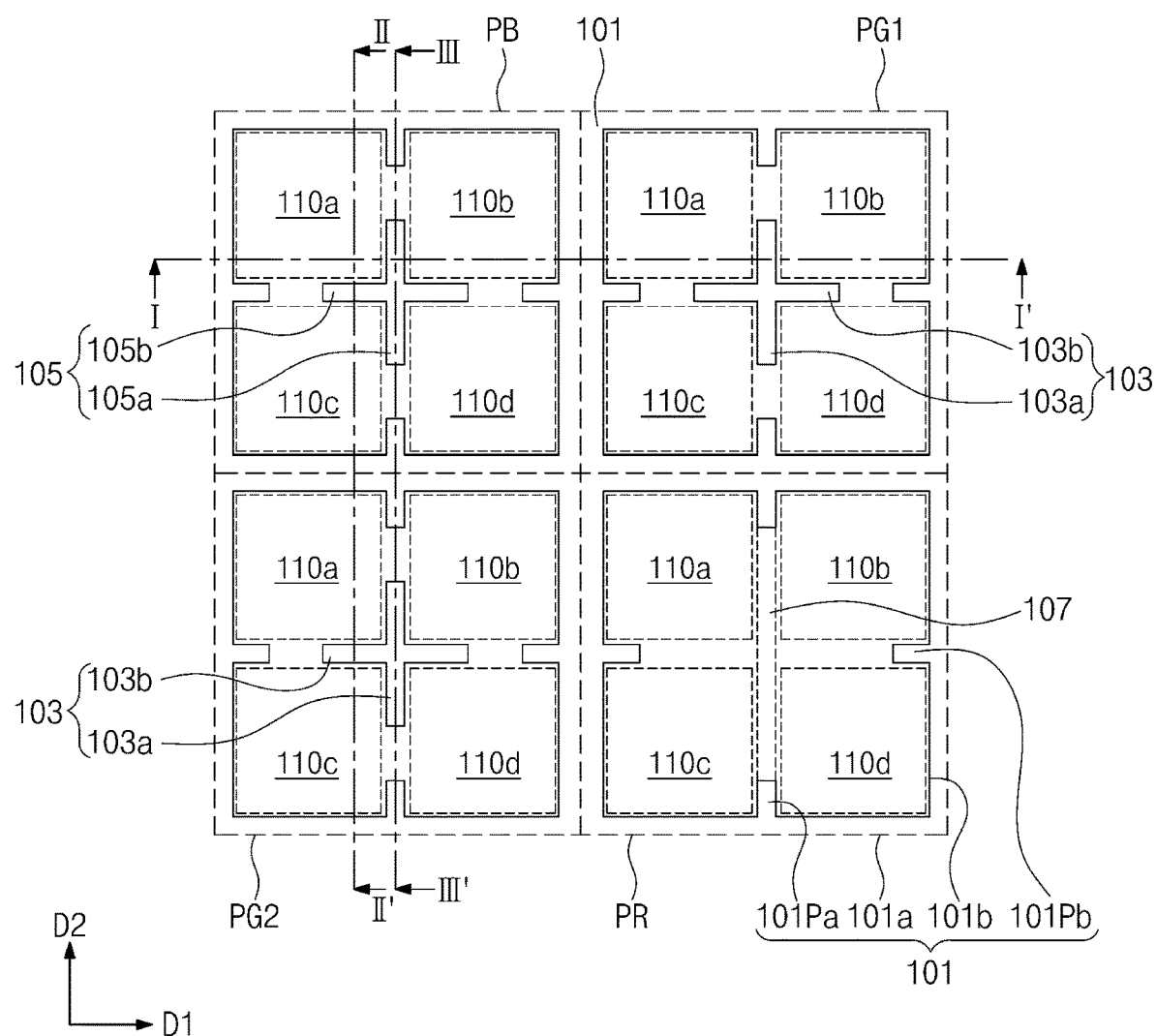
Figure 17A:
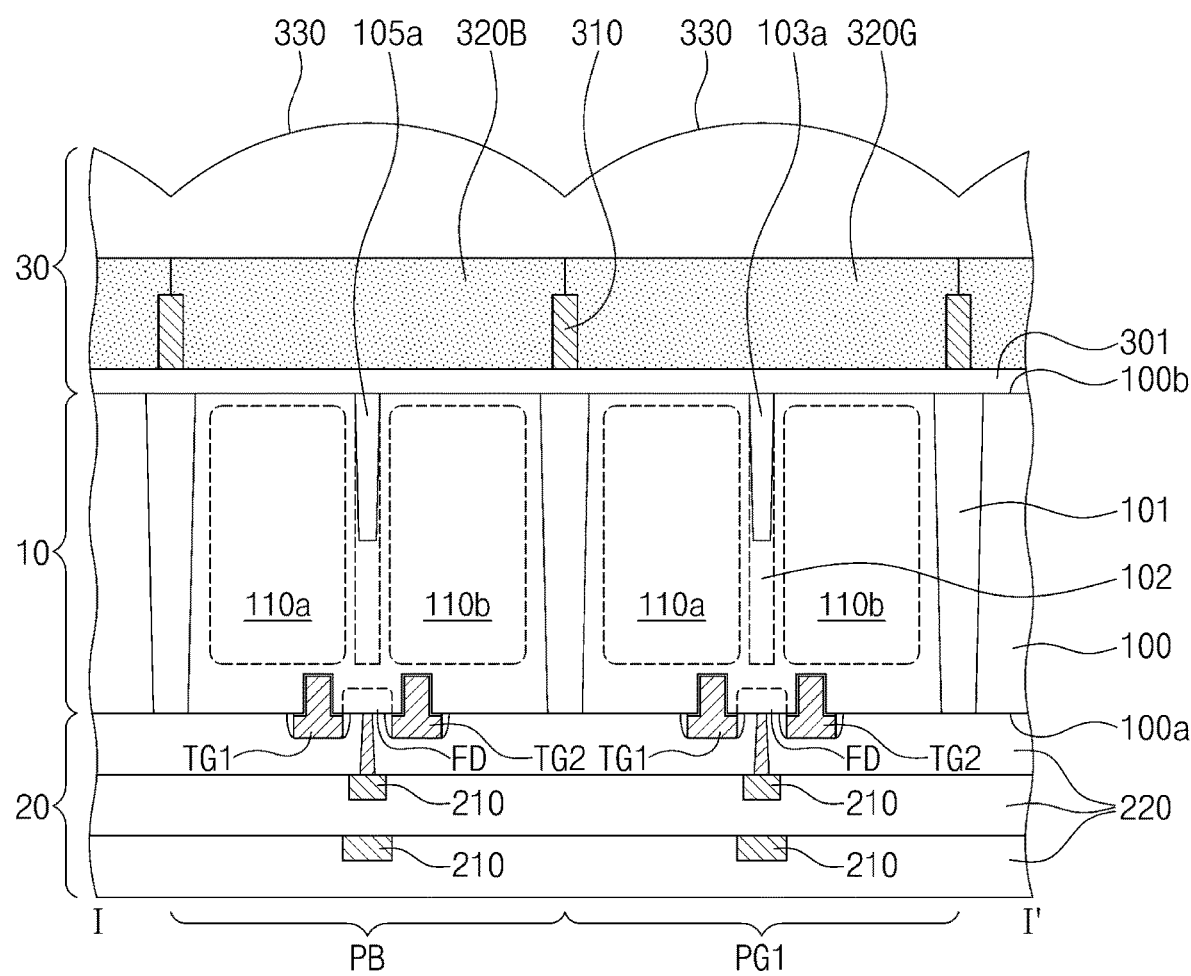
Figure 17B:
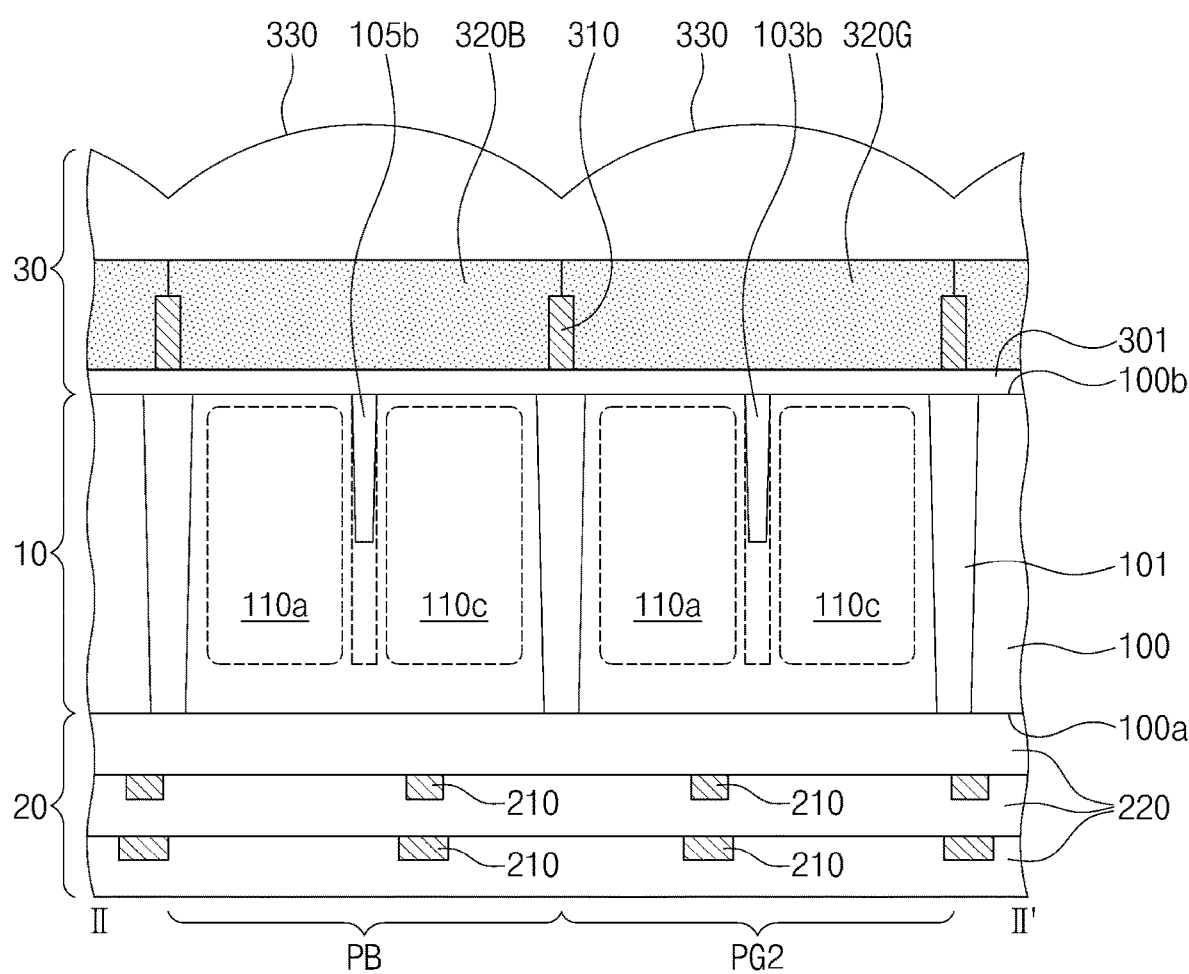
Figure 17C:
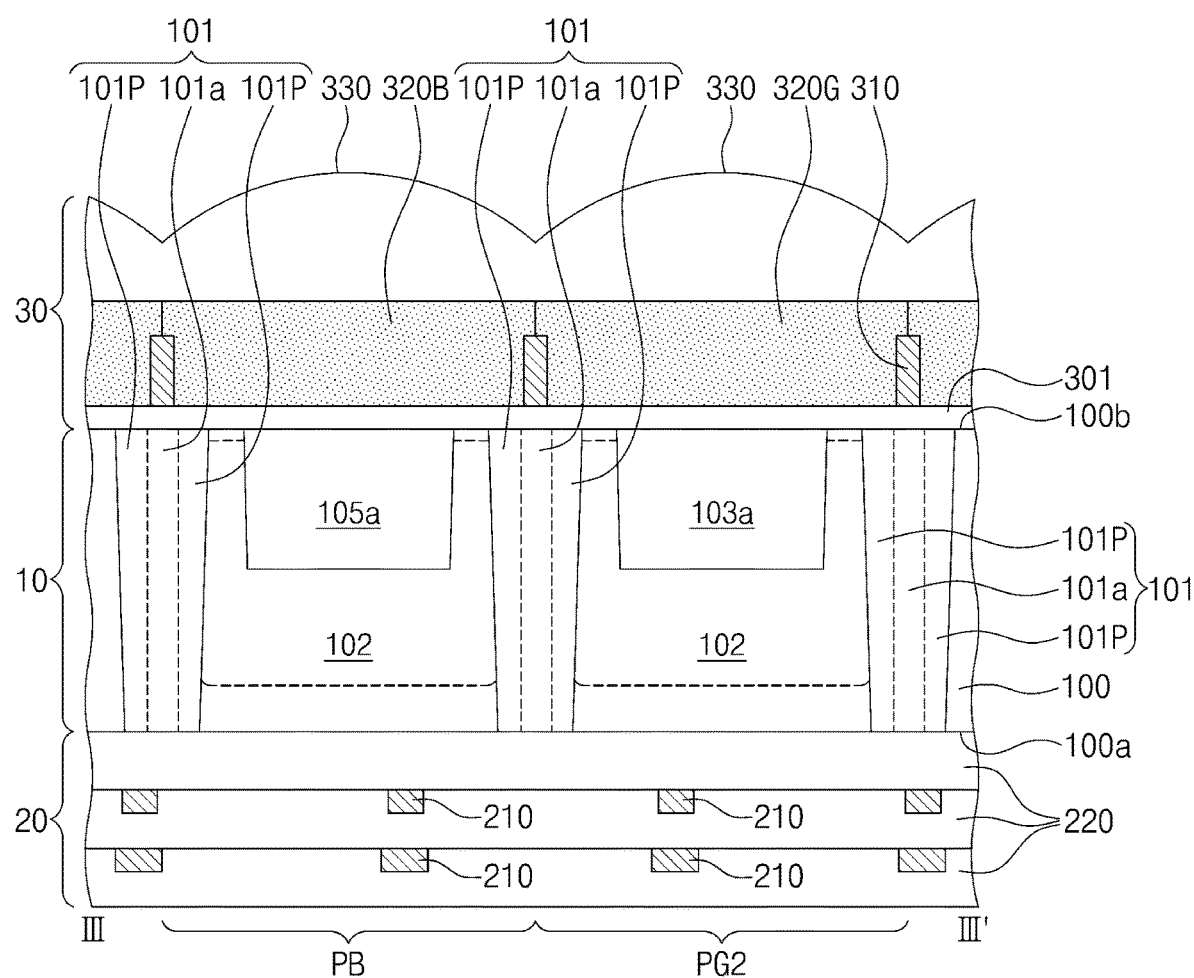

FIGS. 17A, 17B, and 17C are sectional views, which are taken along lines I-I', II-II', and III-III' of FIG. 16A to illustrate an active pixel sensor array of an image sensor according to an embodiment of the inventive concept.

FIGS. 18A, 18B, 18C, 18D, 18E, and 18F are plan views illustrating an active pixel sensor array of an image sensor according to an embodiment of the inventive concept.

Figure 19A:
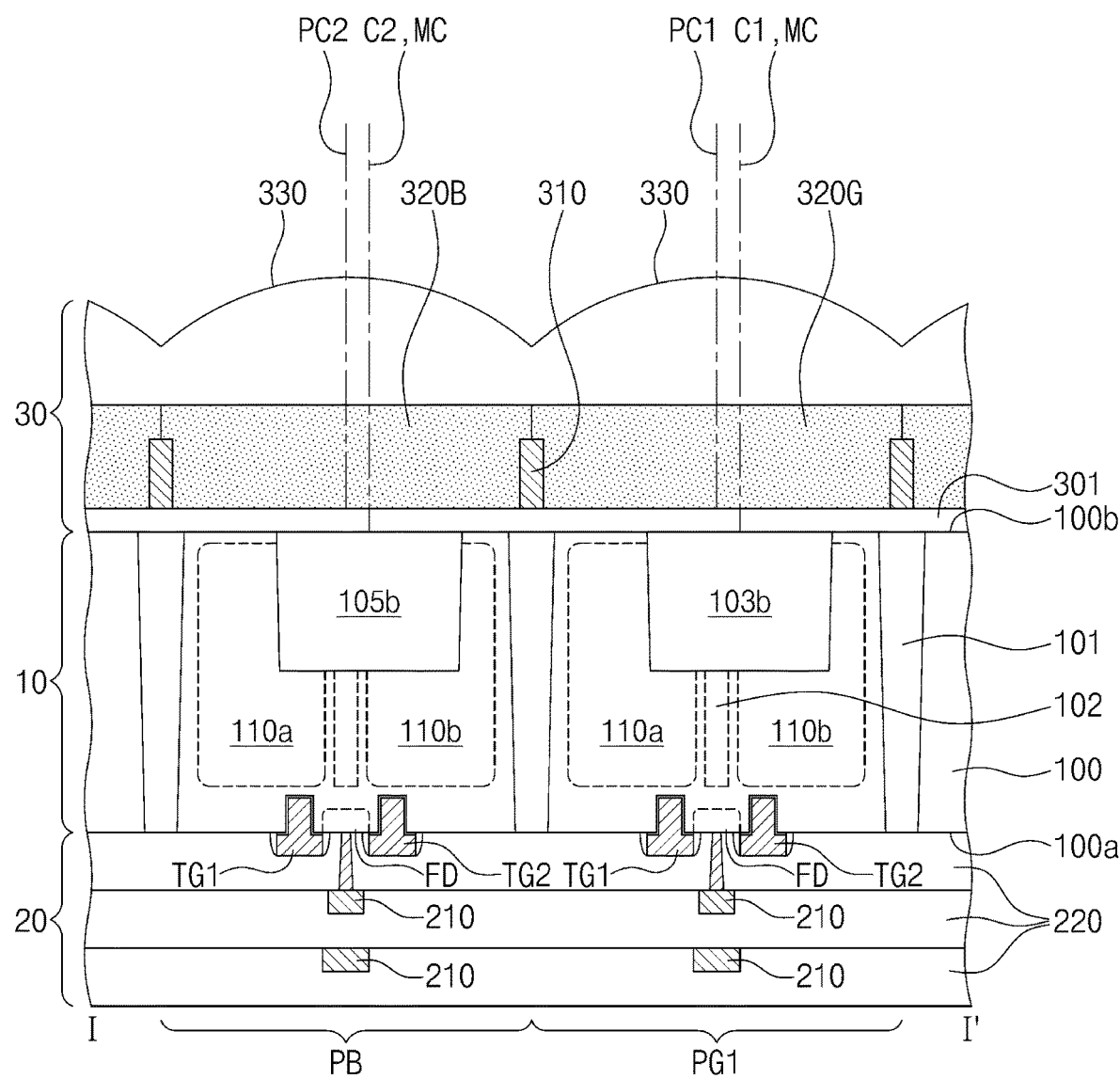
Figure 19B:
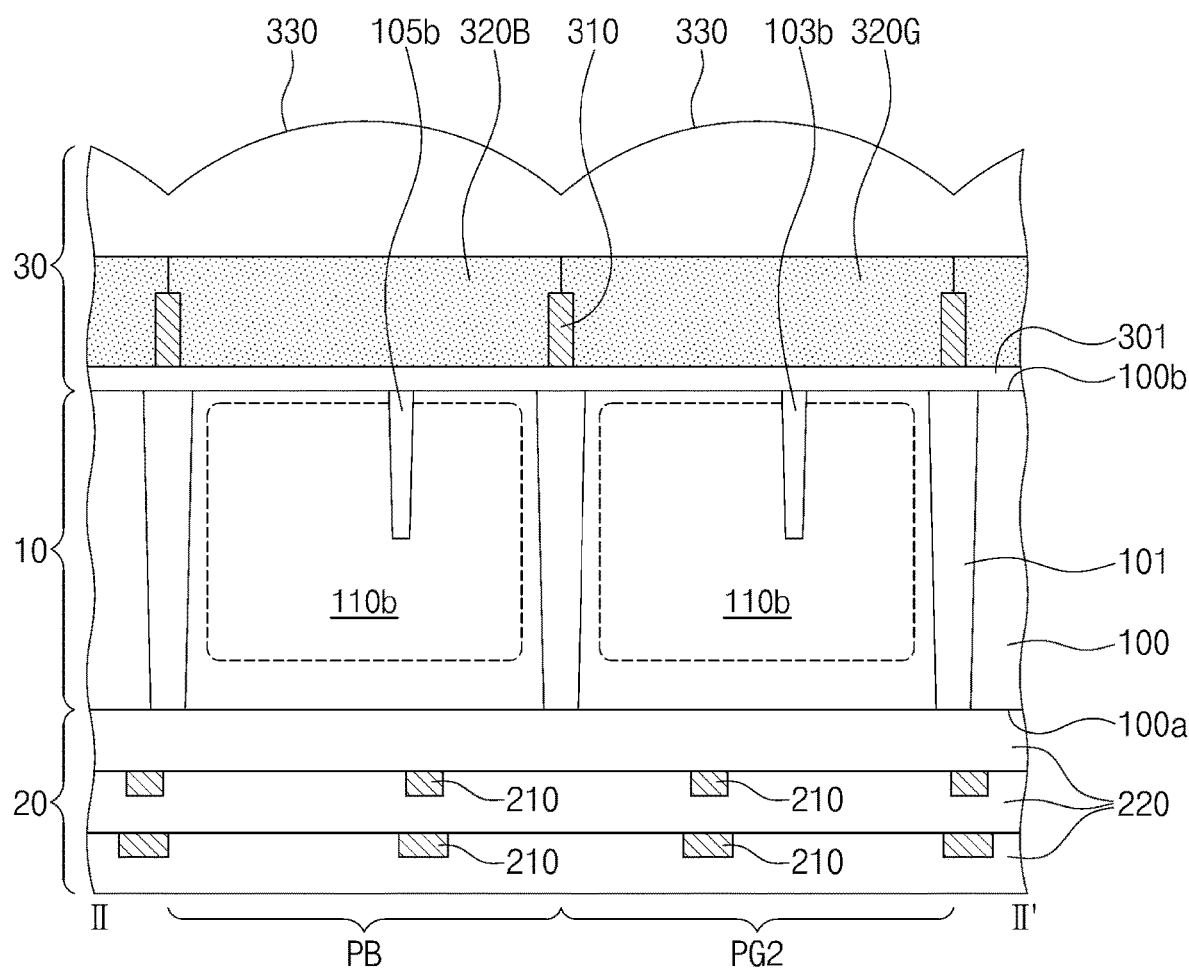

FIGS. 19A and 19B are sectional views, which are taken along lines I-I' and II-II' of FIG. 19A to illustrate an active pixel sensor array of an image sensor according to an embodiment of the inventive concept.

Figure 20:
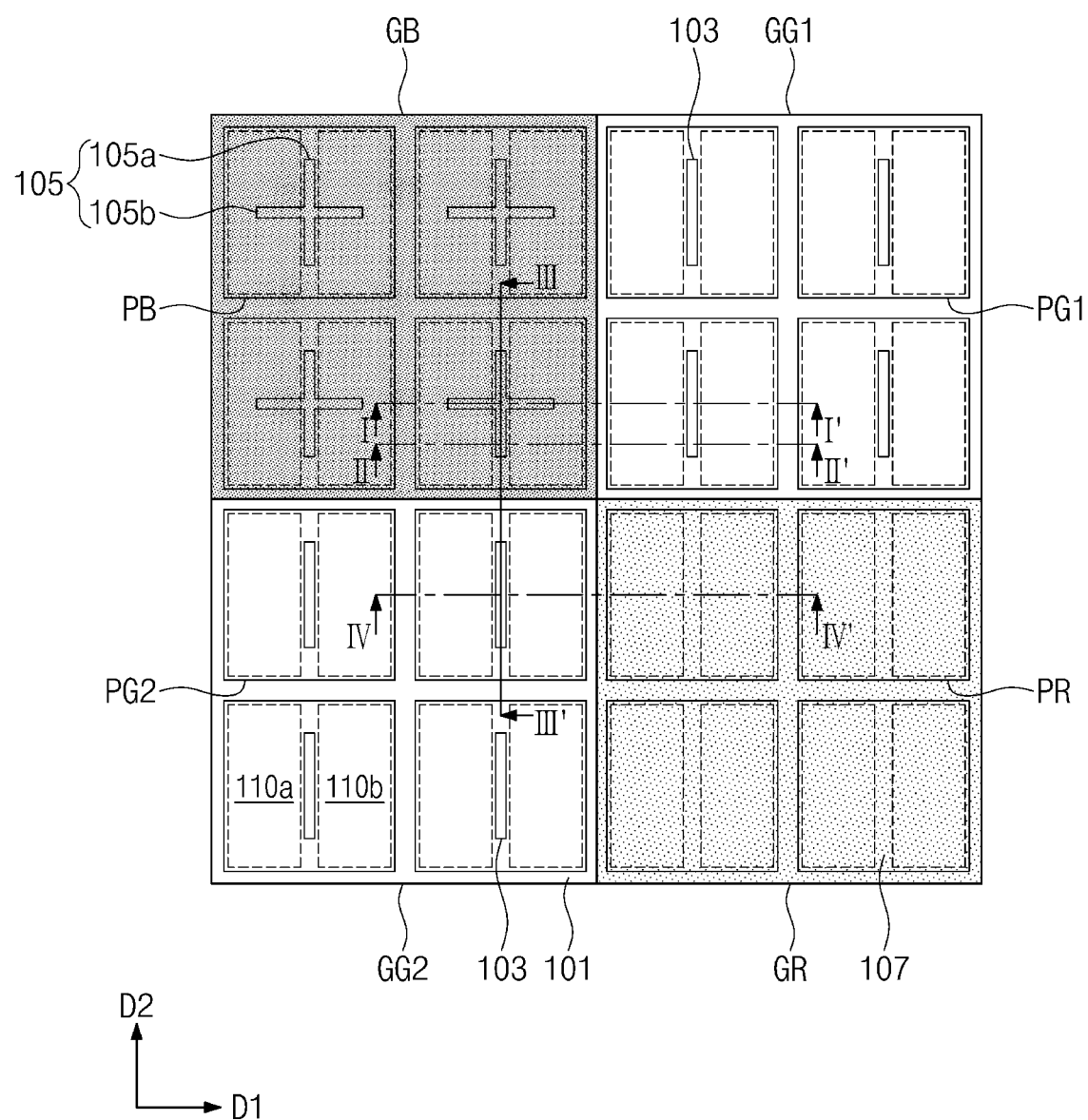

FIG. 20 is a plan view illustrating an active pixel sensor array of an image sensor according to an embodiment of the inventive concept.

Figure 21:
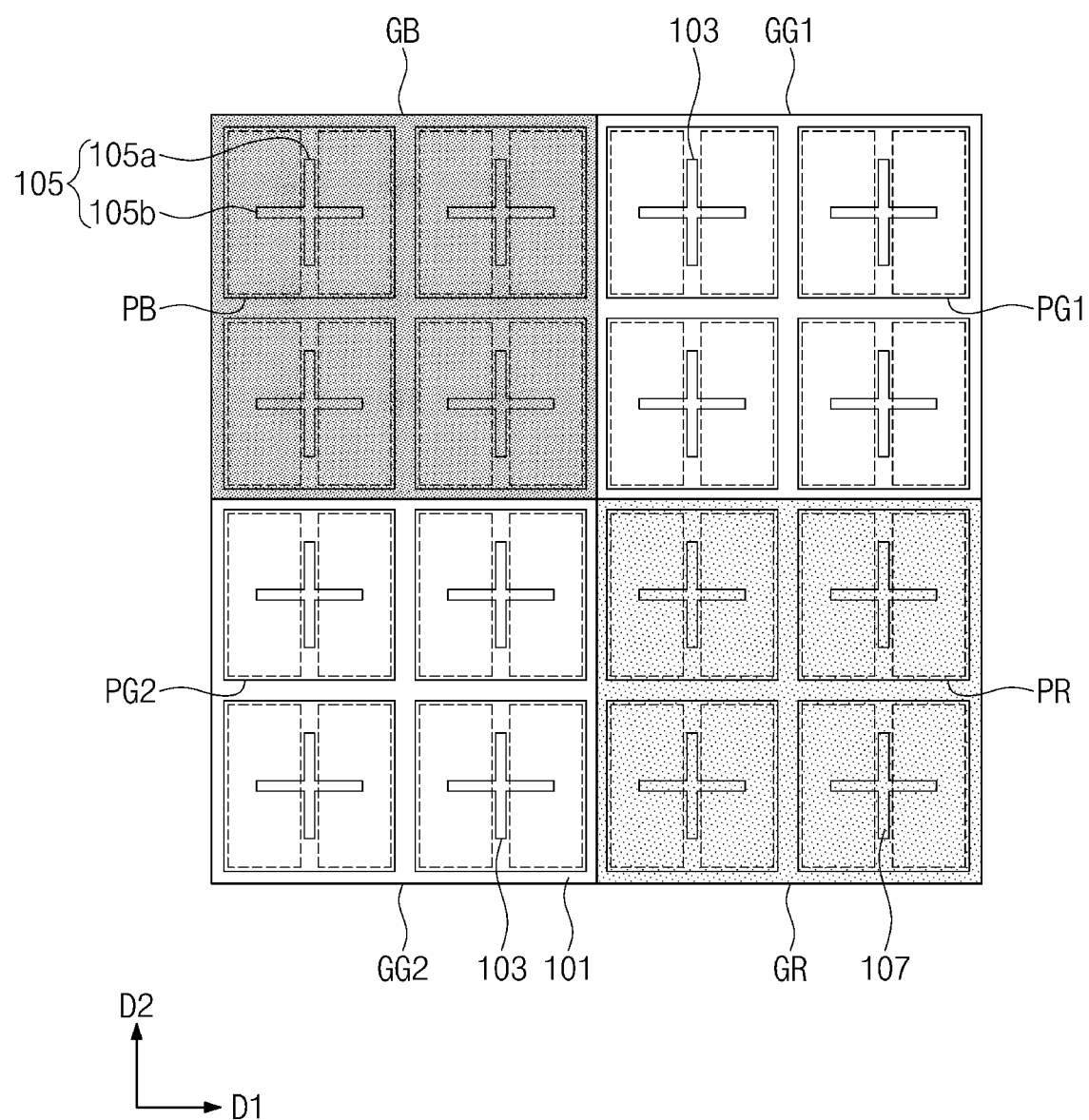

FIG. 21 is a plan view illustrating an active pixel sensor array of an image sensor according to an embodiment of the inventive concept.

Figure 22:
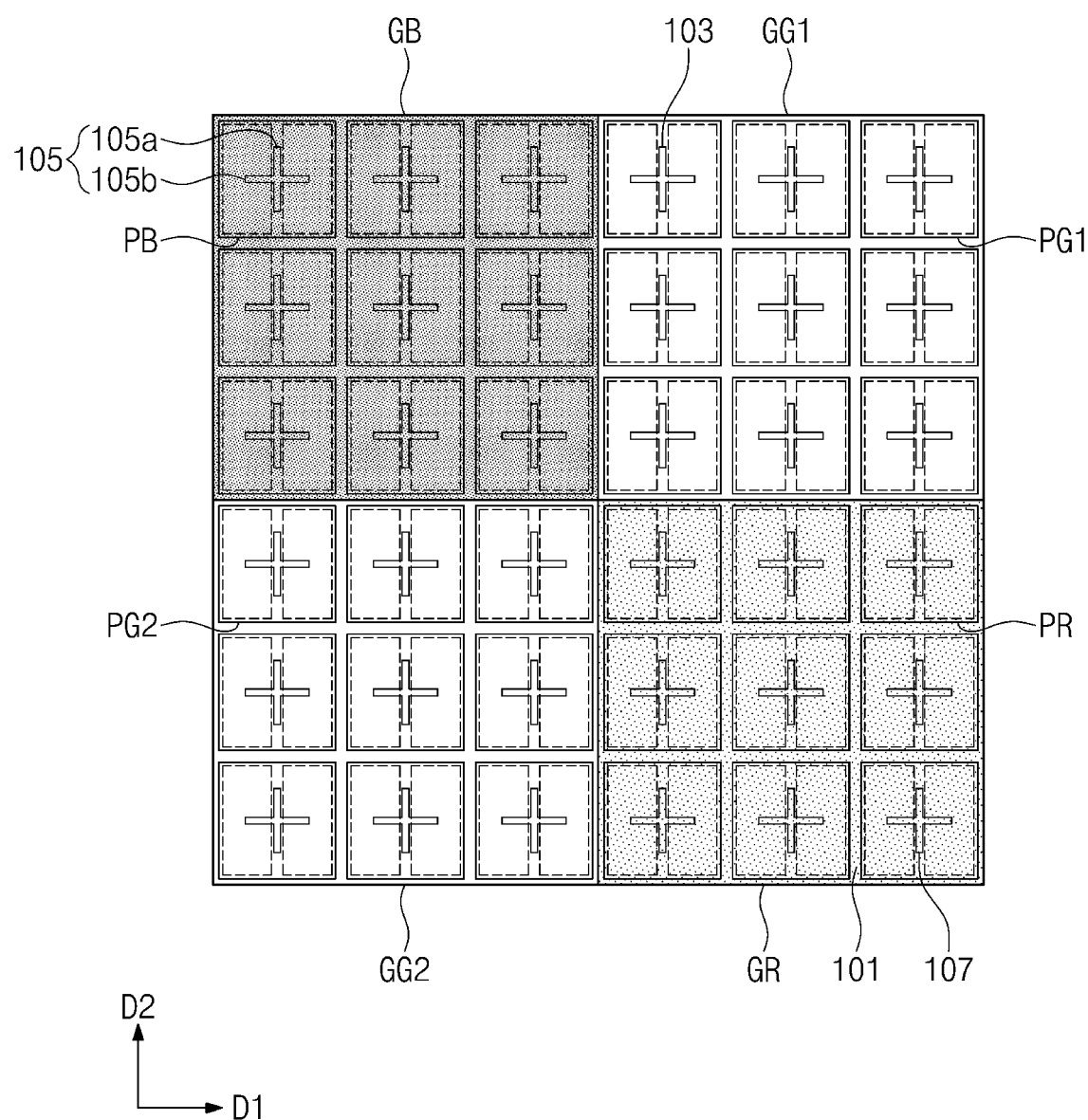

FIG. 22 is a plan view illustrating an active pixel sensor array of an image sensor according to an embodiment of the inventive concept.

Figure 23:
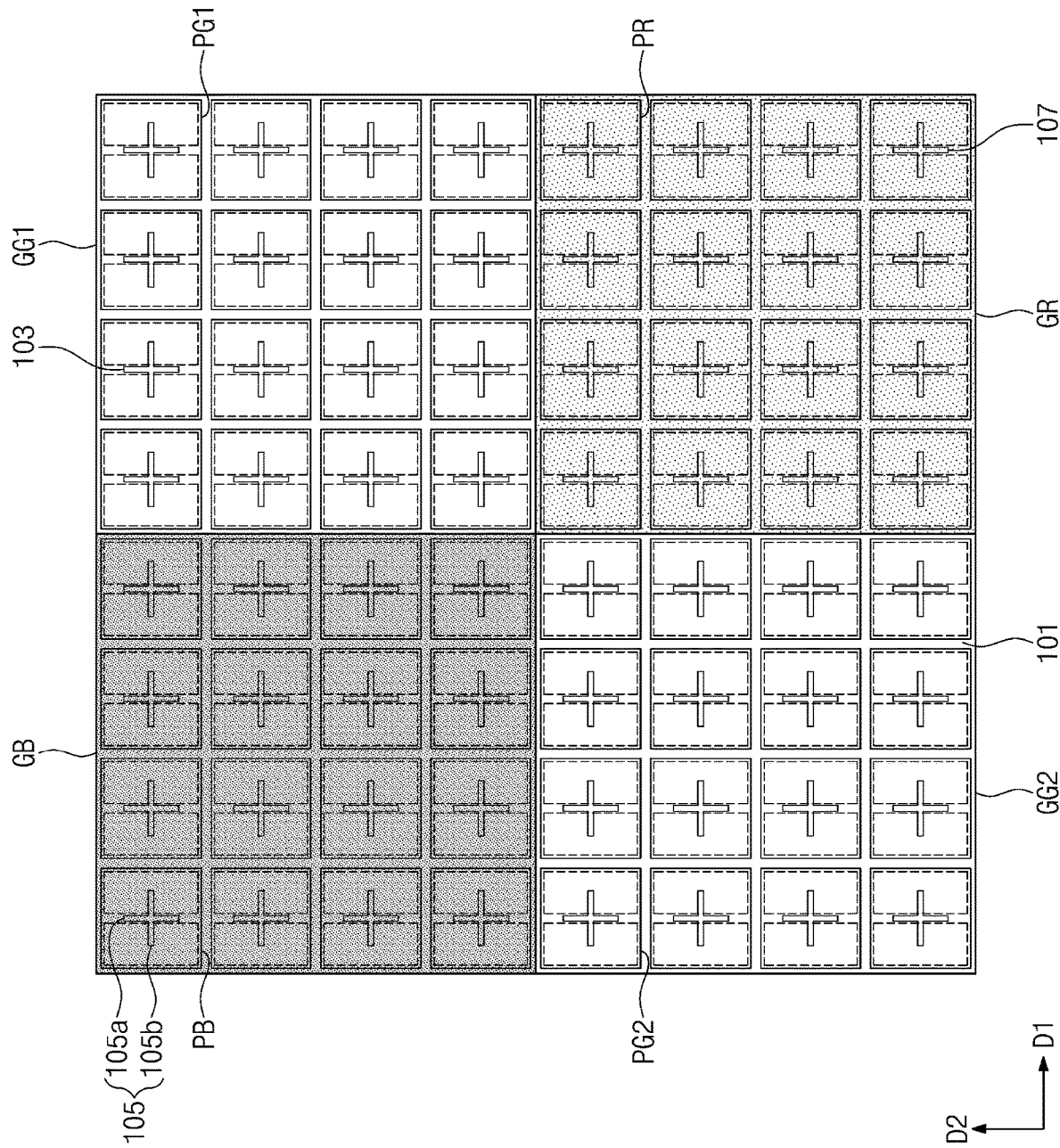

FIG. 23 is a plan view illustrating an active pixel sensor array of an image sensor according to an embodiment of the inventive concept.

Figure 24:
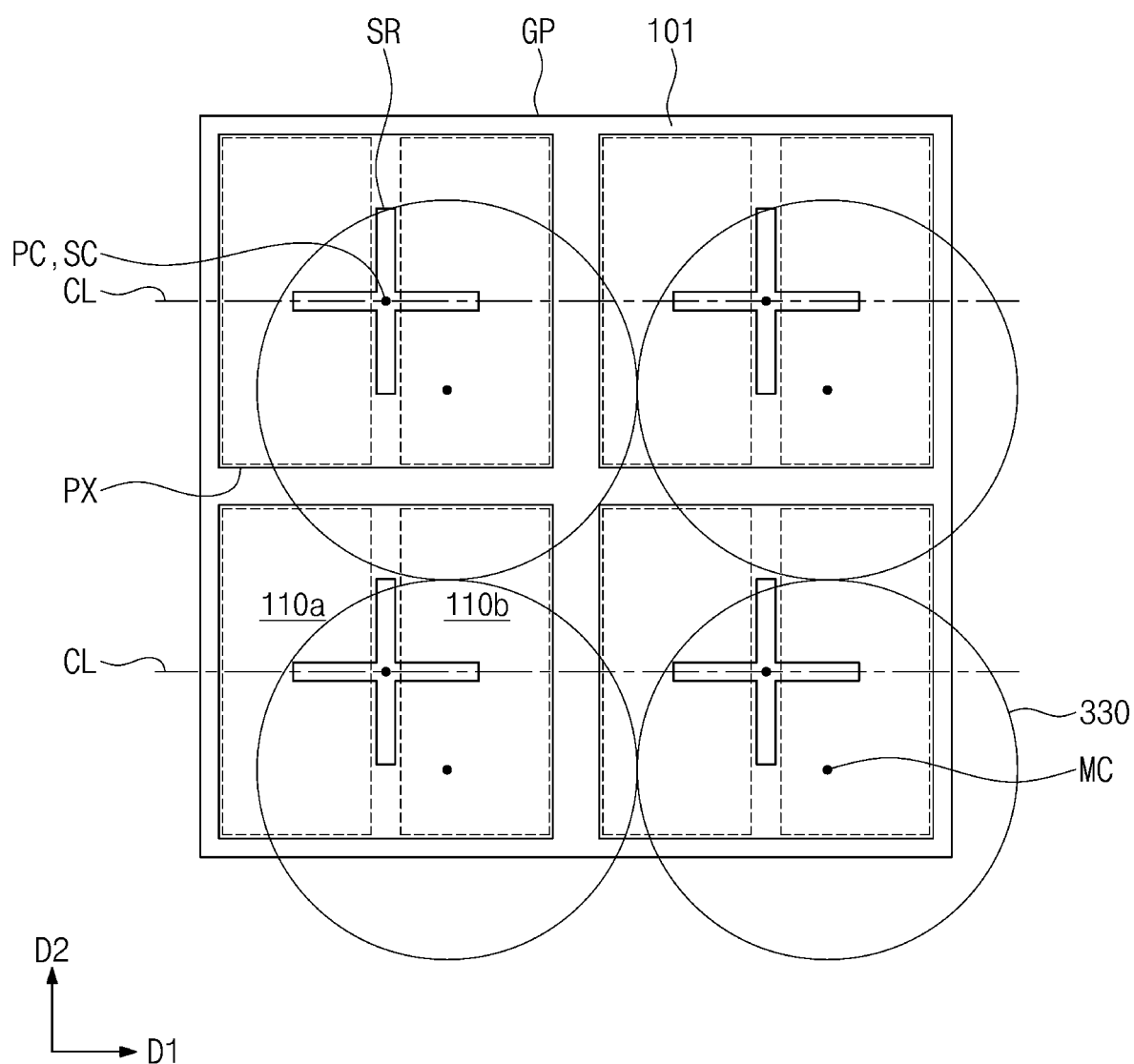

FIG. 24 is a plan view illustrating an active pixel sensor array of an image sensor according to an embodiment of the inventive concept.

Figure 25:
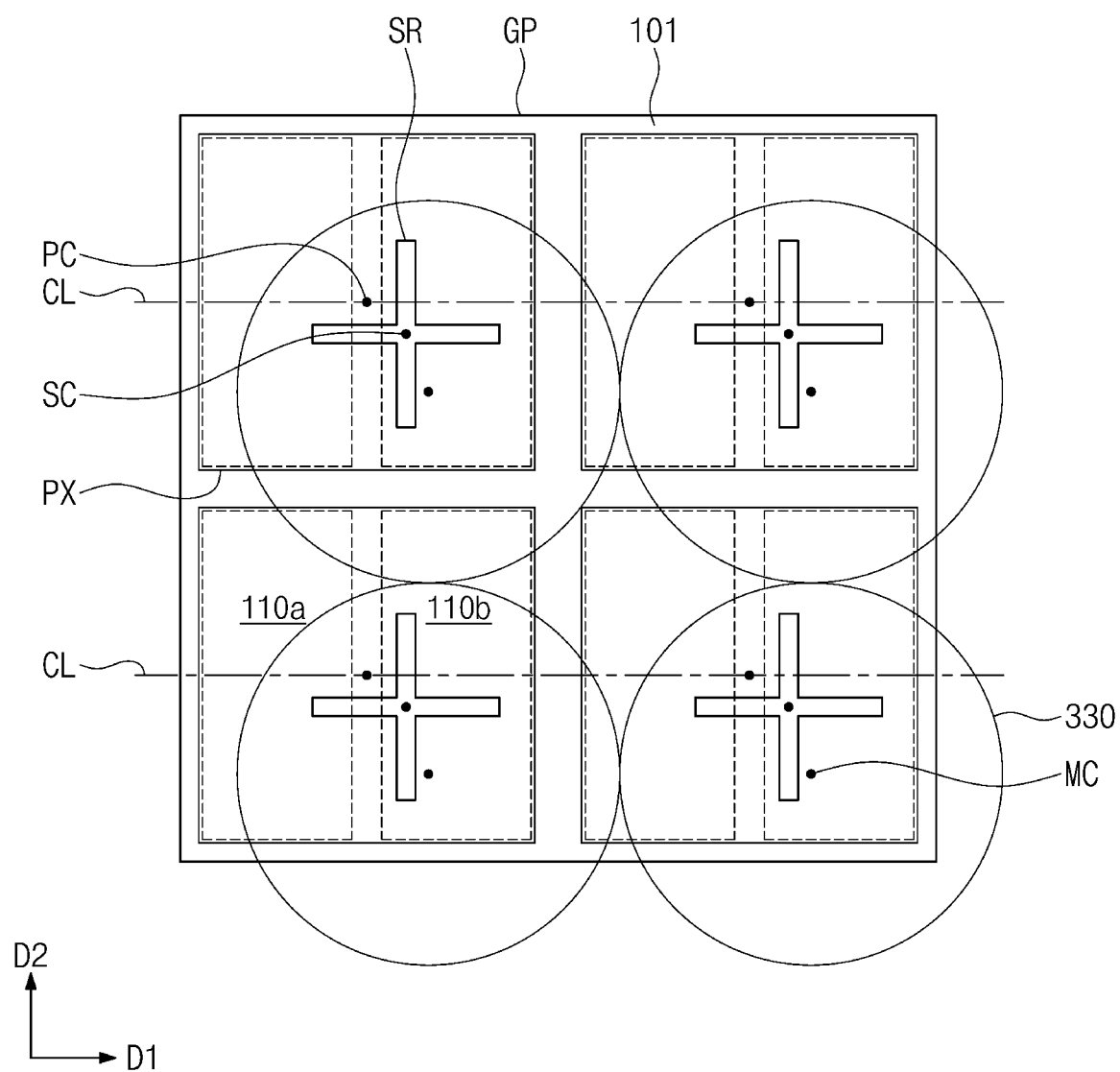

FIG. 25 is a plan view illustrating an active pixel sensor array of an image sensor according to an embodiment of the inventive concept.

Figure 26:
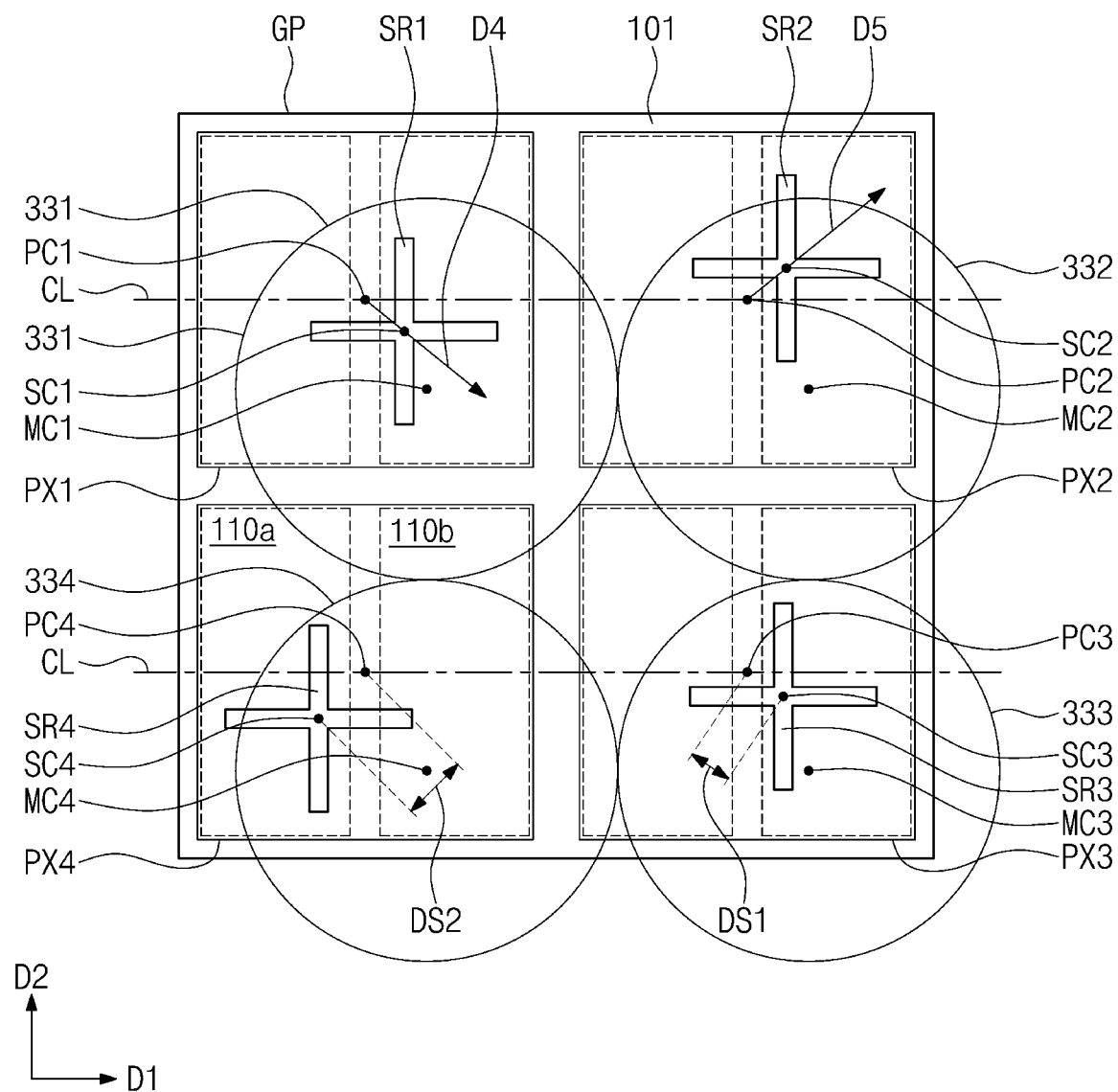

FIG. 26 is a plan view illustrating an active pixel sensor array of an image sensor according to an embodiment of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1:
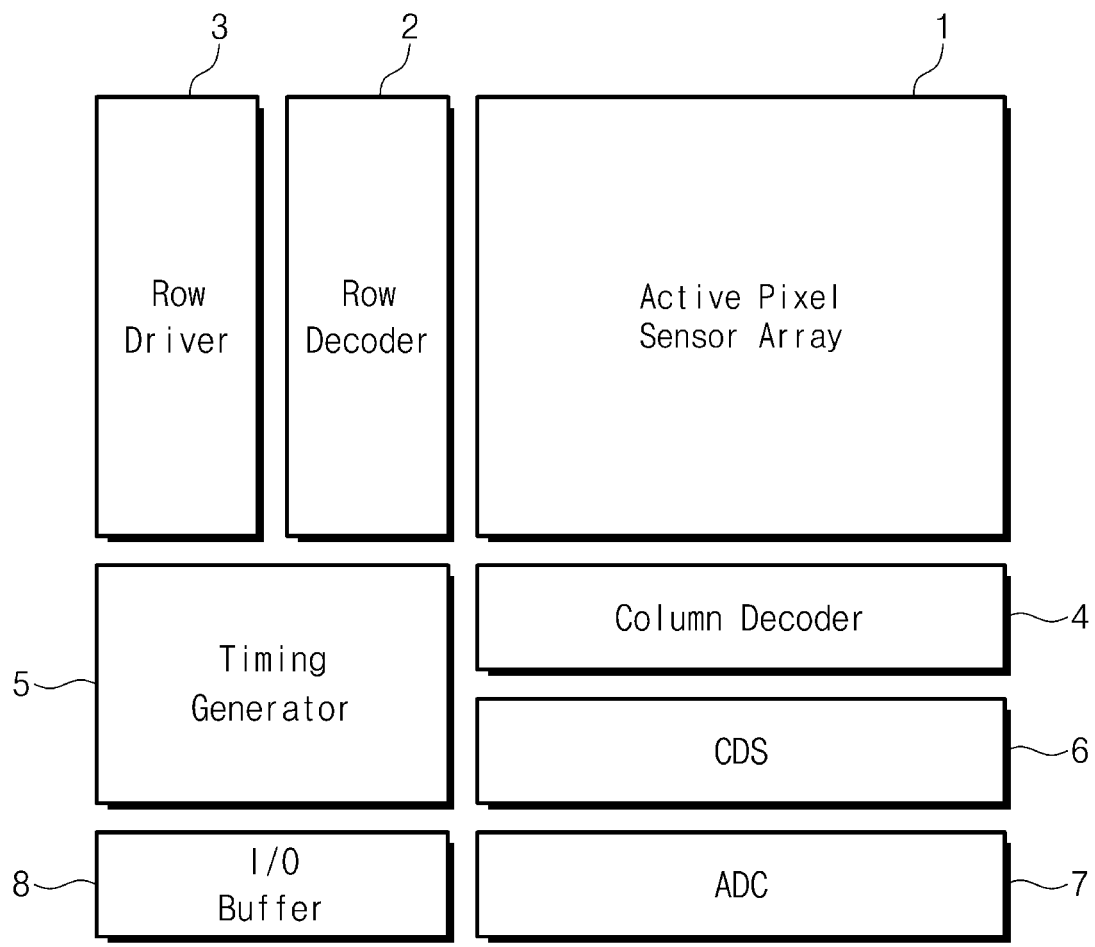
FIG. 1 is a block diagram illustrating an image sensor according to an embodiment of the inventive concept.

FIG. 1 is a block diagram illustrating an image sensor according to an embodiment of the inventive concept.

Referring to FIG. 1, an image sensor may include an active pixel sensor array 1, a row decoder 2, a row driver 3, a column decoder 4, a timing generator 5, a correlated double sampler (CDS) 6, an analog-to-digital converter (ADC) 7, and an input/output (I/O) buffer 8.

The active pixel sensor array 1 may include a plurality of unit pixels that are arranged two-dimensionally to convert optical signals to electrical signals. The active pixel sensor array 1 may be driven by a plurality of driving signals, such as a pixel selection signal, a reset signal, and a charge transmission signal, which are transmitted from the row driver 3. The converted electrical signal may be provided to the CDS 6.

In some embodiments, the image sensor may detect a difference in phase of light to be incident into the active pixel sensor array 1 and may perform an auto focusing operation using the phase difference detection. Each of the unit pixels of the active pixel sensor array 1 may generate and output a focus signal from a difference in phase of light to be incident into a pair of photoelectric conversion devices. The focus signal may be used to perform the auto-focusing operation or to adjust a position of a lens of an imaging device.

The row driver 3 may provide the driving signals for driving the plurality of unit pixels to the active pixel sensor array 1, based on the result decoded by the row decoder 2. In the case where the unit pixels are arranged in a matrix shape, the driving signals may be supplied to respective rows of the unit pixels.

The timing generator 5 may provide timing and control signals to the row decoder 2 and the column decoder 4.

The CDS 6 may receive the electric signals generated in the active pixel sensor array 1 and perform an operation of holding and sampling the received electric signals. For example, the CDS 6 may perform a double sampling operation on a specific noise level and a signal level of the electric signal to output a difference level corresponding to a difference between the noise and signal levels.

The ADC 7 may convert analog signals, which correspond to the difference level output from the CDS 6, into digital signals, and then may output the converted digital signals to the I/O buffer 8.

The I/O buffer 8 may latch the digital signal, and the latched digital signals may be sequentially output to an image signal processing unit (not shown), based on the result decoded by the column decoder 4.

Figure 2:
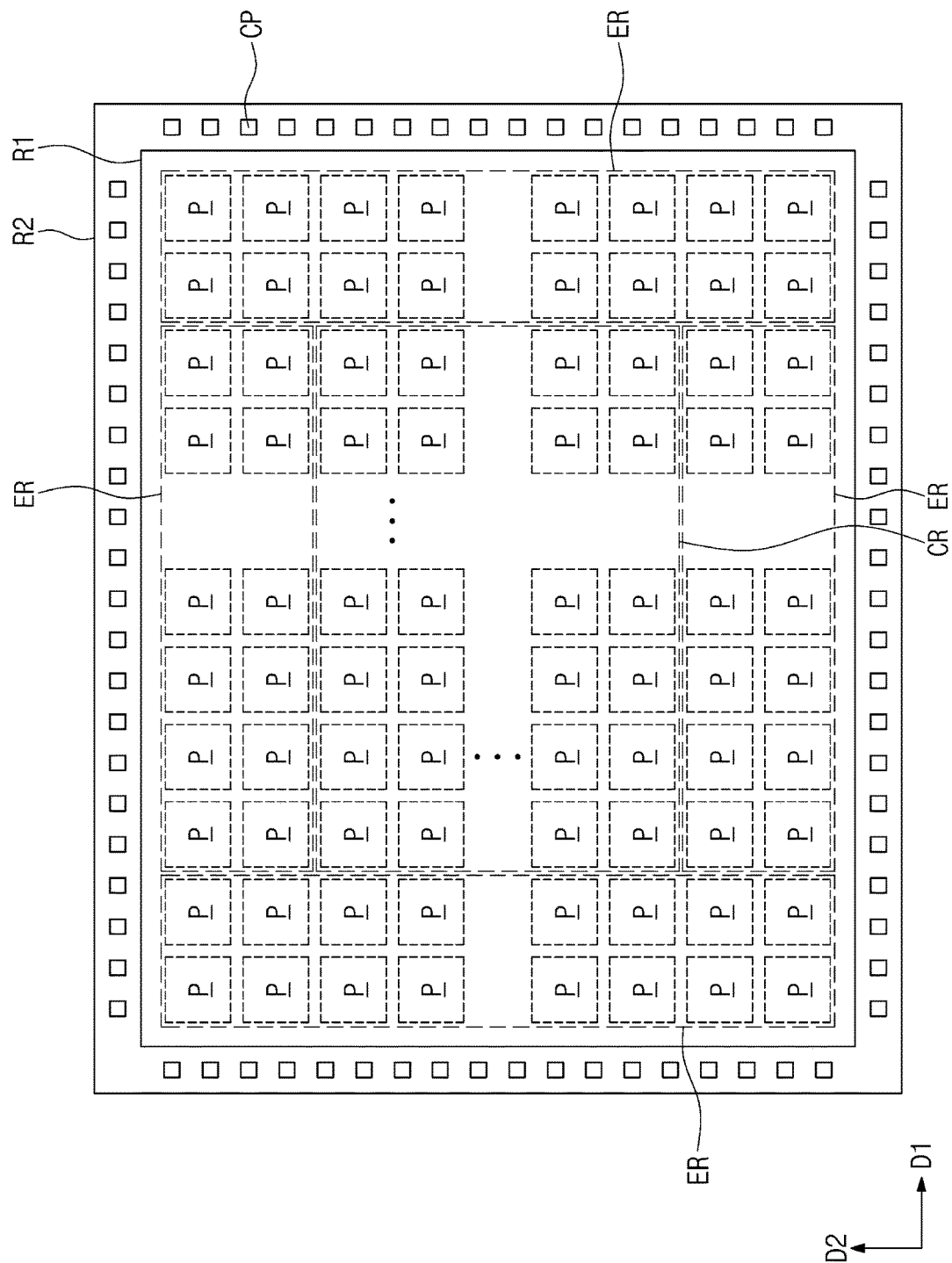
FIG. 2 is a schematic plan view illustrating an image sensor according to an embodiment of the inventive concept.

FIG. 2 is a schematic plan view illustrating an image sensor according to an embodiment of the inventive concept.

Referring to FIG. 2, an image sensor may include a pixel array region R1 and a pad region R2.

A plurality of unit pixels P, which are two-dimensionally arranged in two different directions (e.g., in a first direction D1 and a second direction D2, which may be horizontal directions), may be disposed in the pixel array region R1. Each of the unit pixels P of the pixel array region R1 may be configured to output an electrical signal, which is produced by incident light.

The pixel array region R1 may include a center region CR and an edge region ER enclosing the center region CR. When viewed in a plan view, the edge regions ER may be disposed on top, bottom, right, and left sides of the center region CR.

An angle of light, which is incident into the edge regions ER of the pixel array region R1, may be different from an angle of light, which is incident into the center region CR of the pixel array region R1.

A plurality of conductive pads CP, which are used to input or output control signals and photoelectric signals, may be disposed in the pad region R2. The pad region R2 may be disposed to enclose the pixel array region R1, when viewed in a plan view, and this may make it possible to easily connect the image sensor to an external device. In some embodiments, the edge region ER includes unit pixels P that are closest to and adjacent to the pads of the pad region R2, among the unit pixels P of the image sensor.

Figure 3:
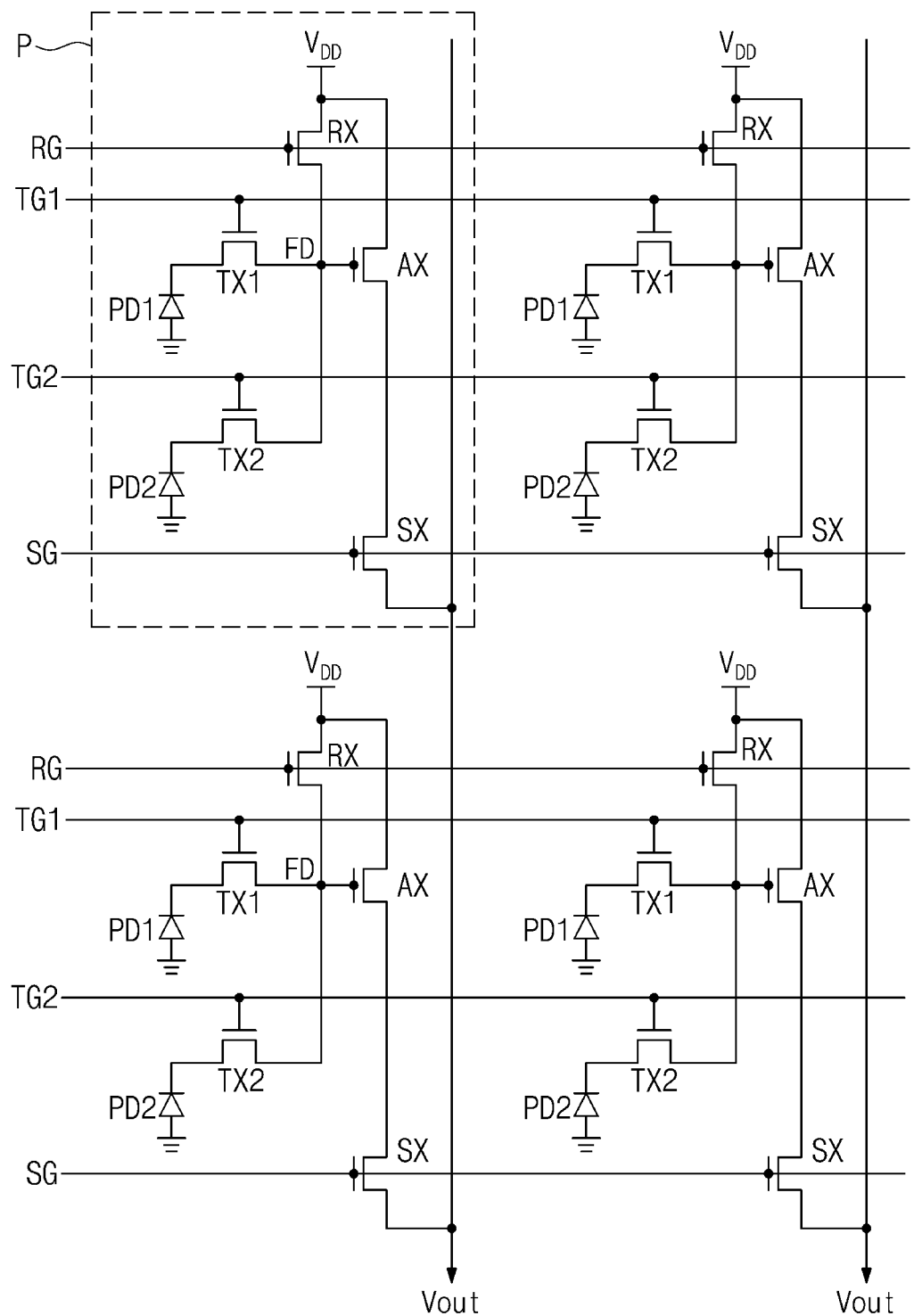
FIG. 3 is a circuit diagram illustrating an active pixel sensor array of an image sensor according to an embodiment of the inventive concept.

FIG. 3 is a circuit diagram illustrating an active pixel sensor array of an image sensor according to an embodiment of the inventive concept.

Referring to FIG. 3, the active pixel sensor array 1 may include a plurality of the unit pixels P, which are arranged in a row direction and a column direction or in a matrix shape. The unit pixel P may include first and second photoelectric conversion devices PD1 and PD2, first and second transfer transistors TX1 and TX2, and logic transistors RX, SX, and AX. Here, the logic transistors may include a reset transistor RX, a selection transistor SX, and an amplifying transistor AX. Gate electrodes of the first and second transfer transistors TX1 and TX2, the reset transistor RX, and the selection transistor SX may be connected to driving signal lines TG1, TG2, RG, and SG, respectively.

The first transfer transistor TX1 may include a first transfer gate TG1 and the first photoelectric conversion device PD1, and the second transfer transistor TX2 may include a second transfer gate TG2 and the second photoelectric conversion device PD2. The first and second transfer transistors TX1 and TX2 may share a charge detection node FD (e.g., a floating diffusion region).

The first and second photoelectric conversion devices PD1 and PD2 may generate photocharges in proportion to an amount of external incident light and then store the generated photocharges therein. Each of the first and second photoelectric conversion devices PD1 and PD2 may be provided in a form of a photo diode, a photo transistor, a photo gate, a pinned photo diode (PPD), or any combination thereof.

The first and second transfer gates TG1 and TG2 may be used to control an operation of transferring the photocharges stored in the first and second photoelectric conversion devices PD1 and PD2 to the charge detection node FD (e.g., the floating diffusion region). The first and second transfer gates TG1 and TG2 may be applied with signals, which are complementary to each other. The first and second transfer gates TG1 and TG2 may be used to transfer the photocharges from one of the first and second photoelectric conversion devices PD1 and PD2 selectively to the charge detection node FD.

The photocharges transferred from the first and second photoelectric conversion devices PD1 and PD2 may be cumulatively stored in the charge detection node FD. The amplifying transistor AX may be controlled by an amount of the photocharges stored in the charge detection node FD.

The reset transistor RX may be configured to periodically discharge or reset the photocharges stored in the charge detection node FD. For example, the reset transistor RX may include drain and source electrodes, which are respectively connected to the charge detection node FD and a node applied with a power voltage VDD. If the reset transistor RX is turned on, the power voltage VDD may be applied to the charge detection node FD through the source electrode of the reset transistor RX. Accordingly, the photocharges stored in the charge detection node FD may be discharged to the power voltage VDD through the reset transistor RX, and thus, the charge detection node FD may be reset.

The amplifying transistor AX may amplify a change in electric potential of the charge detection node FD and may output a signal, which was amplified by the selection transistor SX, or a pixel signal to an output line VOUT. The amplifying transistor AX may be a source follower buffer amplifier, which is configured to generate a source-drain current in proportion to an amount of photocharges supplied to its gate electrode. The gate electrode of the amplifying transistor AX may be connected to the charge detection node FD, the drain of the amplifying transistor AX may be connected to the power voltage VDD, and the source of the amplifying transistor AX may be connected to the drain of the selection transistor SX.

The selection transistor SX may be used to select a corresponding row of the unit pixels P for a read operation. If the selection transistor SX is turned on, the power voltage VDD, which is applied to the drain electrode of the amplifying transistor AX, may be applied to a drain electrode of the selection transistor SX.

Figure 4A:
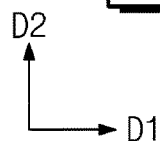
FIGS. 4A and 4B are plan views illustrating a color filter array of an image sensor according to some embodiments of the inventive concept.
Figure 4B:
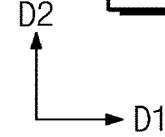

FIGS. 4A and 4B are plan views illustrating a color filter array of an image sensor according to some embodiments of the inventive concept.

Referring to FIG. 4A, the active pixel sensor array 1 may include color filters corresponding to the unit pixels, respectively. Each of the unit pixels may include one of red, green, or blue filters R, G, or B. For example, a unit pixel may be a red pixel including the red filter R, a blue pixel including the blue filter B, or a green pixel including the green filter G. The red filter R of the red pixel may be configured to allow red light to pass therethrough, and in this case, photoelectrons corresponding to the red light may be generated in the photoelectric conversion device of the red pixel. The blue filter B of the blue pixel may be configured to allow blue light to pass therethrough, and in this case, photoelectrons corresponding to the blue light may be generated in the photoelectric conversion device of the blue pixel. The green filter G of the green pixel may be configured to allow green light to pass therethrough, and in this case, photoelectrons corresponding to the green light may be generated in the photoelectric conversion device of the green pixel. In certain embodiments, the unit pixels of the active pixel sensor array 1 may include magenta (Mg), yellow (Y), and cyan (Cy) filters.

As an example, the color filters R, G, and B may be arranged to form a Bayer pattern, in which the number of the green filters G is two times the number of the red filters R or the blue filters B. For example, the Bayer pattern may include color filter groups, each of which includes four color filters arranged in a 2×2 configuration or includes two green filters G arranged in one diagonal direction and blue and red filters R and B arranged in other diagonal direction. Each of the red and blue filters R and B may be disposed between a pair of the green filters G. The color filter groups of the Bayer pattern may be repeatedly arranged in the first and second directions D1 and D2.

Referring to FIG. 4B, the active pixel sensor array 1 may include color pixels and depth pixels. Each of the color pixels may include one of the red, green, or blue filters R, G, or B. Each of the depth pixels may include an infrared filter Z, allowing infrared light to pass therethrough.

The red, green, and blue filters R, G, and B and the infrared filter Z may constitute a plurality of filter groups, which are repeatedly arranged in the first and second directions D1 and D2, and each of the filter groups may include four filters arranged in a 2×2 configuration. In an embodiment, the depth pixel may be disposed between an adjacent pair of the color pixels.

Lights of different wavelengths may be incident into (or onto) unit pixels, respectively. As described above, the color pixels may be configured to generate photoelectrons from visible light. The infrared filter Z of the depth pixel may be configured to allow infrared light to pass therethrough, and the photoelectric conversion device of the depth pixel may be configured to generate photoelectrons from the infrared light. By using the depth pixels sensing the infrared light, it may be possible to calculate a distance from the imaging device to a subject and to obtain a three-dimensional image of the subject.

Figure 5B:
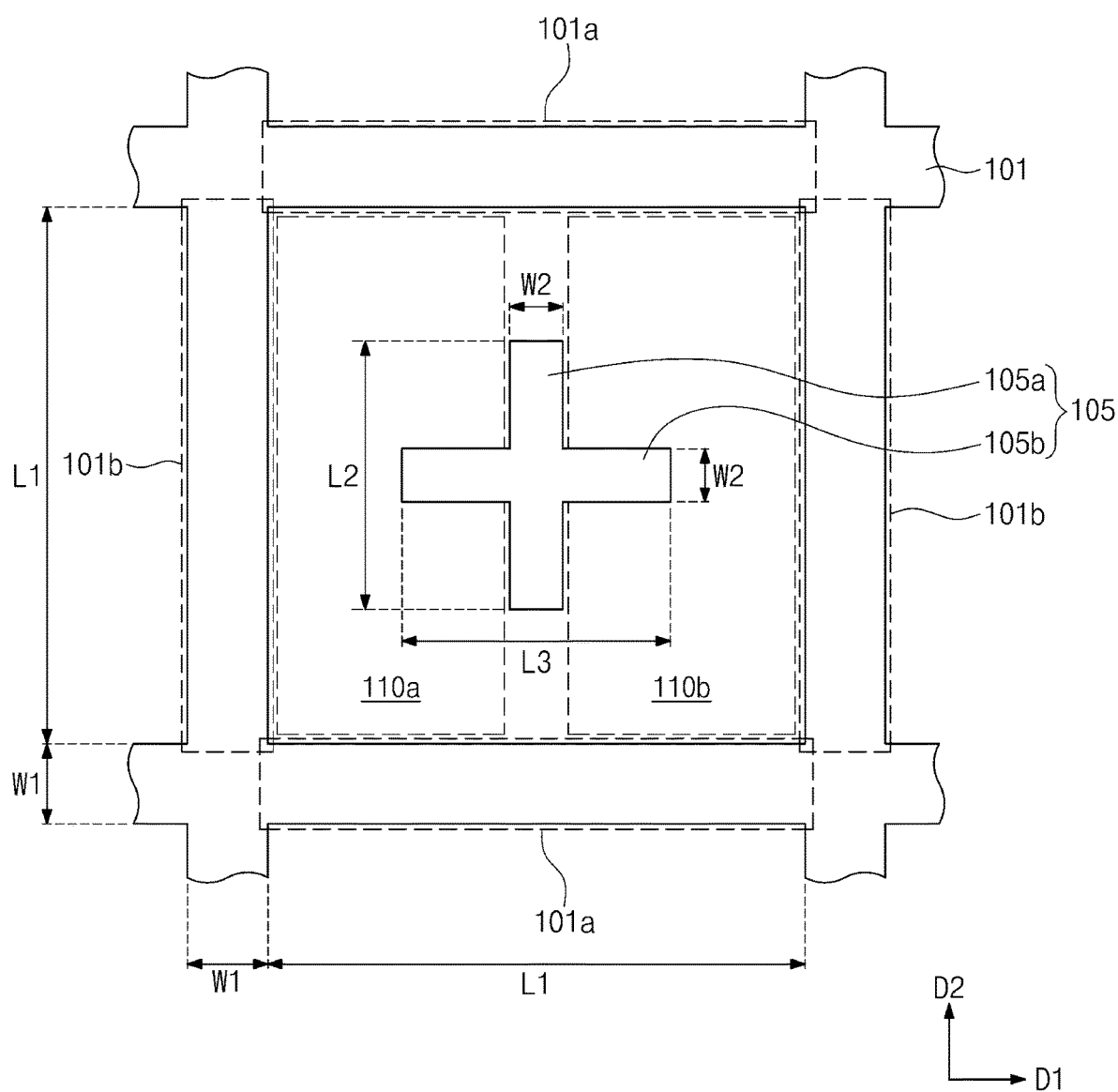
FIG. 5B is an enlarged plan view illustrating a portion of an active pixel sensor array of an image sensor according to an embodiment of the inventive concept.

FIGS. 5A, 5C, 5D, and 5E are plan views, each illustrating an active pixel sensor array of an image sensor according to an embodiment of the inventive concept. FIG. 5B is an enlarged plan view illustrating a portion of an active pixel sensor array of an image sensor according to an embodiment of the inventive concept. FIGS. 6A, 6B, 6C, and 6D are sectional views, which are respectively taken along lines I-I', II-II', and II-III' of FIG. 5A to illustrate an active pixel sensor array of an image sensor according to an embodiment of the inventive concept.

Referring to FIGS. 5A and 5B, and FIGS. 6A to 6D, an image sensor according to an embodiment of the inventive concept may include a photoelectric conversion layer 10, a read-out circuit layer 20, and an optically-transparent layer 30. The photoelectric conversion layer 10 may be disposed between the read-out circuit layer 20 and the optically-transparent layer 30, when viewed in a sectional view. The optically-transparent layer 30 may also be referred to as an optical conversion layer, or an optical processing layer.

The photoelectric conversion layer 10 may include a semiconductor substrate 100 and first and second photoelectric conversion regions 110a and 110b, which are provided in the semiconductor substrate 100. The semiconductor substrate 100 may have a first or front surface 100a and a second or rear surface 100b opposite each other. The semiconductor substrate 100 may be of a first conductivity type, and the first and second photoelectric conversion regions 110a and 110b may be impurity regions, which are doped with impurities of a second conductivity type (e.g., n-type) different from the first conductivity type. The first and second photoelectric conversion regions 110a and 110b may be configured to convert external incident light to an electrical signal.

The read-out circuit layer 20 may be disposed on the first surface 100a of the semiconductor substrate 100. The read-out circuit layer 20 may include read-out circuits (e.g., MOS transistors) connected to the photoelectric conversion layer 10. The read-out circuit layer 20 may perform a signal processing operation on electrical signals converted by the photoelectric conversion layer 10. In detail, MOS transistors and conductive lines 210, which are connected to the MOS transistors, may be disposed on the first surface 100a of the semiconductor substrate 100. The conductive lines 210 may be stacked on top of one another with interlayered insulating layers 220 interposed therebetween, and the conductive lines 210 positioned at different levels may be connected to each other through contact plugs (e.g., conductive plugs, not shown).

The optically-transparent layer 30 may be disposed on the second surface 100b of the semiconductor substrate 100. The optically-transparent layer 30 may include a color filter array and a micro lens array. The optically-transparent layer 30 may be configured to perform an optical processing operation, or optical conversion, such an operation of concentrating and filtering light, which is incident from the outside, and to provide the light to the photoelectric conversion layer 10.

The color filter array may include a red filter 320R, a green filter 320G, and a blue filter 320B, as described with reference to FIG. 4A. In certain embodiments, the color filter array may include color filters of different colors (e.g., cyan, magenta, or yellow). In certain embodiments, the color filter array may include an infrared filter, as described with reference to FIG. 4B.

The micro lens array may include a plurality of micro lenses 330, which are used to concentrate light incident from the outside. When viewed in a plan view, the micro lenses 330 may be two-dimensionally arranged in two different directions (e.g., the first and second directions D1 and D2).

In one embodiment, the semiconductor substrate 100 may be a bulk silicon wafer of a first conductivity type (e.g., p-type), on which an epitaxial layer of the first conductivity type is provided. In one embodiment, the bulk silicon substrate may be removed during a process of fabricating the image sensor, and in this case, the p-type epitaxial layer may be used as the semiconductor substrate 100. In certain embodiments, the semiconductor substrate 100 may be a bulk semiconductor wafer, in which a well of the first conductivity type is formed.

The semiconductor substrate 100 may include a plurality of pixel regions PG1, PG2, PB, and PR, which are defined by a pixel isolation structure 101. The pixel regions PG1, PG2, PB, and PR may be arranged in a matrix shape or in two different directions (e.g., the first and second directions D1 and D2). As an example, the plurality of pixel regions may include the first to third pixel regions PG1, PG2, PB, and PR, and lights, which are incident to the first to third pixel regions PG1, PG2, PB, and PR, may have different wavelength ranges. In some embodiments, each pixel region includes an individual unit pixel or sensor element of the image sensor (e.g., a smallest addressable light-sensing element of the image sensor). Each pixel region PG1, PG2, PB, or PR may therefore represent, and may be referred to, as a unit pixel or a pixel.

In one embodiment, the first pixel regions PG1 and PG2 may be disposed adjacent to the second and third pixel regions PB and PR in the first and second directions D1 and D2, respectively. The first pixel regions PG1 and PG2 may be arranged in a diagonal direction with respect to each other. The second pixel region PB may be adjacent to the first pixel regions PG1 and PG2 in the first and second directions D1 and D2, and the third pixel region PR may be adjacent to the first pixel regions PG1 and PG2 in the first and second directions D1 and D2. Light of a first wavelength may be incident into the first pixel regions PG1 and PG2, and light, which has a second wavelength shorter than the first wavelength, may be incident into the second pixel region PB. Light, which has a third wavelength longer than the first wavelength, may be incident into the third pixel region PR. For example, green light may be incident into the first pixel regions PG1 and PG2, red light may be incident into the second pixel region PB, and blue light may be incident into the third pixel region PR. The different wavelengths of light may result from the filters used in the optically transparent layer 30.

The pixel isolation structure 101 may enclose each of the first to third pixel regions PG1, PG2, PB, and PR, when viewed in a plan view. In detail, as shown in FIG. 5B, the pixel isolation structure 101 may include a plurality of first pixel isolation portions 101a, which extend (e.g., lengthwise) in the first direction D1 and are spaced apart from each other in the second direction D2, and second pixel isolation portions 101b, which extend (e.g., lengthwise) in the second direction D2 to cross (e.g., intersect and connect to) the first pixel isolation portions 101a and are spaced apart from each other in the first direction D1. An item, layer, or portion of an item or layer described as extending "lengthwise" in a particular direction has a length in the particular direction and a width perpendicular to that direction, where the length is greater than the width. Each of the first and second pixel isolation portions 101a and 101b may have a first width W1. A distance L1 between the first pixel isolation portions 101a for each unit pixel may be the same as a distance between the second pixel isolation portions 101b for each unit pixel, though the invention is not limited thereto. The pixel isolation portions may be referred to as pixel isolation walls or pixel isolation barriers.

Each pixel region of the first to third pixel regions PG1, PG2, PB, and PR may be defined by a pair of the first pixel isolation portions 101a and a pair of the second pixel isolation portions 101b. In one embodiment, a width of each of the first to third pixel regions PG1, PG2, PB, and PR may correspond to a distance between adjacent ones of the first pixel isolation portions 101a or the distance L1 between adjacent ones of the second pixel isolation portions 101b. It should be noted that four pixel regions, PG1, PG2, PB, and PR, may be referred to respectively as first to fourth pixel regions, where first and second pixel regions PG1 and PG2 are first types of pixel regions (e.g., including a first color filter), third pixel region PB is a second type of pixel region (e.g., including a second color filter), and fourth pixel region PR is a third type of pixel region (e.g., including a third color filter).

The pixel isolation structure 101 may be formed of an insulating material, whose refractive index is lower than that of the semiconductor substrate 100 (e.g., silicon), and may include one or more insulating layers. For example, the pixel isolation structure 101 may be formed of a silicon oxide layer, a silicon nitride layer, an undoped poly-silicon layer, a gaseous material, or any combination thereof. The pixel isolation structure 101 may include an air gap. The formation of the pixel isolation structure 101 may include patterning the first surface 100a and/or the second surface 100b of the semiconductor substrate 100 to form a deep trench and filling the deep trench with an insulating material.

The pixel isolation structure 101 may penetrate the semiconductor substrate 100. A vertical thickness of the pixel isolation structure 101 may be substantially the same as a vertical thickness of the semiconductor substrate 100. As another example, the pixel isolation structure 101 may be vertically extended from the first surface 100a of the semiconductor substrate 100 toward the second surface 100b and may be spaced apart from the second surface 100b of the semiconductor substrate 100 and thus may not extend all the way to the second surface 100b of the semiconductor substrate 100.

The pixel isolation structure 101 may have a first width (e.g., perpendicular to the lengthwise extension direction) near the first surface 100a of the semiconductor substrate 100 and a second width, which is larger than the first width, near the second surface 100b of the semiconductor substrate 100. In addition, the width of the pixel isolation structure 101 may gradually decrease in a direction from the second surface 100b of the semiconductor substrate 100 toward the first surface 100a.

The pixel isolation structure 101 may prevent photocharges, which are produced in each of the first to third pixel regions PG1, PG2, PB, and PR by incident light, from entering others of the first to third pixel regions PG1, PG2, PB, and PR adjacent thereto through a random drift process. For example, the pixel isolation structure 101 may prevent a cross-talk phenomenon from occurring between adjacent ones of the first to third pixel regions PG1, PG2, PB, and PR.

In some embodiments, the first and second photoelectric conversion regions 110a and 110b are provided in each pixel region of the first to third pixel regions PG1, PG2, PB, and PR. The first and second photoelectric conversion regions 110a and 110b may be impurity regions, which are doped with impurities, and have a second conductivity type (e.g., n-type) different from the first conductivity type of the semiconductor substrate 100. The first and second photoelectric conversion regions 110a and 110b and the semiconductor substrate 100 of the first conductivity type may constitute a pair of photo diodes. For example, the semiconductor substrate 100 and the first or second photoelectric conversion region 110a or 110b may constitute a pn junction serving as a photo diode. In the case where light is incident into the first and second photoelectric conversion regions 110a and 110b constituting the photo diodes, photocharges may be generated in proportion to an intensity of the incident light.

In each of the first to third pixel regions PG1, PG2, PB, and PR, there may be a phase difference between electrical signals, which are output from the first and second photoelectric conversion regions 110a and 110b. In the image sensor, the phase difference between the electrical signals, which are output from a pair of the first and second photoelectric conversion regions 110a and 110b, may be used to calculate a distance to a subject, to determine whether the subject is in or out of focus, to determine an extent of the out-of focus, and to automatically adjust a focal length of the image sensor.

In each of the first to third pixel regions PG1, PG2, PB, and PR, separation structures 103, 105, and 107 may be provided between the first and second photoelectric conversion regions 110a and 110b. For example, each separation structure 103, 105, and 107 may be disposed at least partly at the same vertical level as the first and second photoelectric conversion regions 110a and 110b (e.g., in a third direction perpendicular to first and second horizontal directions). The separation structures 103, 105, and 107 may prevent light, which is incident into the first photoelectric conversion region 110a, from entering the second photoelectric conversion region 110b, and vice versa. For example, each of the separation structures 103, 105, and 107 may prevent the cross-talk phenomenon between the first and second photoelectric conversion regions 110a and 110b in a corresponding one of the first to third pixel regions PG1, PG2, PB, and PR. In one embodiment, each of the separation structures 103, 105, and 107 may be located at a center of a corresponding one of the pixel regions PG1, PG2, PB, and PR. In the present specification, the center of each of the pixel regions PG1, PG2, PB, and PR may refer to a point, which is equidistant from adjacent first pixel isolation portions 101a and is also equidistant from adjacent second pixel isolation portions 101b. Each separation structure 103, 105, and 107, may be bilaterally or radially symmetric about the center of its corresponding pixel region.

In some embodiments, a first separation structure 103 may be provided in each of the first pixel regions PG1 and PG2, a second separation structure 105 may be provided in the second pixel region PB, and a third separation structure 107 may be provided in the third pixel region PR.

The formation of the first and second separation structures 103 and 105 may include patterning the first surface 100a and/or the second surface 100b of the semiconductor substrate 100 to form a deep trench and filling the deep trench with an insulating material.

In detail, the first separation structure 103 may be disposed between the first and second photoelectric conversion regions 110a and 110b, in each of the first pixel regions PG1 and PG2. The first separation structure 103 may have a line shape extending in the second direction D2, when viewed in a plan view, and may have a plate shape when viewed in a perspective view. The first separation structure 103 may be disposed to extend lengthwise between the first pixel isolation portions 101a of the pixel isolation structure 101 and may be spaced apart from the first pixel isolation portions 101a of the pixel isolation structure 101. A length, in the second direction D2, of the first separation structure 103 may be smaller than the distance L1 between the first pixel isolation portions 101a of the pixel isolation structure 101. The first separation structure 103 may have a second width W2, which is smaller than the first width W1 of the pixel isolation structure 101.

The first separation structure 103 may be vertically extended from the second surface 100b of the semiconductor substrate 100 toward the first surface 100a, and a vertical depth of the first separation structure 103 may be smaller than a vertical depth of the pixel isolation structure 101. The first separation structure 103 may be described as a first separation wall or barrier.

When viewed in a plan view, the second separation structure 105 may include a first separation portion 105a extending in the second direction D2 and a second separation portion 105b extending in the first direction D1 and crossing, or intersecting, the first separation portion 105a. The second separation structure 105 may be spaced apart from the pixel isolation structure 101. Lengths L2 and L3 of the second separation structure 105 in the first and second directions D1 and D2 may be smaller than the distance L1 between the first pixel isolation portions 101a of the pixel isolation structure 101. In one embodiment, the length L2 of the first separation portion 105a in the second direction D2 may be equal to the length L3 of the second separation portion 105b in the first direction D1. Each of the first and second separation portions 105a and 105b of the second separation structure 105 may have a second width W2, which is smaller than the first width W1 of the pixel isolation structure 101.

In the second pixel region PB, the first separation portion 105a of the second separation structure 105 may be disposed between the first and second photoelectric conversion regions 110a and 110b, and the second separation portion 105b may be partially overlapped with the first and second photoelectric conversion regions 110a and 110b, when viewed in a plan view.

Since the second separation structure 105 includes the first and second separation portions 105a and 105b crossing each other, light incident into the second pixel region PB may be reflected in both of the first and second directions D1 and D2 by the second separation structure 105. Even if the incident light is reflected in a diffused manner by the second separation structure 105, an amount of light propagating from the second pixel region PB toward the first pixel region PG1 adjacent thereto in the first direction D1 may be substantially equal to an amount of light propagating from the second pixel region PB toward the first pixel region PG2 adjacent thereto in the second direction D2. Thus, it may be possible to prevent or suppress a noise level from being changed depending on positions of the first pixel regions PG1 and PG2. Furthermore, since the second separation structure 105 is spaced apart from the pixel isolation structure 101, it may be possible to reduce the diffuse reflection of the incident light, which may be caused by the second separation structure 105.

The third separation structure 107 may be formed of a material, whose refractive index is different from the first and second separation structures 103 and 105, or may have a shape different from the first separation structure 103. The third separation structure 107 may be a separation impurity region, which is doped with impurities, and is of the same conductivity type as the semiconductor substrate 100.

The third separation structure 107 may have a line shape extending in the second direction D2, when viewed in a plan view, and may contact the pixel isolation structure 101. Items described herein as "contacting" or "in contact with" each other are directly adjacent to each other and are touching. The third separation structure 107 may be vertically extended from the second surface 100b of the semiconductor substrate 100 toward the first surface 100a, when viewed in a sectional view. In one embodiment, when measured from the second surface 100b of the semiconductor substrate 100, a depth of the third separation structure 107 may be larger than depths of the first and second separation structures 103 and 105.

Since the third separation structure 107 is formed of an impurity region of the first conductivity type, the third separation structure 107 may serve as a potential barrier between the first and second photoelectric conversion regions 110a and 110b. Therefore, it may be possible to prevent photocharges, which are generated in the first photoelectric conversion region 110a, from being diffused into the second photoelectric conversion region 110b or to prevent photocharges, which are generated in the second photoelectric conversion region 110b, from being diffused into the first photoelectric conversion region 110a. In addition, since, like the first and second photoelectric conversion regions 110a and 110b, the third separation structure 107 is formed of a semiconductor material, light incident into the third pixel region PR may not be refracted and may be reflected by the third separation structure 107, and thus, it may be possible to reduce a cross-talk phenomenon between the first pixel regions PG1 and PG2 adjacent to each other. The cross-talk phenomenon, which may occur between the third pixel region PR and the first pixel regions PG1 and PG2 adjacent thereto, may become substantially the same in the first and second directions D1 and D2. For example, it may be possible to reduce a difference associated with the cross-talk phenomenon occurring in a first pixel region RG1 and a first pixel region RG2, which are adjacent to the third pixel region PR in the first and second directions D1 and D2, respectively. Thus, it may be possible to prevent or suppress a noise level from being changed depending on positions of the first and second pixel regions PG1 and PG2.

In each of the first pixel regions PG1 and PG2, the first separation structure 103 may prevent the cross-talk phenomenon from occurring between the first and second photoelectric conversion regions 110a and 110b and may reduce the diffuse reflection of the incident light caused by the first separation structure 103.

The second separation structure 105 may reduce the cross-talk phenomenon occurring in the first and second directions D1 and D2 and may reduce the diffuse reflection of the incident light caused by the second separation structure 105.

The first and second separation structures 103 and 105 and the pixel isolation structure 101 may be formed at the same time. For example, the first and second separation structures 103 and 105 may be formed by patterning the second surface 100b of the semiconductor substrate 100 to form trenches in the semiconductor substrate 100 and filling the trenches with an insulating material.

Since the second width W2 of the first and second separation structures 103 and 105 is smaller than the first width W1 of the pixel isolation structure 101, vertical depths of the first and second separation structures 103 and 105 may be smaller than the vertical depth of the pixel isolation structure 101.

The first and second separation structures 103 and 105 may include the same insulating material as the pixel isolation structure 101. The first and second separation structures 103 and 105 may be formed of an insulating material, whose refractive index is lower than that of the semiconductor substrate 100. For example, the first and second separation structures 103 and 105 may be formed of a silicon oxide layer, a silicon nitride layer, an undoped poly-silicon layer, a gaseous material, or any combination thereof. The first and second separation structures 103 and 105 may include an air gap.

Furthermore, in each of the first and second pixel regions PG1, PG2, and PB, a dummy separation impurity region 102 may be provided between the first and second photoelectric conversion regions 110a and 110b and below the first and second separation structures 103 and 105. The dummy separation impurity region 102 may be formed by injecting impurities, which are of the same conductivity type (e.g., p-type) as the semiconductor substrate 100, into the semiconductor substrate 100 using an ion-implantation process. Since the dummy separation impurity region 102 may serve as a potential barrier, the incident light may be separately provided to the first and second photoelectric conversion regions 110a and 110b.

Furthermore, according to some embodiments of the inventive concept, in each of the first to third pixel regions PG1, PG2, PB, and PR, the diffusion region FD may be disposed between the first and second photoelectric conversion regions 110a and 110b. In each of the first to third pixel regions PG1, PG2, PB, and PR, the floating diffusion region FD may be formed by injecting impurities of the second conductivity type into the first surface 100a of the semiconductor substrate 100 using, for example, an ion-implantation process.

On the first surface 100a of the semiconductor substrate 100, the first transfer gate electrode TG1 may be disposed between the first photoelectric conversion region 110a and the floating diffusion region FD, and the second transfer gate electrode TG2 may be disposed between the second photoelectric conversion region 110b and the floating diffusion region FD.

In one embodiment, a portion of each of the first and second transfer gate electrodes TG1 and TG2 may be disposed in the semiconductor substrate 100, and a gate insulating layer may be interposed between the first and second transfer gate electrodes TG1 and TG2 and the semiconductor substrate 100.

The floating diffusion region FD may be provided in the semiconductor substrate 100 between the first and second transfer gate electrodes TG1 and TG2. The floating diffusion region FD may be formed by performing an ion implanting process into the semiconductor substrate 100 and may have a conductivity type different from the semiconductor substrate 100. For example, the floating diffusion region FD may be an n-type impurity region.

The interlayered insulating layers 220 may be stacked on the first surface 100a of the semiconductor substrate 100, and the interlayered insulating layers 220 may cover the MOS transistors and the transfer gate electrodes TG1 and TG2, which constitute the read-out circuits. The interlayered insulating layers 220 may include, for example, silicon oxide, silicon nitride, and/or silicon oxynitride. The conductive lines 210 may be disposed on the interlayered insulating layers 220, respectively, and the conductive lines 210 may be electrically connected to the read-out circuits through contact plugs.

Color filters 320G, 320B, and 320R and the micro lenses 330 may be disposed on the second surface 100b of the semiconductor substrate 100. In addition, a planarization insulating layer 301 may be disposed between the second surface 100b of the semiconductor substrate 100 and the color filters 320G, 320B, and 320R. The color filters 320G, 320B, and 320R and the micro lenses 330 may be disposed corresponding to the first to third pixel regions PG1, PG2, PB, and PR, respectively.

The color filters 320G, 320B, and 320R may include color filters of red, green or blue, as described with reference to FIGS. 4A to 4D. Unlike this, the color filters may have other colors, such as cyan, magenta, or yellow. In an embodiment, the green filters 320G may be disposed on the first pixel regions PG1 and PG2, the blue filters 320B may be disposed on the second pixel region PB, and the red filters 320R may be disposed on the third pixel region PR.

The micro lens 330 may have a convex shape and may be used to concentrate light, which is incident into the first to third pixel regions PG1, PG2, PB, and PR. In an embodiment, each of the micro lenses 330 may be overlapped with a pair of the first and second photoelectric conversion regions 110a and 110b, when viewed in a plan view.

A grid pattern 310 may be disposed between the color filters 320G, 320B, and 320R. Similar to the pixel isolation structure 101, the grid pattern 310 may have a grid or mesh shape, when viewed in a plan view. The grid pattern 310 may be formed of a metal material (e.g., tungsten or aluminum).

Figure 5C:
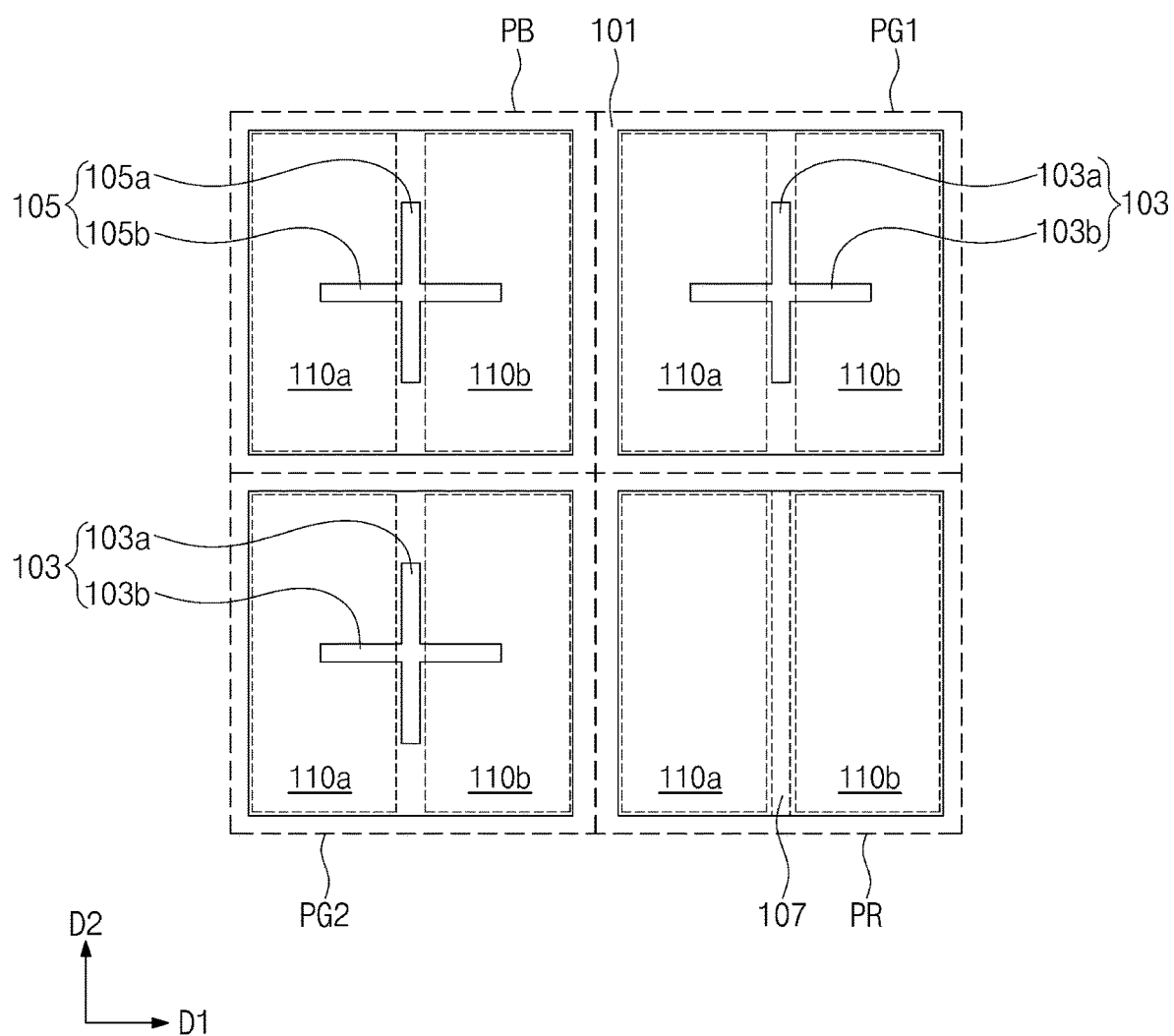

According to the embodiment shown in FIG. 5C, in each of the first pixel regions PG1 and PG2, the first separation structure 103 may include a first separation portion 103a extending in the second direction D2 and a second separation portion 103b extending in the first direction D1 and crossing the first separation portion 103a, similar to the second separation structure 105.

Figure 5D:
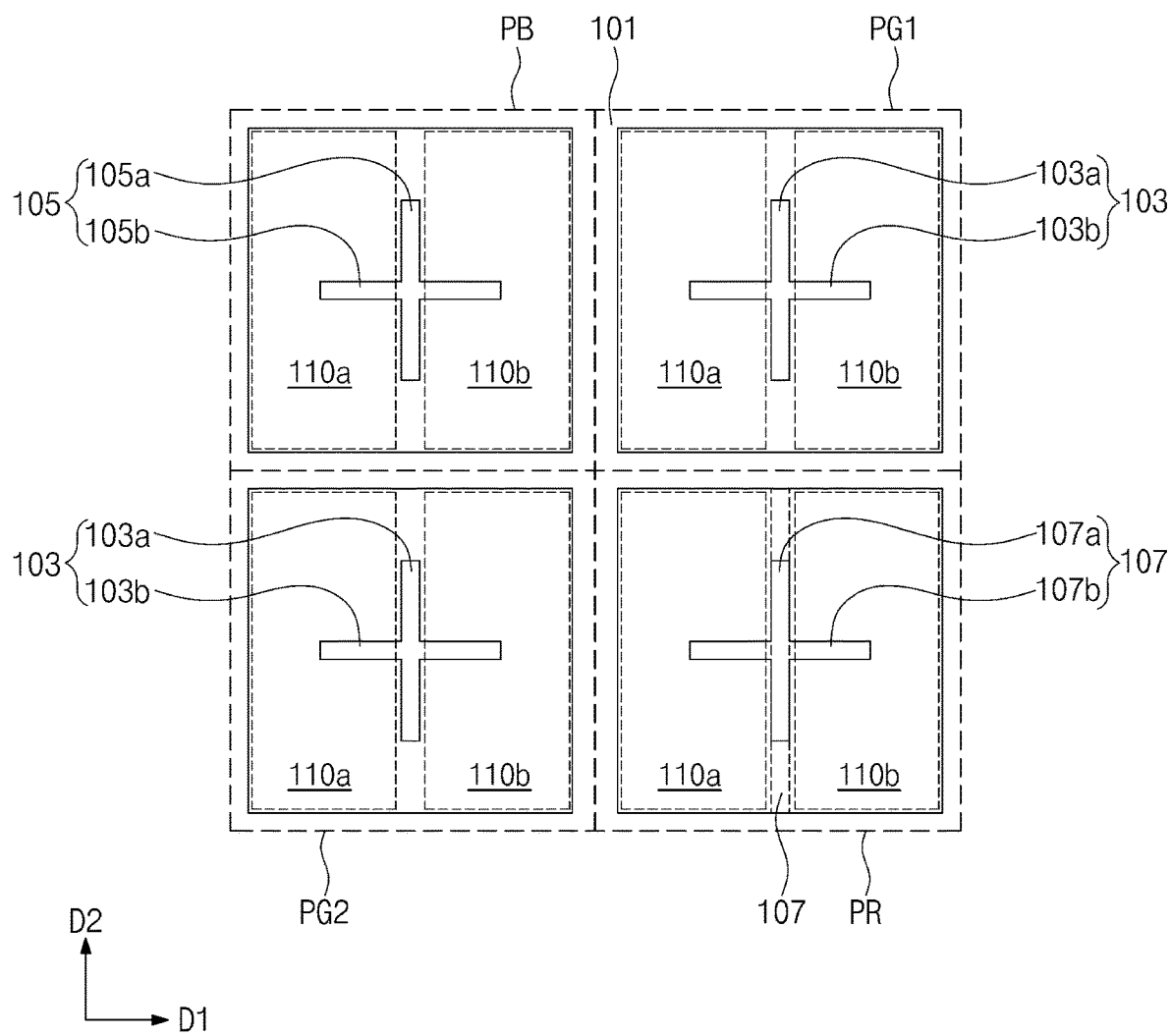

According to the embodiment shown in FIG. 5D, in the first to third pixel regions PG1, PG2, PB, and PR, each of the first to third separation structures 103, 105, and 107 may include a first separation portion 103a, 105a, or 107a extending in the second direction D2 and a second separation portion 103b, 105b, or 107b extending in the first direction D1 and crossing the first separation portion 103a, 105a, or 107a.

Figure 5E:
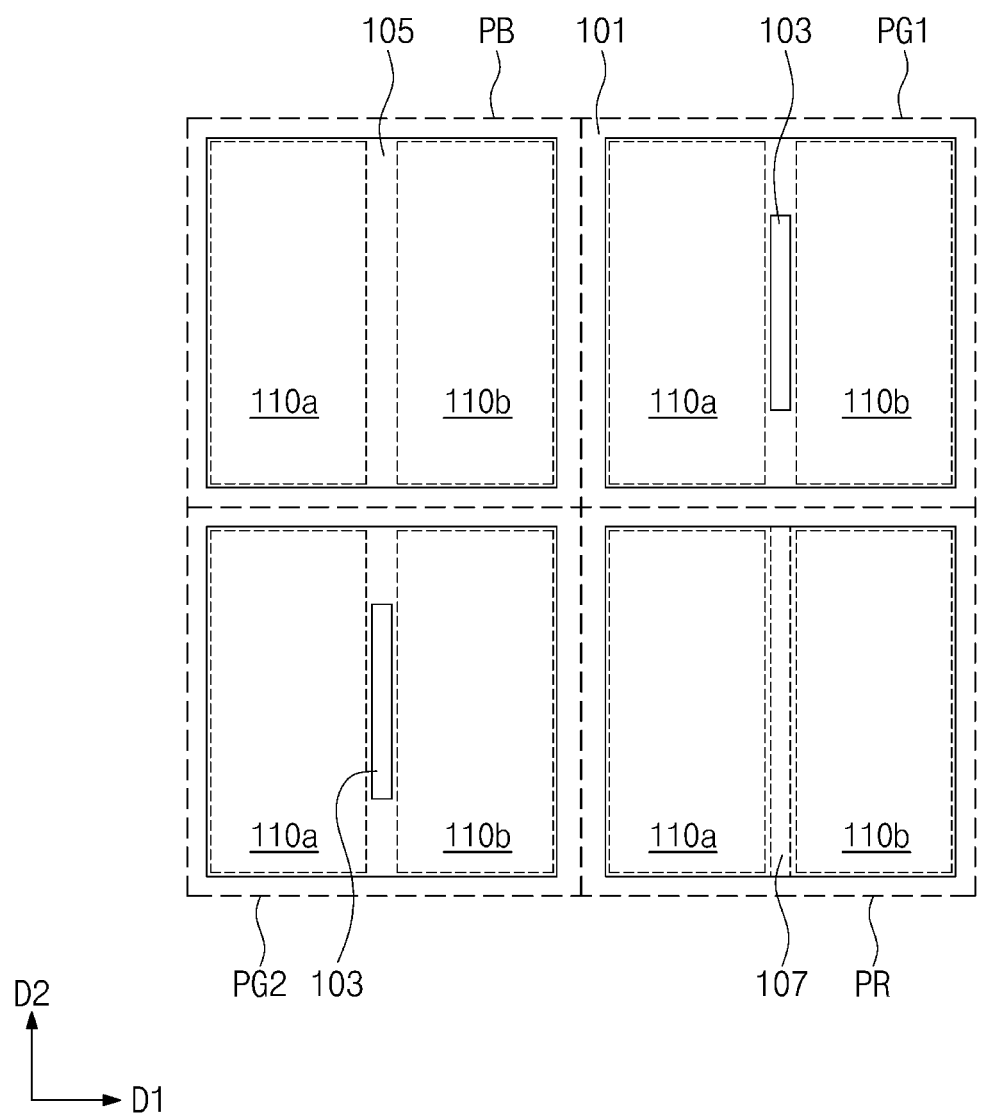
Figure 6A:
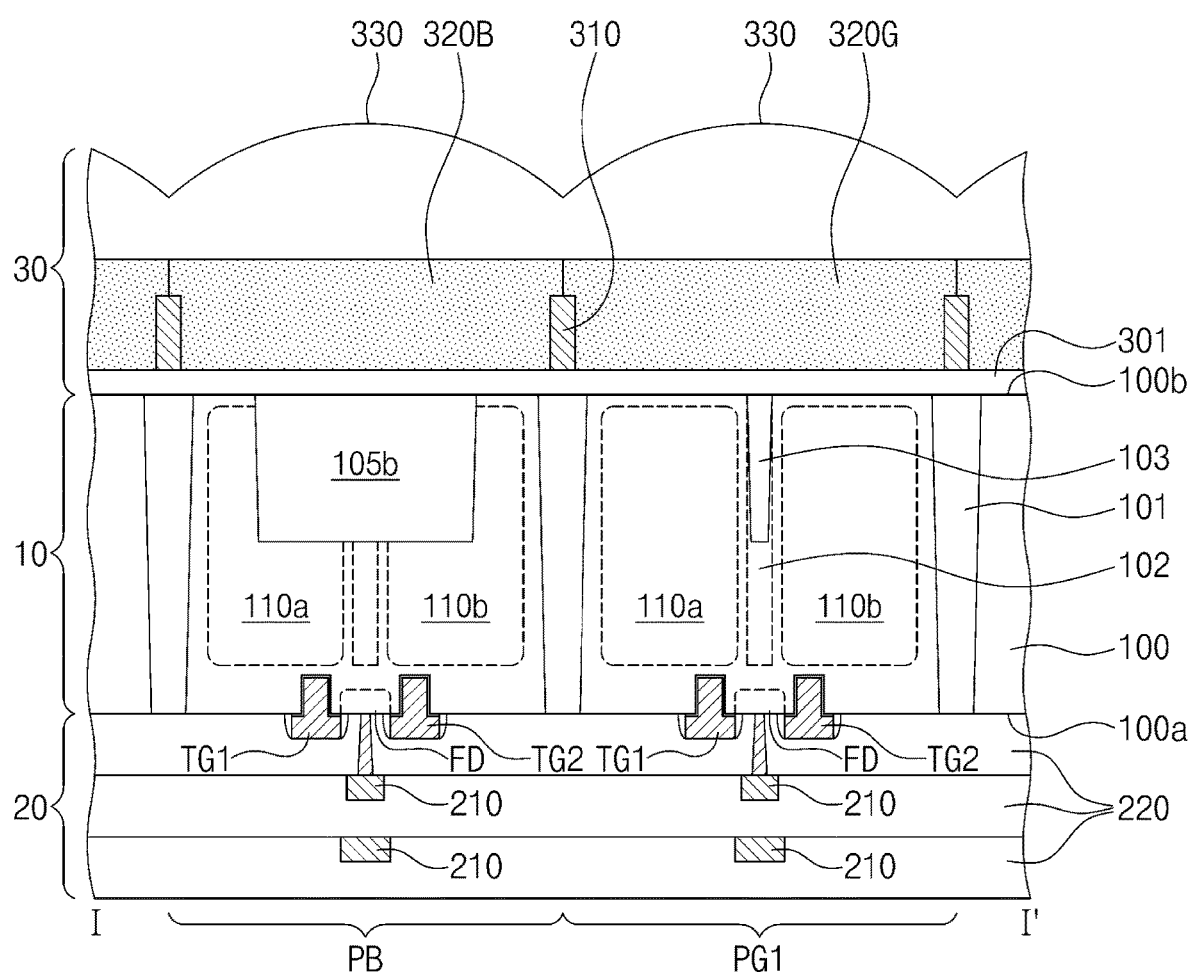
FIGS. 6A, 6B, 6C, and 6D are sectional views, which are respectively taken along lines I-I', II-II', and III-III' of FIG.
Figure 6B:
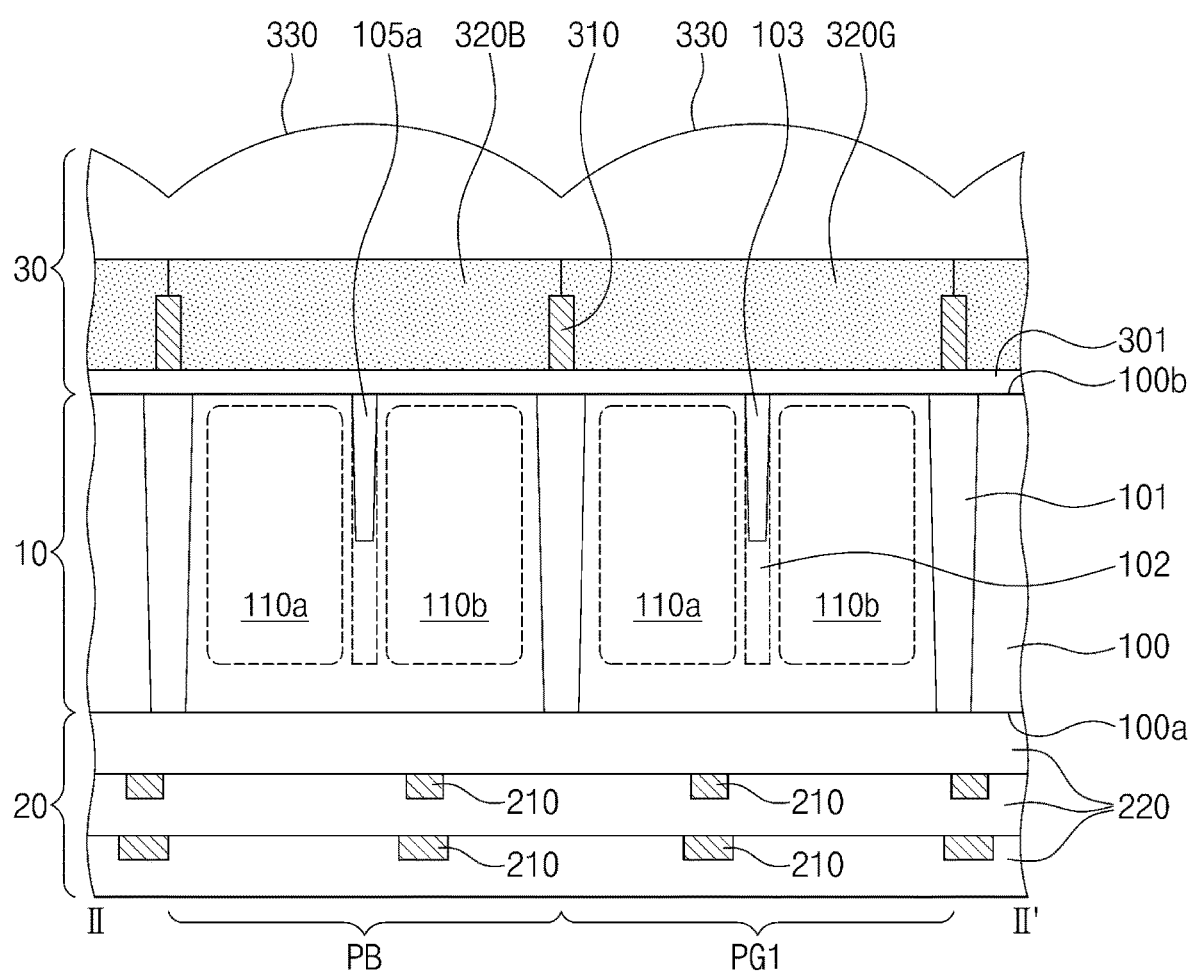
Figure 6C:
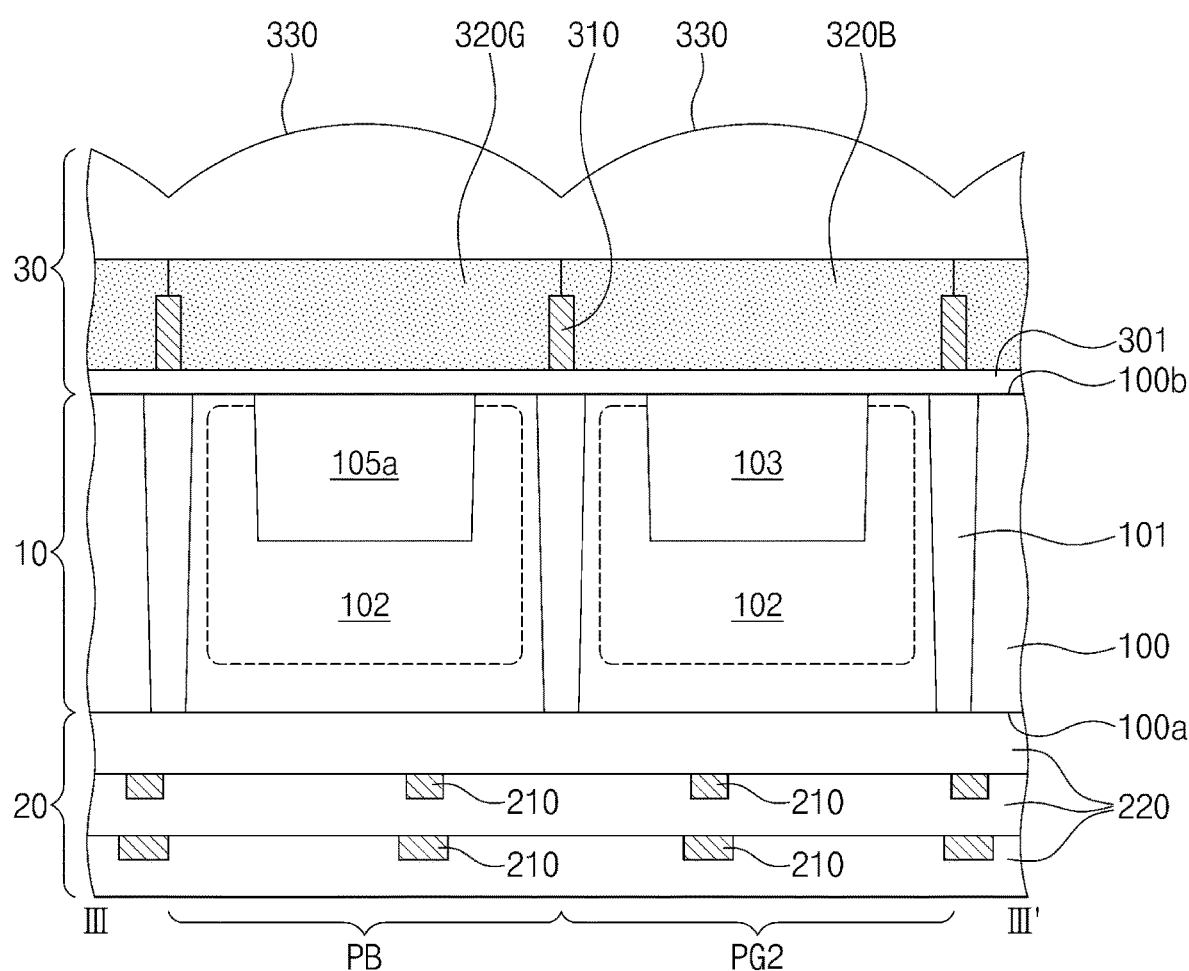
Figure 6D:
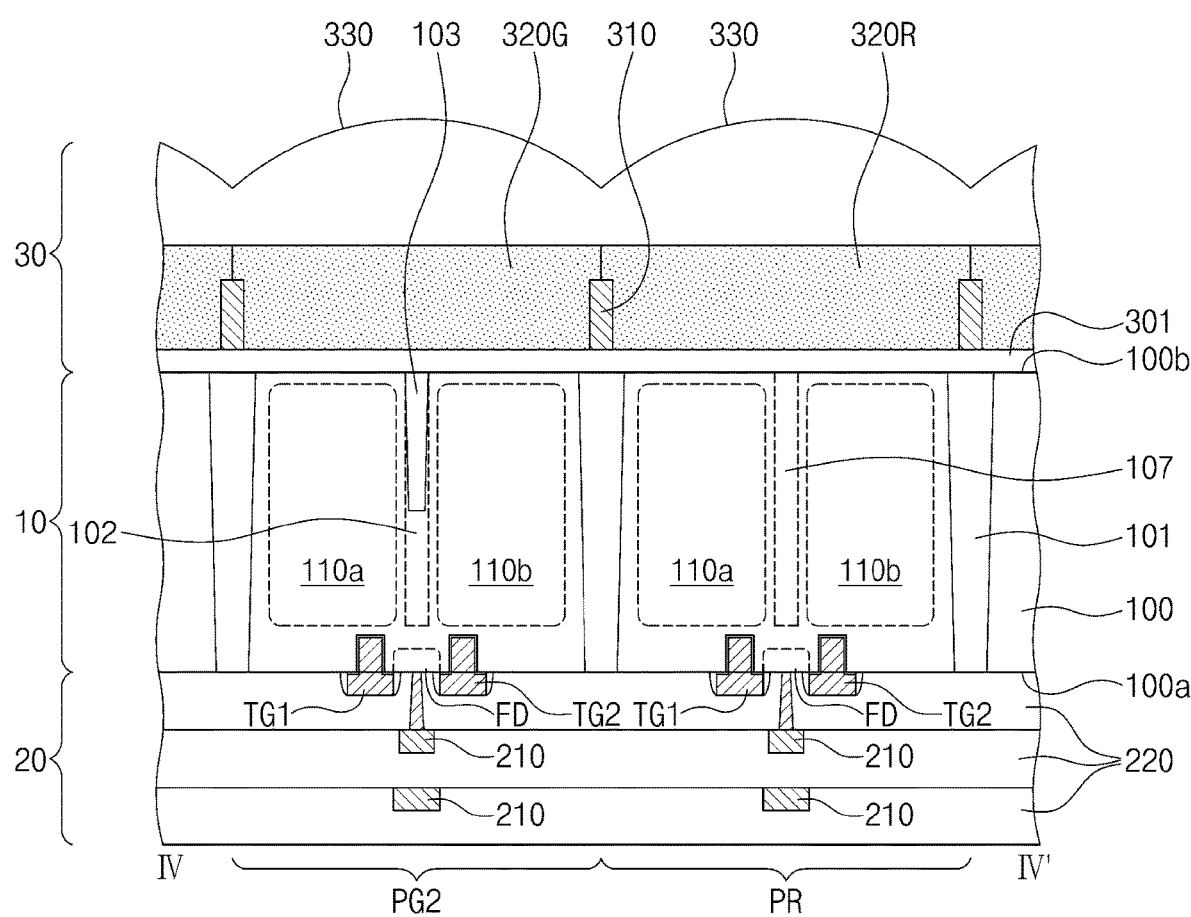

According to the embodiment shown in FIG. 5E, in each of the first pixel regions PG1 and PG2, the first separation structure 103 may be disposed between the first and second photoelectric conversion regions 110a and 110b. The first separation structure 103 may have a line shape extending in the second direction D2, when viewed in a plan view. Each of the second and third separation structures 105 and 107 may be a separation impurity region, which is of the first conductivity type and is provided in the semiconductor substrate 100 between the first and second photoelectric conversion regions 110a and 110b.

In the following embodiments, a previously described element may be identified by the same reference number without repeating an overlapping description thereof, for the sake of brevity.

FIGS. 7A, 7B, and 7C are sectional views, each of which is taken along a line I-I' of FIG. 5A to illustrate an image sensor according to an embodiment of the inventive concept.

Referring to FIG. 7A, the pixel isolation structure 101 may include a first insulating layer 111, which covers an inner surface of the deep trench with a constant thickness (e.g., it may be conformally formed along surfaces of the semiconductor substrate 100 that form the trench), and a second insulating layer 113, which fills the trench provided with the first insulating layer 111. The first insulating layer 111 and the second insulating layer 113 may be formed of different materials.

The pixel isolation structure 101 may vertically extend from the second surface 100b of the semiconductor substrate 100 toward the first surface 100a, and a bottom surface of the pixel isolation structure 101 may be spaced apart from the first surface 100a of the semiconductor substrate 100. In this manner, a depth of the pixel isolation structure 101 may be smaller than a thickness of the semiconductor substrate 100.

The first and second separation structures 103 and 105 may be formed of the same material as the first insulating layer 111 of the pixel isolation structure 101.

Referring to FIG. 7B, the pixel isolation structure 101 may include first and second refraction layers 112 and 114 having different refractive indices from each other. The first refraction layer 112 may be in contact with the semiconductor substrate 100, and the second refraction layer 114 may be disposed in the first refraction layer 112. Light, which is obliquely incident to the pixel isolation structure 101, may be refracted at an interfacial surface of the first and second refraction layers 112 and 114, due to the difference in refractive index. For example, the first refraction layer 112 may be formed of an insulating material (e.g., silicon oxide or silicon nitride), and the second refraction layer 114 may be formed of or include a poly-silicon layer or a metal layer. The first and second separation structures 103 and 105 may be formed of the same material as the first refraction layer 112 of the pixel isolation structure 101.

Referring to FIG. 7C, the pixel isolation structure 101 may have a first width near the first surface 100a of the semiconductor substrate 100 and a second width near the second surface 100b of the semiconductor substrate 100, and here, the second width may be smaller than the first width. In addition, the width of the pixel isolation structure 101 may gradually decrease in a direction from the first surface 100a of the semiconductor substrate 100 toward the second surface 100b.

FIGS. 8A, 9A, 10A, and 10C are plan views, each illustrating an active pixel sensor array of an image sensor according to an embodiment of the inventive concept. FIGS. 8B, 9B, and 10B are sectional views, which are respectively taken along lines I-I' of FIGS. 8A, 9A, and 10A to illustrate an active pixel sensor array of an image sensor according to an embodiment of the inventive concept.

As described above, the first separation structure 103 may be provided in each of the first pixel regions PG1 and PG2, the second separation structure 105 may be provided in the second pixel region PB, and the third separation structure 107 may be provided in the third pixel region PR.

Referring to FIGS. 8A and 8B, the first separation structure 103 may include the first separation portion 103a, which extends in the second direction D2, and the second separation portion 103b, which crosses the first separation portion 103a and extends and has a protruding shape in the first direction D1. Here, one of the first and second separation portions 103a and 103b may be spaced apart from the pixel isolation structure 101 and the other of the first and second separation portions 103a and 103b may be connected to the pixel isolation structure 101. A longitudinal axis length L3 of the second separation portion 103b may be shorter than a longitudinal axis length L2 of the first separation portion 103a.

The first separation portion 103a may extend in the second direction D2, may be positioned between the first and second photoelectric conversion regions 110a and 110b, and may be connected to the first pixel isolation portions 101a of the pixel isolation structure 101. The first separation portion 103a may have a length L2, which is the same as the distance L1 (e.g., see FIG. 5B) between the first pixel isolation portions 101a, when measured in the second direction D2. The first separation portion 103a may be disposed to cross each of the first pixel regions PG1 and PG2 and may be used to reduce the cross-talk issue between the first and second photoelectric conversion regions 110a and 110b. The second separation portion 103b of the first separation structure 103 may provide a cross structure extending between the first and second photoelectric conversion regions 110a and 110b, similar to the cross structure of the first and second pixel isolation portions 101a and 101b of the pixel isolation structure 101. An incident light may be incident to a center of each of the first pixel regions PG1 and PG2, and the incident light may be reflected or may be divided in the first and second directions D1 and D2 by the first separation structure 103.

Furthermore, since the first separation structure 103 is spaced apart from the pixel isolation structure 101 in the first direction D1, the incident light may not be reflected in a portion between the pixel isolation structure 101 and the second separation portion 103b of the first separation structure 103 and may be absorbed by the first and second photoelectric conversion regions 110a and 110b. Thus, an amount of light to be incident into the first and second photoelectric conversion regions 110a and 110b may be increased, and this may increase a difference between signals, which are output from the first and second photoelectric conversion regions 110a and 110b of each of the pixel regions PG1, PG2, PB, and PR. By comparing signals output from the first and second photoelectric conversion regions 110a and 110b, it may be possible to improve an operation property in an auto-focusing operation of controlling a position of a lens.

Since the pixel isolation structure 101 has a cross structure, which is formed by the first and second pixel isolation portions 101a and 101b intersecting each other, the pixel isolation structure 101 may have a largest depth at a region, at which the first and second pixel isolation portions 101a and 101b intersect each other. Furthermore, when the pixel isolation structure 101 and the first and second separation structures 103 and 105 are formed at the same time, it may be possible to provide substantially the same process environment to the center portion of each of the pixel regions PG1, PG2, PB, and PR.

The second separation structure 105 may include the first separation portion 105a, which crosses the second pixel region PB in the second direction D2, and the second separation portion 105b, which crosses the second pixel region PB in the first direction D1. The second separation portion 105b of the second separation structure 105 may cross the first separation portion 105a and the first and second pixel regions PG1, PG2, and PB. The second separation structure 105 may reduce a difference between the cross-talk among the pixel regions adjacent to each other in the first direction D1 and the cross-talk among the pixel regions adjacent to each other in the second direction D2.

As described above, the third separation structure 107 may extend in the second direction D2, when viewed in a plan view, and may be a separation impurity region, which is of the first conductivity type and is provided in the semiconductor substrate 100 between the first and second photoelectric conversion regions 110a and 110b. Light incident into the third pixel region PR may be separately provided to the first and second photoelectric conversion regions 110a and 110b by the potential barrier, without a diffuse reflection issue caused by the third separation structure 107. Thus, the cross-talk phenomenon, which may occur between the third pixel region PR and the first pixel regions PG1 and PG2 adjacent thereto, may become substantially the same in the first and second directions D1 and D2.

Referring to FIGS. 9A and 9B, the second and third separation structures 105 and 107 may be the same in terms of their structure and material. In detail, the second and third separation structures 105 and 107 may extend in the second direction D2, when viewed in a plan view, and may be separation impurity regions, which are of the first conductivity type and are provided in the semiconductor substrate 100 between the first and second photoelectric conversion regions 110a and 110b. In each of the second and third pixel regions PB and PR, the cross-talk phenomenon may occur in a symmetric manner in the first and second directions D1 and D2.

Referring to FIGS. 10A and 10B, in each of the first pixel regions PG1 and PG2, the first separation structure 103 may be spaced apart from the pixel isolation structure 101 in both of the first and second directions D1 and D2. Thus, light may be provided to the first and second photoelectric conversion regions 110a and 110b, without diffuse reflection at an edge portion of each of the first pixel regions PG1 and PG2. In addition, in the second pixel region PB, the second separation structure 105 may be spaced apart from the pixel isolation structure 101 in both of the first and second directions D1 and D2.

Figure 10C:
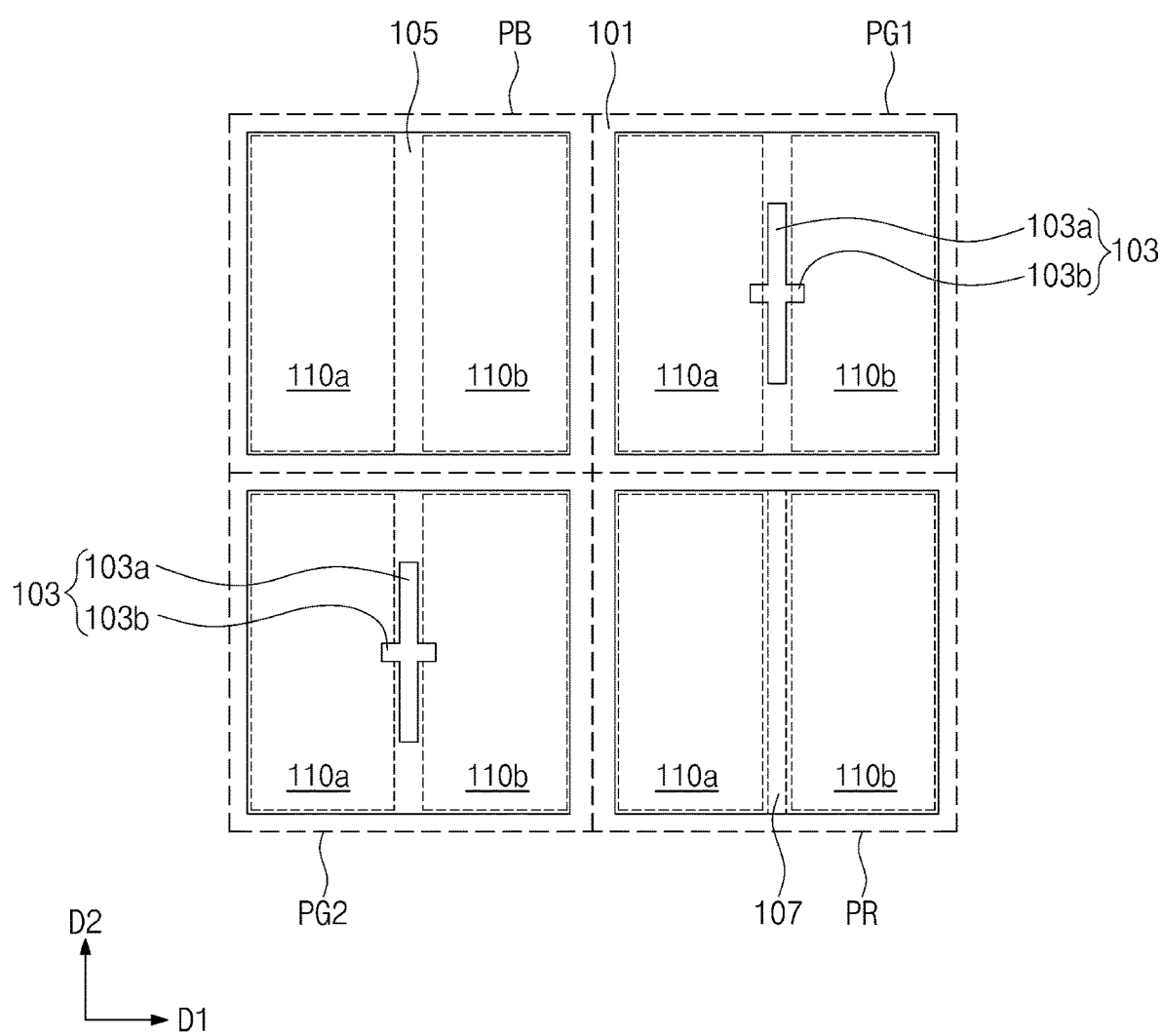

Referring to FIG. 10C, in each of the first pixel regions PG1 and PG2, the first separation structure 103 may be spaced apart from the pixel isolation structure 101, and the first separation structure 103 may include the first separation portion 103a extending in the second direction D2 and the second separation portion 103b extending from the first separation portion 103a and having a shape extending and protruding in the first direction D1. When viewed in a plan view, the second and third separation structures 105 and 107 of the second and third pixel regions PB and PR may extend in the second direction D2, and may be separation impurity regions, which are of the first conductivity type and are provided in the semiconductor substrate 100 between the first and second photoelectric conversion regions 110a and 110b.

FIGS. 11A and 11B are plan and sectional views illustrating an active pixel sensor array of an image sensor according to an embodiment of the inventive concept. FIG. 11B is a section view taken along a line I-I' of FIG. 11A. FIGS. 12A, 12B, 12C, and 12D are plan views, each illustrating an image sensor according to according to an embodiment of the inventive concept.

As described above, the first separation structure 103 may be provided in each of the first pixel regions PG1 and PG2, the second separation structure 105 may be provided in the second pixel region PB, and the third separation structure 107 may be provided in the third pixel region PR.

Referring to FIGS. 11A and 11B and FIGS. 12A to 12C, the pixel isolation structure 101 may include the first pixel isolation portions 101a extending in the first direction D1, the second pixel isolation portions 101b extending in the second direction D2, and a protruding portions 101P protruding from the first pixel isolation portions 101a. Here, the protruding portions 101P may protrude toward the center of the third pixel region PR or in the second direction D2. As another example, as shown in FIG. 12D, the protruding portions 101P of the pixel isolation structure 101 may be provided in each of the second and third pixel regions PB and PR. In each of the second and third pixel regions PB and PR, the protruding portions 101P of the pixel isolation structure 101 may be provided between the first and second photoelectric conversion regions 110a and 110b and may have a shape protruding in the second direction D2.

When viewed in a plan view, the third separation structure 107 may be provided between the protruding portions 101P of the pixel isolation structure 101 and may be extended in the second direction D2. The third separation structure 107 may be a separation impurity region, which is of the first conductivity type and is provided in the semiconductor substrate 100 between the first and second photoelectric conversion regions 110a and 110b. A length of the third separation structure 107 in the second direction D2 may be smaller than a distance between the first pixel isolation portions 101a of the pixel isolation structure 101.

The protruding portions 101P of the pixel isolation structure 101 may prevent respective junctions, which are formed between the first and second photoelectric conversion regions 110a and 110b of the third pixel region PR and a portion adjacent to the pixel isolation structure 101, from being deteriorated. In addition, the protruding portions 101P of the pixel isolation structure 101 may physically reflect an incident light at an edge of the third pixel region PR, and thus, it may be possible to reduce the cross-talk phenomenon between the first and second photoelectric conversion regions 110a and 110b, in the third pixel region PR.

Furthermore, the first and second separation structures 103 and 105 may be spaced apart from the pixel isolation structure 101 in the first and second directions D1 and D2, as shown in FIGS. 11A and 11B. Here, the first separation structure 103 may have a linear structure, and the second separation structure 105 may have a cross structure.

Figure 12A:
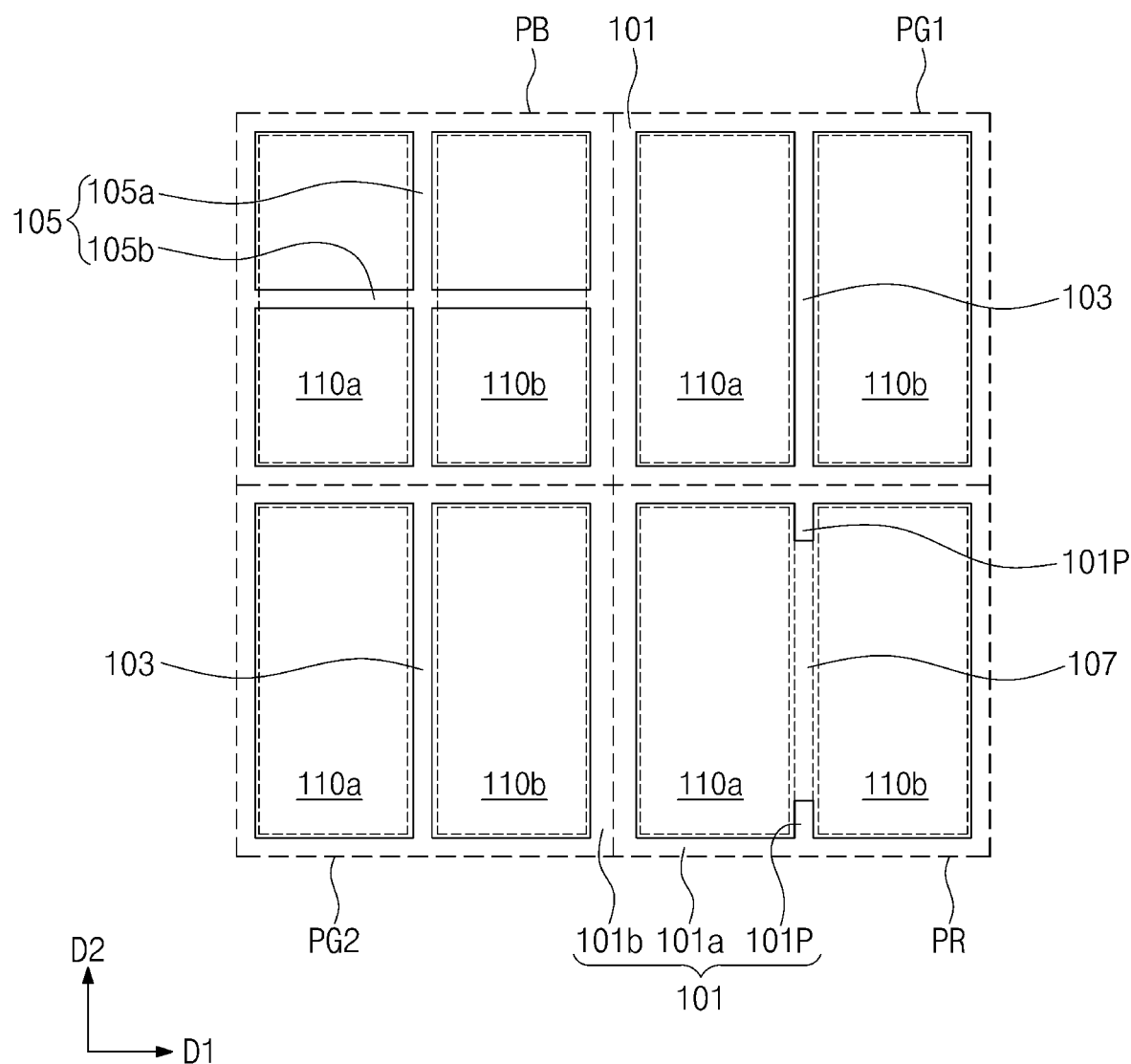

As another example, the first and second separation structures 103 and 105 may be connected to the pixel isolation structure 101, as shown in FIG. 12A. In other words, the first separation structure 103 may be provided to cross the first pixel regions PG1 and PG2 in the second direction D2. The second separation structure 105 may be provided to cross the second pixel region PB in the first and second directions D1 and D2.

Figure 12B:
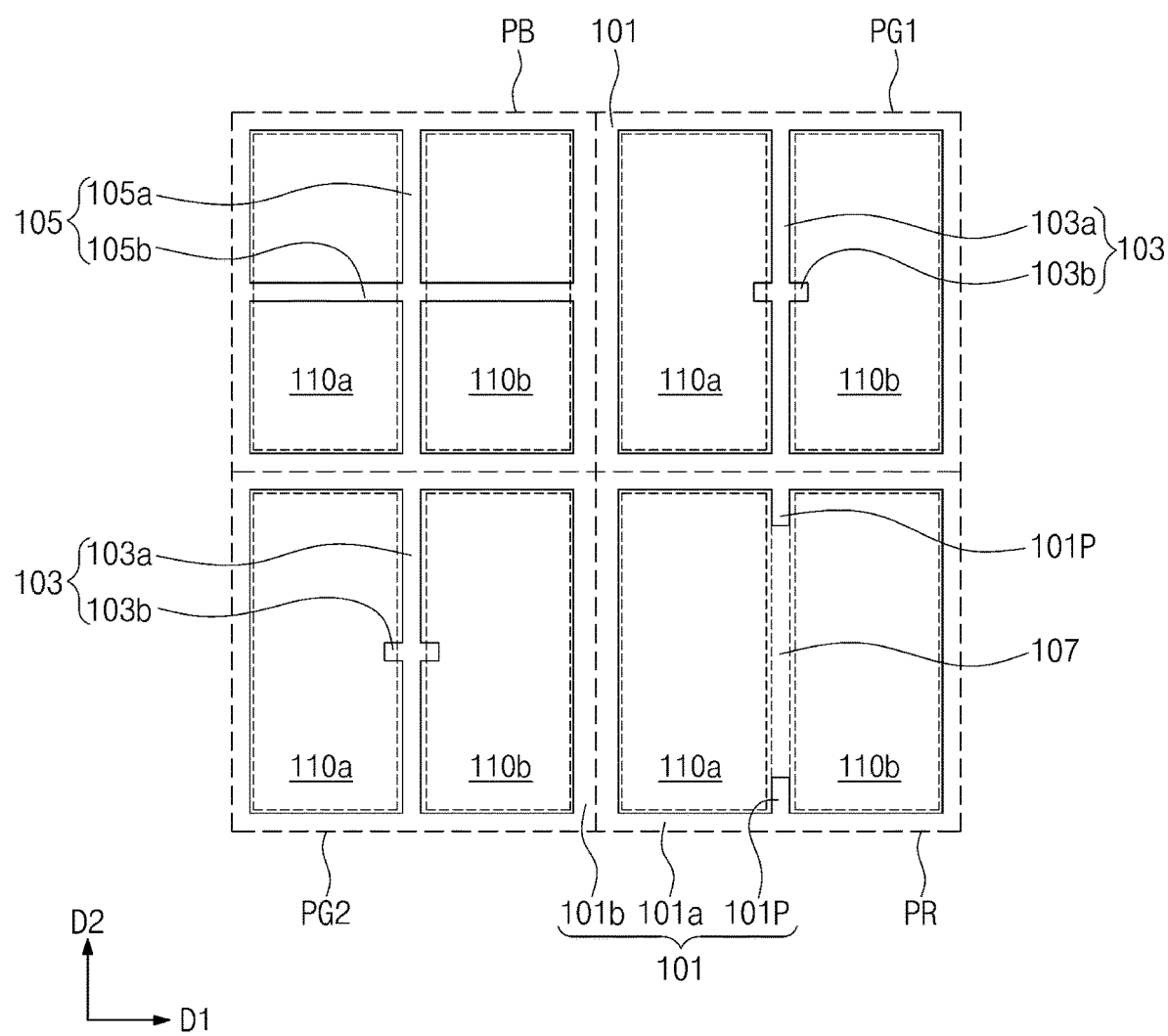
Figure 12C:
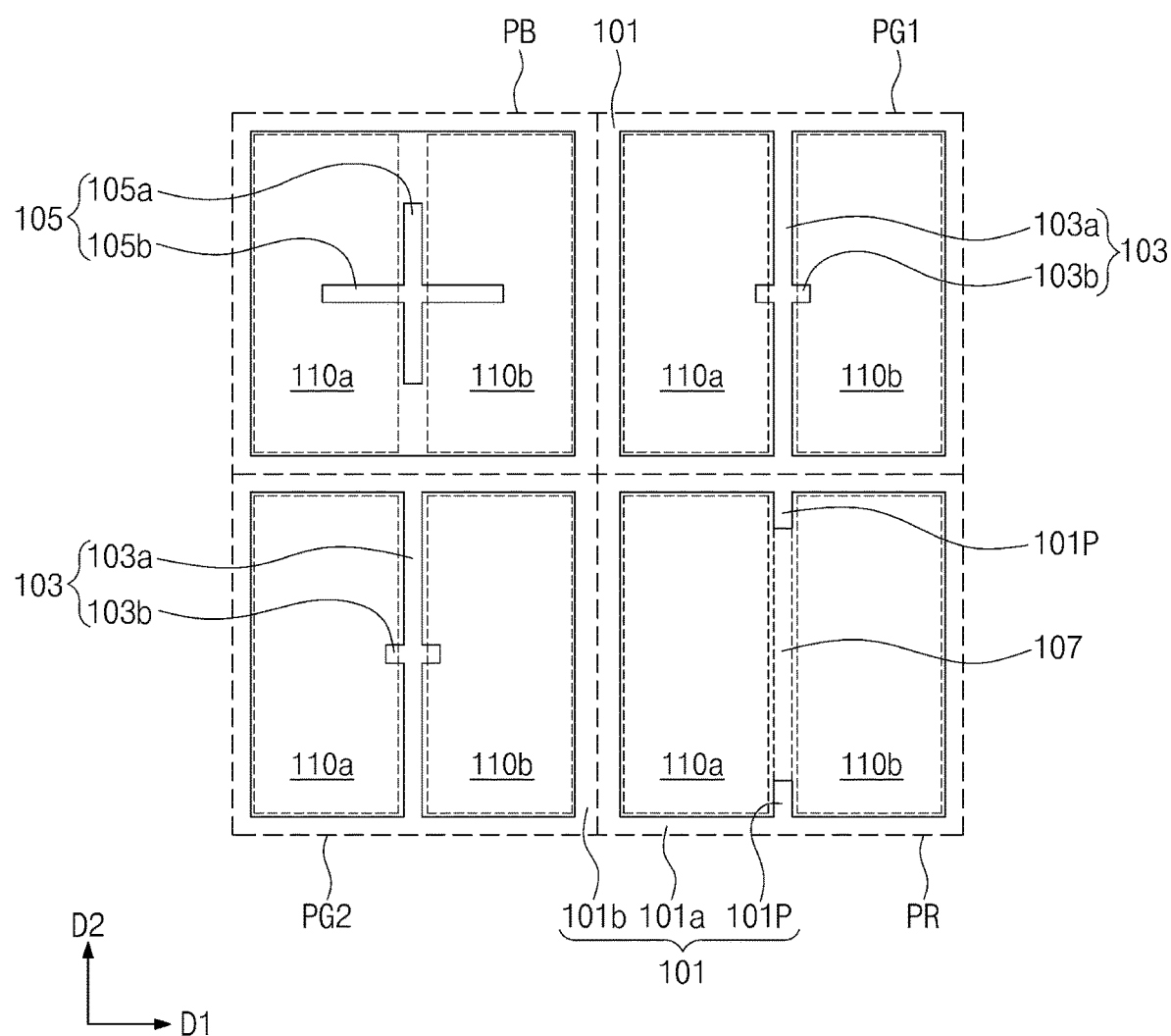
Figure 12D:
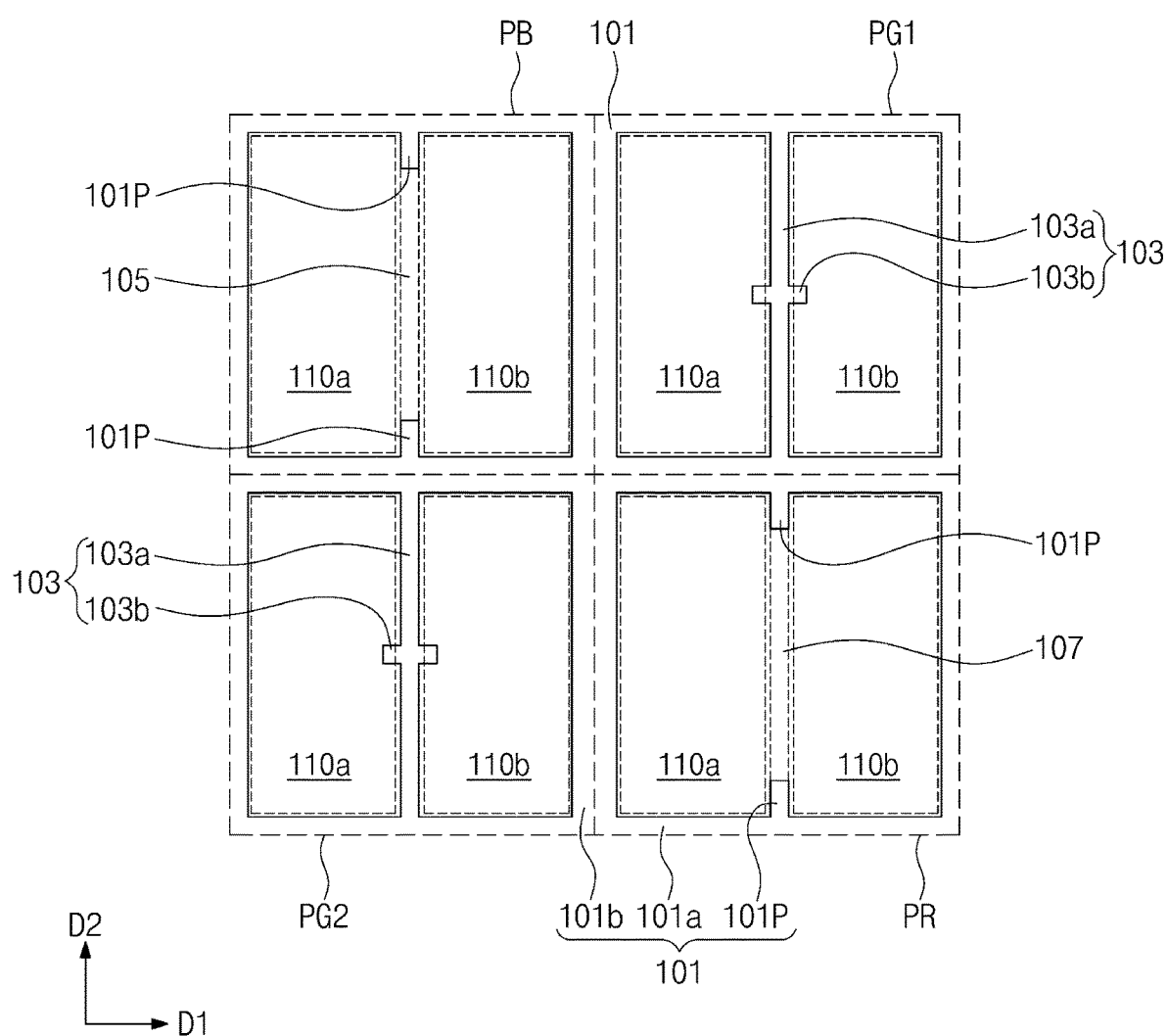

As another example, the first separation structure 103 may include the first separation portion 103a, which is extended in the second direction D2 and is connected to the pixel isolation structure 101, and the second separation portion 103b, which is provided across the first separation portion 103a and is spaced apart from the pixel isolation structure 101, as shown in FIGS. 12B and 12C. Here, as shown in FIG. 12B, the second separation structure 105 may cross the second pixel region PB in the first and second directions D1 and D2 and may be connected to the pixel isolation structure 101. Alternatively, as shown in FIG. 12C, the second separation structure 105 may include the first and second separation portions 105a and 105b crossing each other but may be spaced apart from the pixel isolation structure 101.

FIGS. 13A and 13B are plan views, each illustrating an active pixel sensor array of an image sensor according to an embodiment of the inventive concept. FIGS. 14A and 14B are sectional views, which are taken along lines I-I' and II-II' of FIG. 13A to illustrate an active pixel sensor array of an image sensor according to an embodiment of the inventive concept.

Referring to FIGS. 13A, 14A, and 14B, the pixel isolation structure 101 may include the first pixel isolation portions 101a extending in the first direction D1, the second pixel isolation portions 101b extending in the second direction D2, and the protruding portions 101P protruding from the first pixel isolation portions 101a. Here, each of the protruding portions 101P may protrude toward the center of a corresponding one of the first to third pixel regions PG1, PG2, PB, and PR or in the second direction D2.

The protruding portions 101P of the pixel isolation structure 101 may be provided in each of the first to third pixel regions PG1, PG2, PB, and PR. The protruding portions 101P of the pixel isolation structure 101 may be disposed between the first and second photoelectric conversion regions 110a and 110b, in each of the first to third pixel regions PG1, PG2, PB, and PR, and may have a shape protruding in the second direction D2.

In the first pixel regions PG1 and PG2, the first separation structure 103 may be disposed between the protruding portions 101P of the pixel isolation structure 101, as shown in FIGS. 13A and 13B. Here, the first separation structure 103 may include the first separation portion 103a extending in the second direction D2 and the second separation portion 103b extending in the first direction D1 and crossing the first separation portion 103a, as shown in FIG. 13A. Alternatively, the first separation structure 103 may have a line shape extending in the second direction D2, as shown in FIG. 13B.

In the second pixel region PB, as shown in FIGS. 13A and 13B, the second separation structure 105 may be disposed between the protruding portions 101P of the pixel isolation structure 101 and may include the first and second separation portions 105a and 105b crossing each other.

In the third pixel region PR, the third separation structure 107 may be a separation impurity region, which is of the first conductivity type and is provided in the semiconductor substrate 100 between the first and second photoelectric conversion regions 110a and 110b, as shown in FIGS. 13A and 13B. Here, the separation impurity region may be disposed between the protruding portions 101P of the pixel isolation structure 101.

FIGS. 15A, 15B, 15C, and 15D are plan views, each illustrating an active pixel sensor array of an image sensor according to an embodiment of the inventive concept.

As described above, the first separation structure 103 may be provided in each of the first pixel regions PG1 and PG2, the second separation structure 105 may be provided in the second pixel region PB, and the third separation structure 107 may be provided in the third pixel region PR.

Referring to FIGS. 15A to 15D, the pixel isolation structure 101 may include the first pixel isolation portions 101a extending in the first direction D1, the second pixel isolation portions 101b extending in the second direction D2, first protruding portions 101Pa protruding from the first pixel isolation portions 101a in the second direction D2, and second protruding portions 101Pb protruding from the second pixel isolation portions 101b in the first direction D1. Here, the first and second protruding portions 101Pa and 110Pb may have a shape partially protruding toward the center of each of the first to third pixel regions PG1, PG2, PB, and PR. In each of the first to third pixel regions PG1, PG2, PB, and PR, the protruding portions 101P of the pixel isolation structure 101 may be disposed between the first and second photoelectric conversion regions 110a and 110b.

Figure 15A:
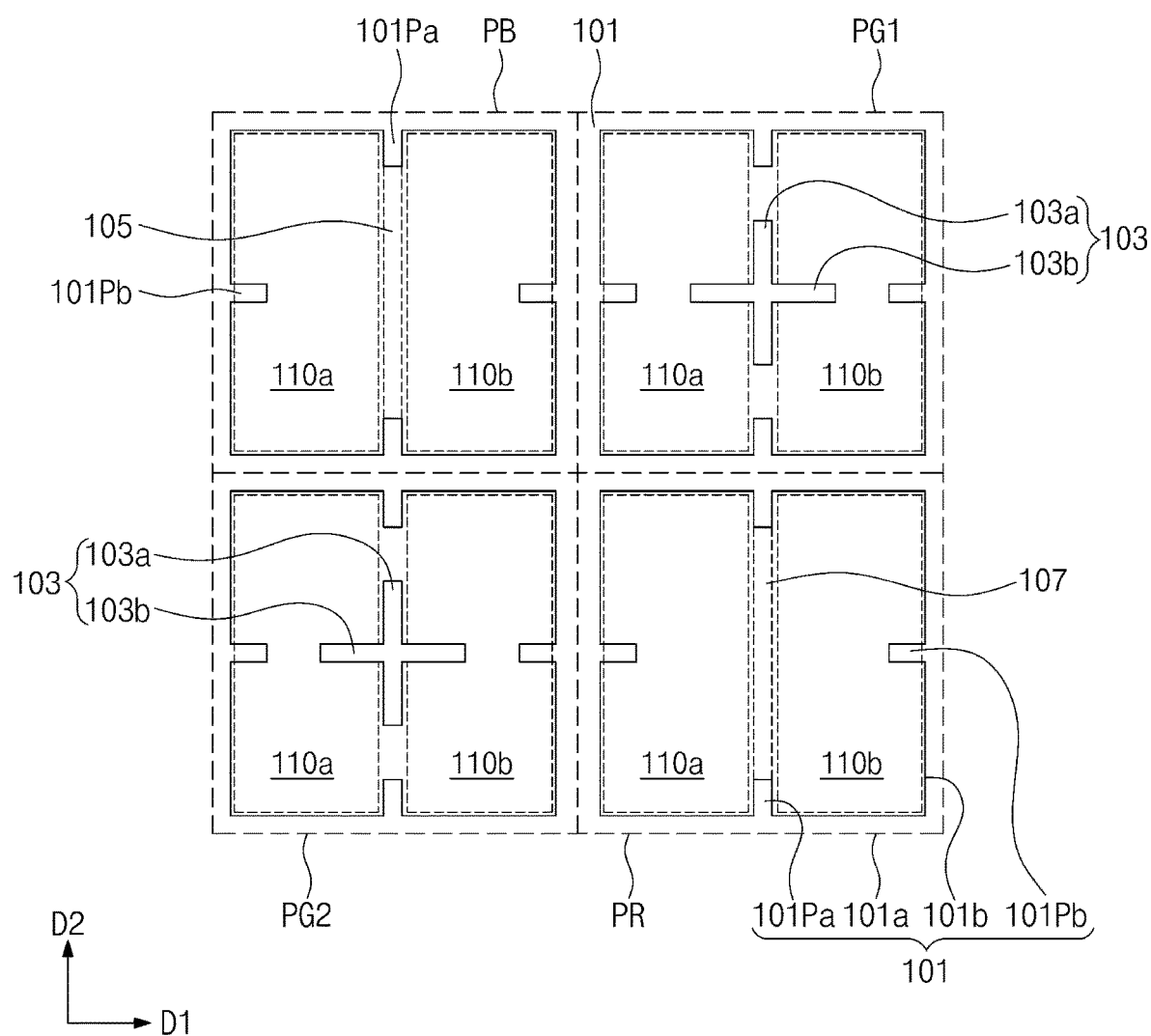
Figure 15B:
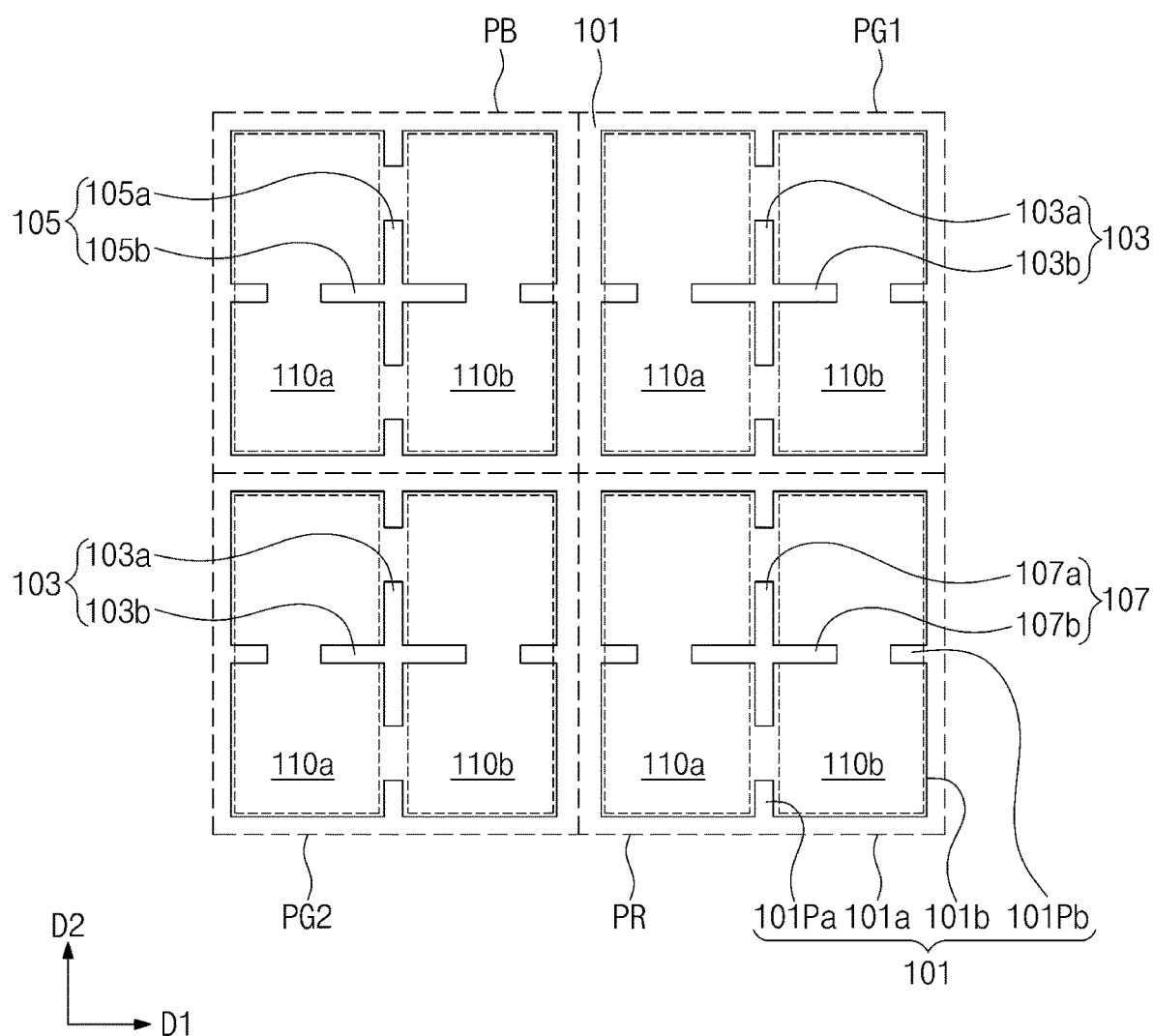
Figure 15C:
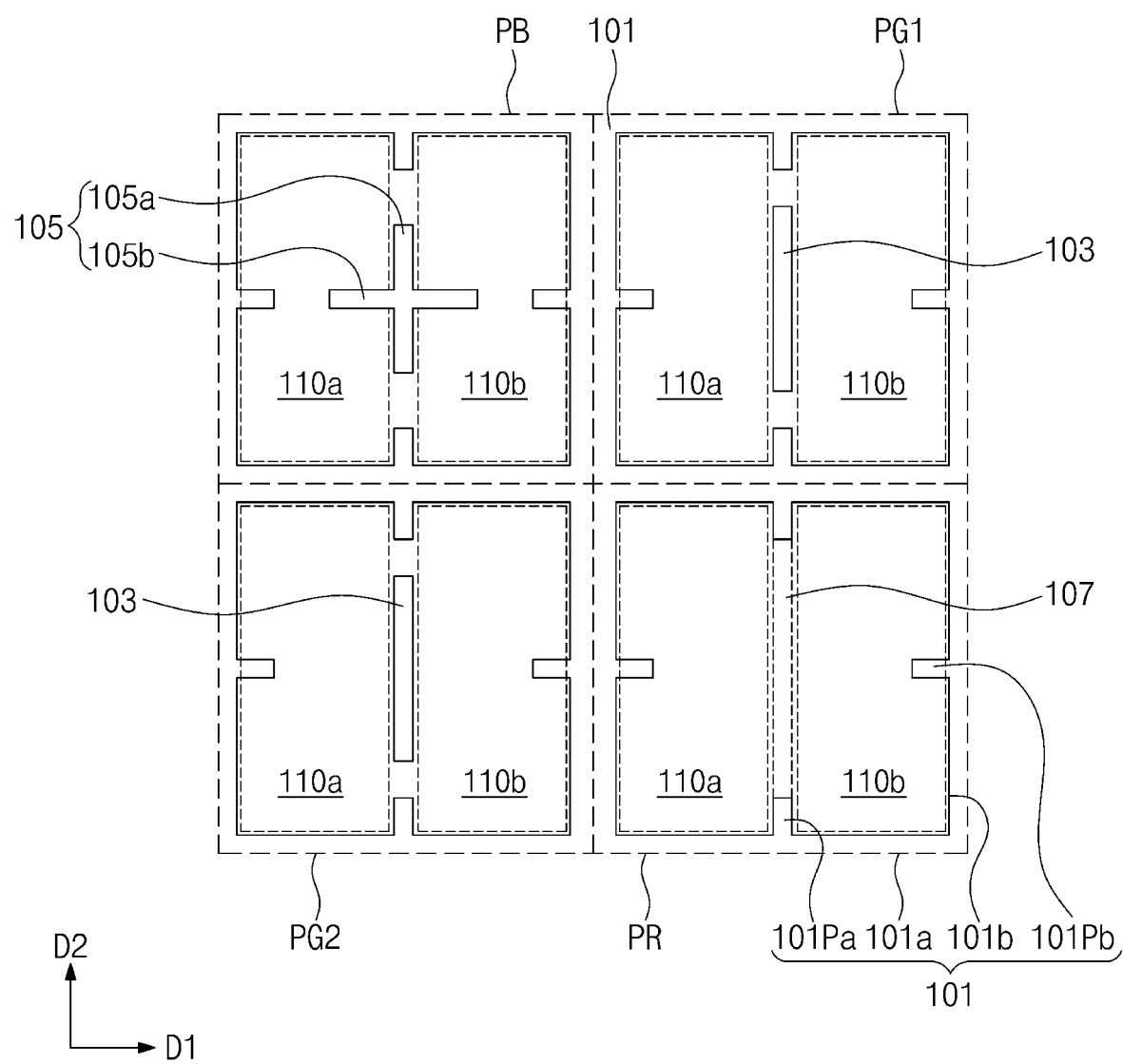
Figure 15D:
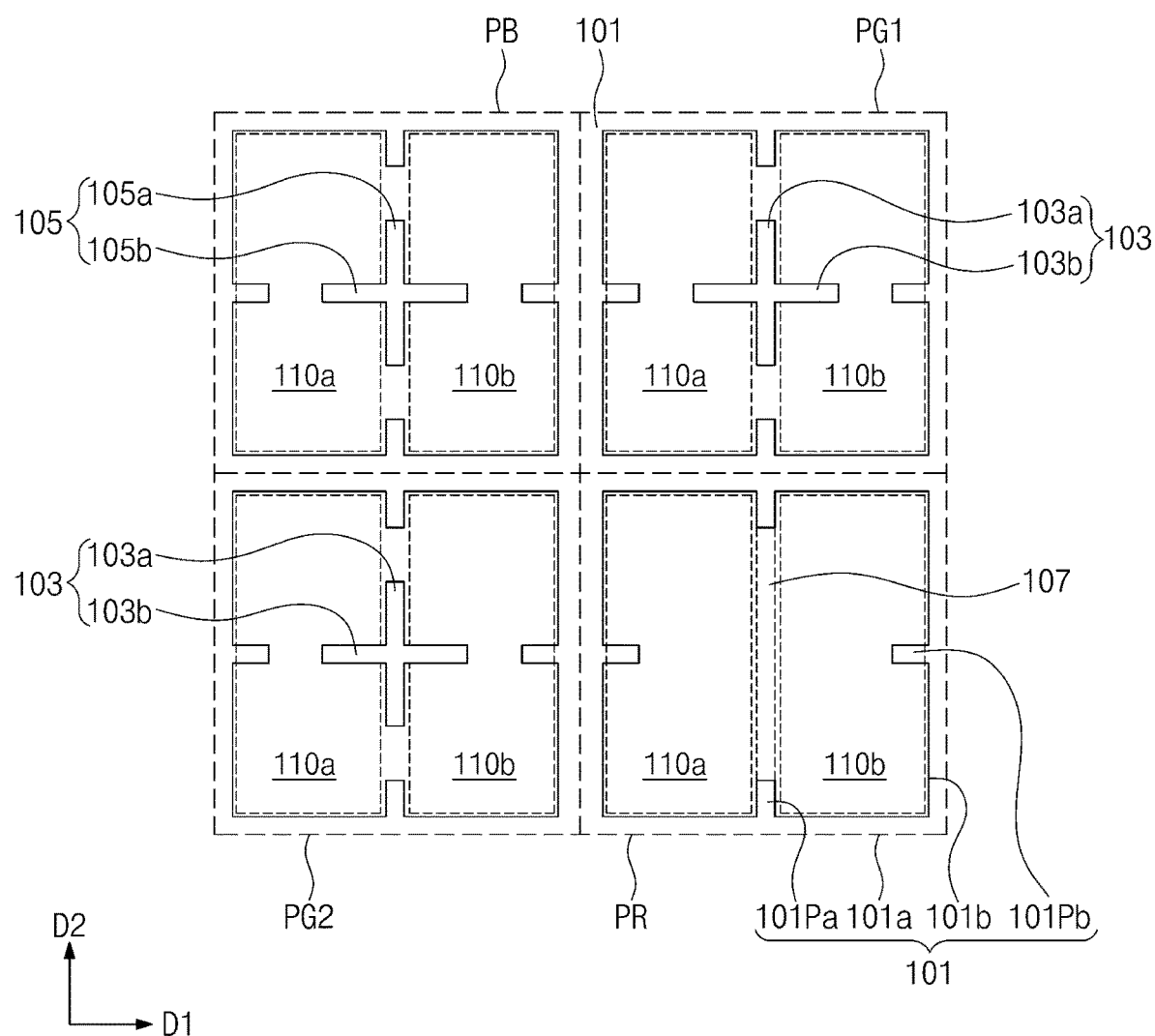

Referring to FIGS. 15A, 15B, and 15D, in each of the first pixel regions PG1 and PG2, the first separation structure 103 may include the first and second separation portions 103a and 103b crossing each other. The first separation portion 103a of the first separation structure 103 may be disposed between the first protruding portions 101Pa of the pixel isolation structure 101, and the second separation portion 103b of the first separation structure 103 may be disposed between the second protruding portions 101Pb of the pixel isolation structure 101. Alternatively, the first separation structure 103 may have a line shape extending in the second direction D2 between the first protruding portions 101Pa of the pixel isolation structure 101, as shown in FIG. 15C.

Referring to FIGS. 15A, 15C, and 15D, in the third pixel region PR, the third separation structure 107 may be a separation impurity region, which is of the first conductivity type and is provided in the semiconductor substrate 100 between the first and second photoelectric conversion regions 110a and 110b. Here, the separation impurity region may be disposed between the protruding portions 101P of the pixel isolation structure 101.

According to the embodiments shown in FIGS. 15A to 15D, in each of the first to third pixel regions PG1, PG2, PB, and PR, light may be reflected by the first to third separation structures 103, 105, and 107 and may be separately provided to the first and second photoelectric conversion regions 110a and 110b. Furthermore, since light may be incident into a region between the first to third separation structures 103, 105, and 107 and the pixel isolation structure 101, an amount of light absorbed to the first and second photoelectric conversion regions 110a and 110b may be increased.

FIGS. 16A, 16B, 16C, and 16D are plan views, each illustrating an active pixel sensor array of an image sensor according to an embodiment of the inventive concept. FIGS. 17A, 17B, and 17C are sectional views, which are taken along lines I-I', II-II', and III-III' of FIG. 16A to illustrate an active pixel sensor array of an image sensor according to an embodiment of the inventive concept.

Referring to FIGS. 16A, 17A, 17B, and 17C, first to fourth photoelectric conversion regions 110a, 110b, 110c, and 110d may be provided in each of the first to third pixel regions PG1, PG2, PB, and PR. The first to fourth photoelectric conversion regions 110a, 110b, 110c, and 110d may be impurity regions, which are doped with impurities and have a second conductivity type (e.g., n-type) different from that of the semiconductor substrate 100. In each of the first to third pixel regions PG1, PG2, PB, and PR, the first to fourth photoelectric conversion regions 110a, 110b, 110c, and 110d may be spaced apart from each other in the first and second directions D1 and D2.

Figure 16B:
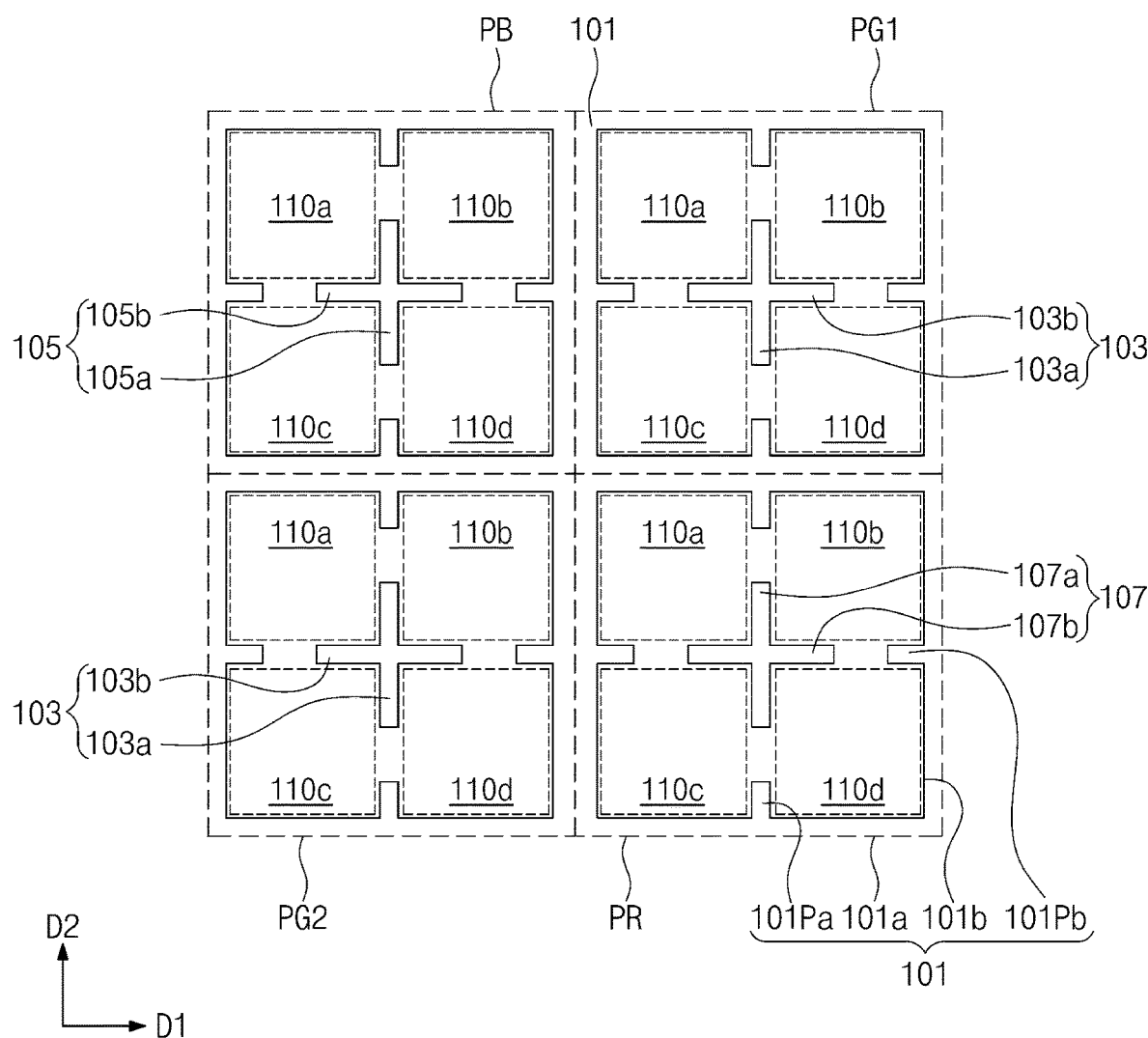

Referring to FIGS. 16A and 16B, in each of the first pixel regions PG1 and PG2, the first separation structure 103 may be provided between the first to fourth photoelectric conversion regions 110a, 110b, 110c, and 110d, and in the second pixel region PB, the second separation structure 105 may be provided between the first to fourth photoelectric conversion regions 110a, 110b, 110c, and 110d.

Referring to FIG. 16A, in the third pixel region PR, a first separation impurity region extending in the second direction D2 and a second separation impurity region extending in the first direction D1 may be provided in the semiconductor substrate 100. The first separation impurity region may be disposed between the first and second photoelectric conversion regions 110a and 110b and between the third and fourth photoelectric conversion regions 110c and 110d. The second separation impurity region may be disposed between the first and third photoelectric conversion regions 110a and 110c and between the second and fourth photoelectric conversion regions 110b and 110d. The pixel isolation structure 101 may include the first protruding portions 101Pa protruding from the first pixel isolation portions 101a in the second direction D2 and the second protruding portions 101Pb protruding from the second pixel isolation portions 101b in the first direction D1, as described with reference to FIG. 15A.

In each of the first to third pixel regions PG1, PG2, PB, and PR, the first protruding portions 101Pa of the pixel isolation structure 101 may be disposed between the first and second photoelectric conversion regions 110a and 110b and between the third and fourth photoelectric conversion regions 110c and 110d. The first protruding portions 101Pb of the pixel isolation structure 101 may be configured between the first and third photoelectric conversion regions 110a and 110c and between the second and fourth photoelectric conversion regions 110b and 110d.

Figure 16C:
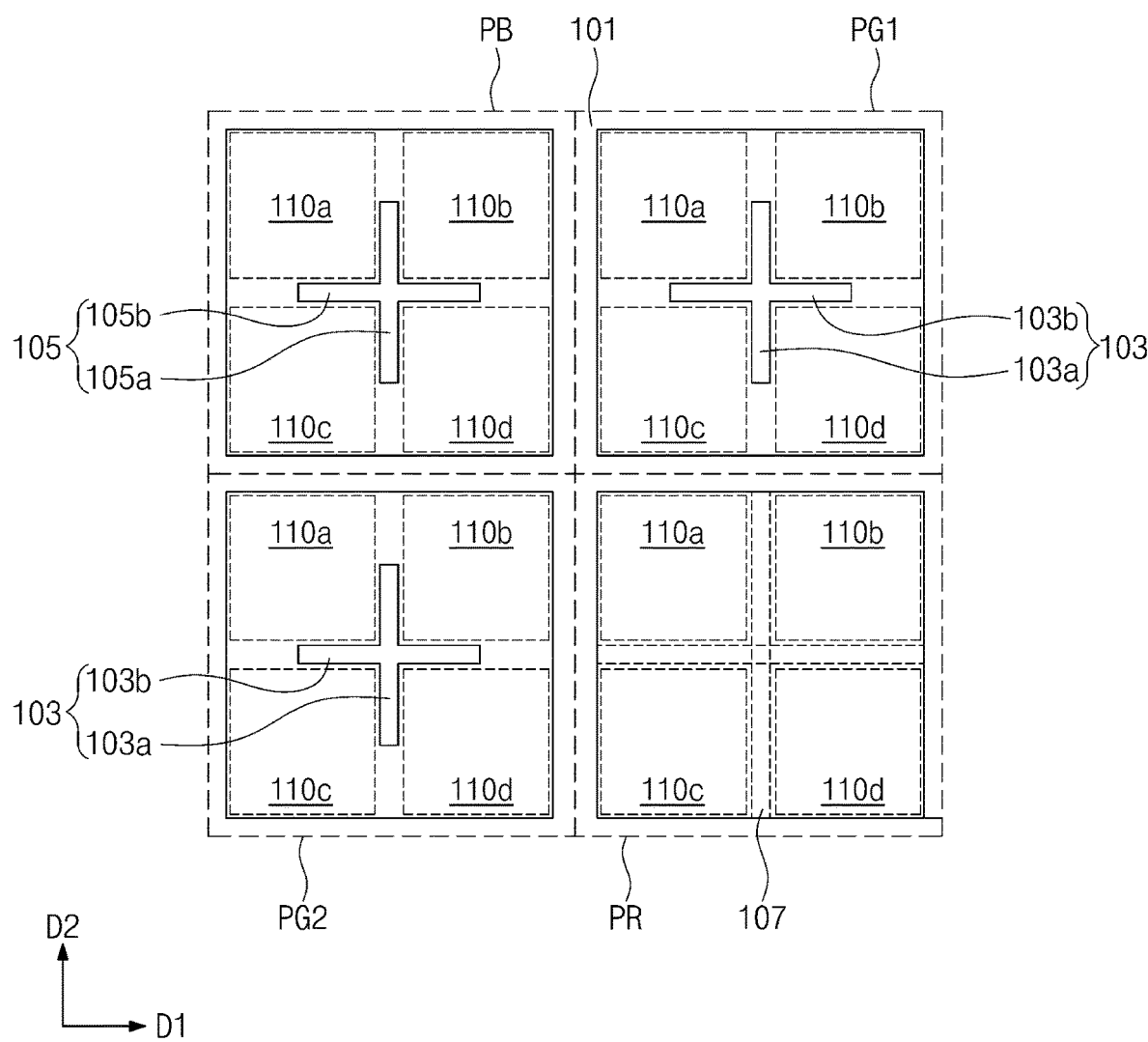

In an embodiment of FIG. 16C, the first and second protruding portions 101Pa and 101Pb of the pixel isolation structure 101 of FIG. 16A may be omitted.

Referring to FIG. 16B, in the third pixel region PR, the third separation structure 107 may be provided between the first to fourth photoelectric conversion regions 110a, 110b, 110c, and 110d, and the third separation structure 107 may have the same material and structure as the first and second separation structures 103 and 105. That is, the first to fourth photoelectric conversion regions 110a, 110b, 110c, and 110d may be provided in each of the first to third pixel regions PG1, PG2, PB, and PR, and the first to third separation structures 103, 105, and 107 may include first separation portions 103a, 105a, and 107a and second separation portions 103b, 105b, and 107b, which are disposed to cross each other. In addition, the pixel isolation structure 101 may include the first protruding portions 101Pa protruding from the first pixel isolation portions 101a in the second direction D2 and the second protruding portions 101Pb protruding from the second pixel isolation portions 101b in the first direction D1, as described with reference to FIG. 15A.

Figure 16D:
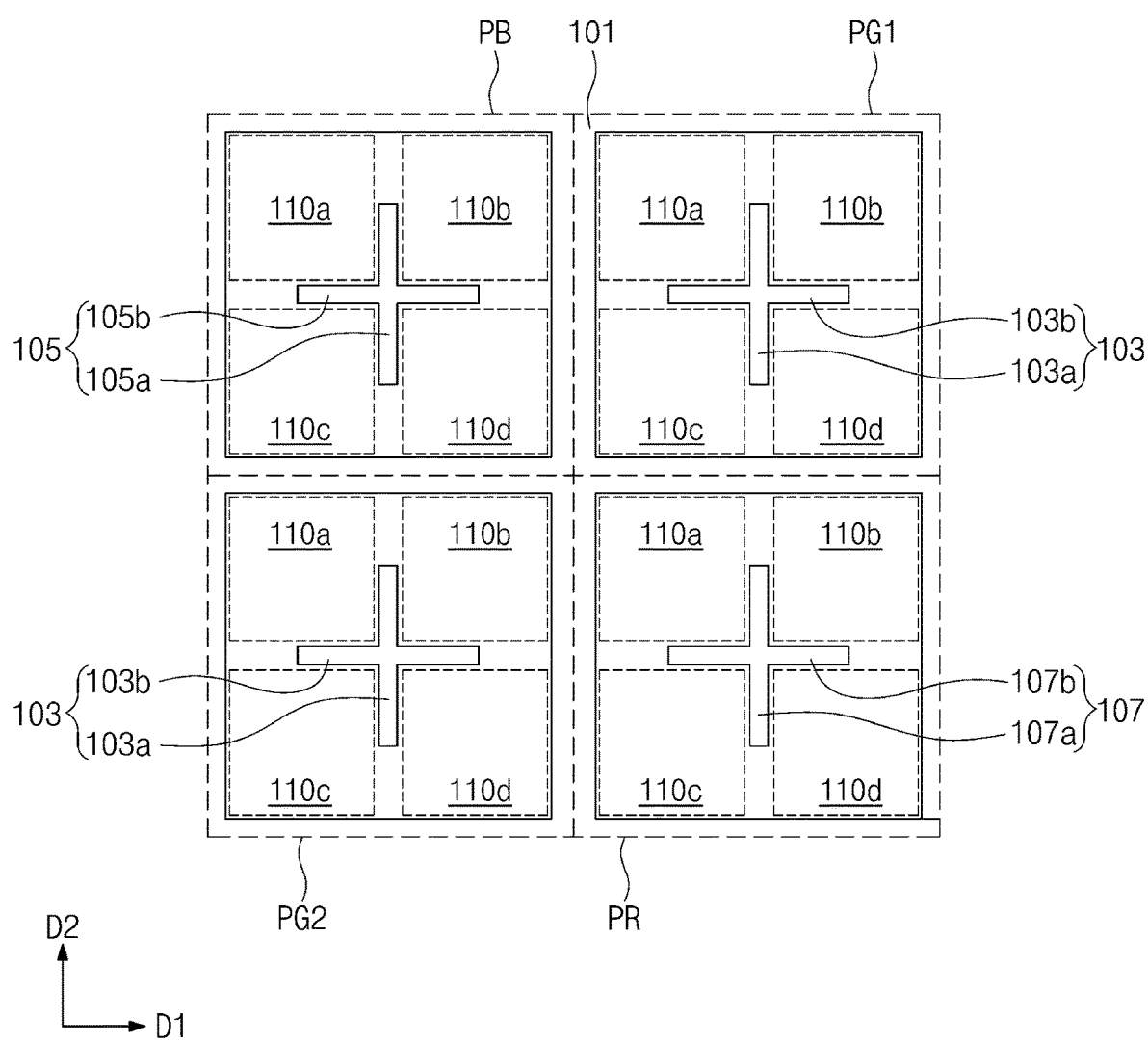

Referring to FIG. 16D, the first and second protruding portions 101Pa and 101Pb of the pixel isolation structure 101 of FIG. 16B may be omitted.

FIGS. 18A, 18B, 18C, 18D, 18E, and 18F are plan views illustrating an active pixel sensor array of an image sensor according to an embodiment of the inventive concept. FIGS. 19A and 19B are sectional views, which are taken along lines I-I' and II-II' of FIG. 19A to illustrate an active pixel sensor array of an image sensor according to an embodiment of the inventive concept.

Figure 18A:
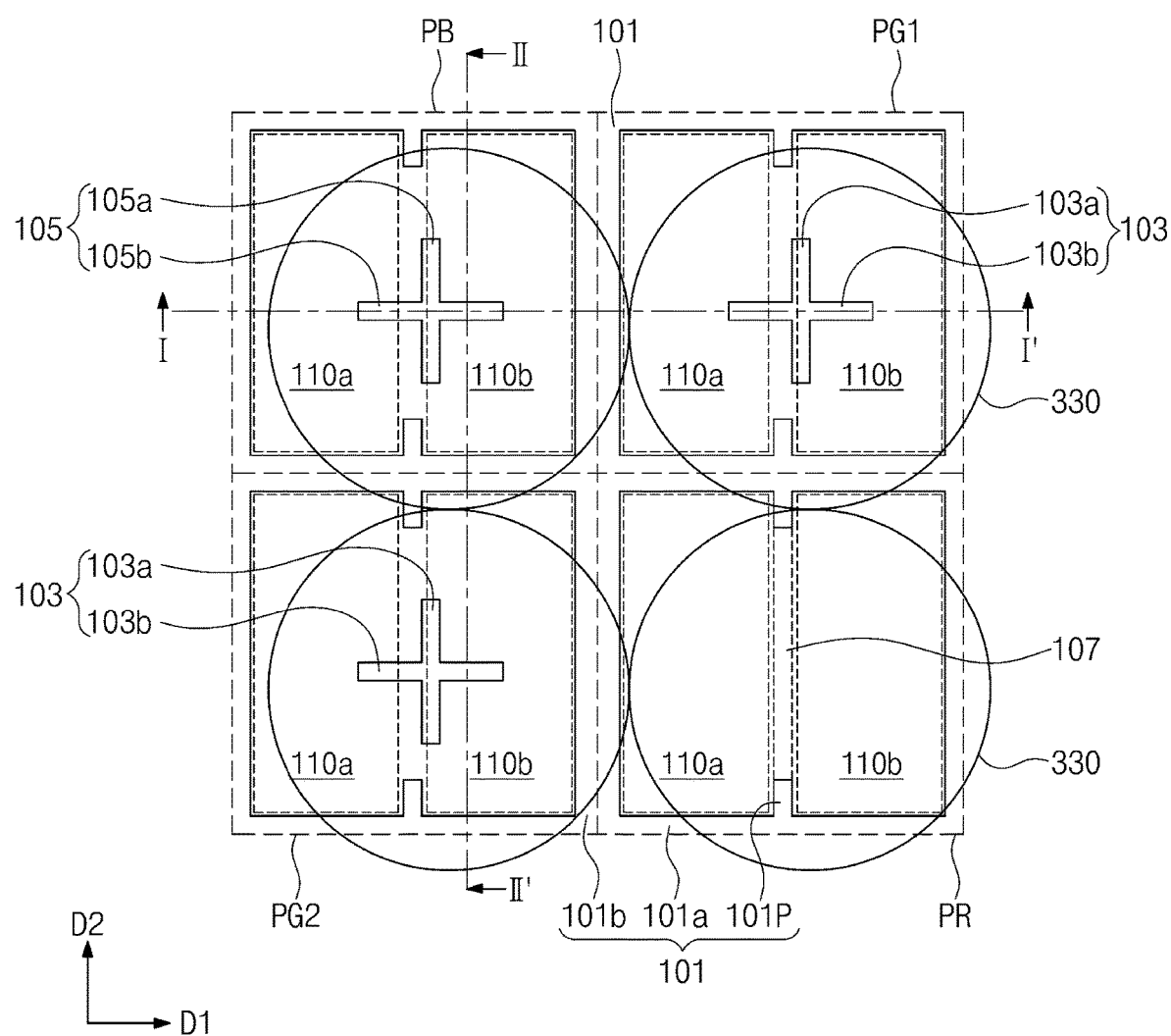

Referring to FIGS. 18A, 19A, and 19B, planar positions of the first to third separation structures 103, 105, and 107 in each of the first to third pixel regions PG1, PG2, PB, and PR may be changed depending on positions of the first to third pixel regions PG1, PG2, PB, and PR in the active pixel sensor array.

As previously described with reference to FIG. 2, the pixel array region R1 may include the center region CR and the edge regions ER. In the first to third pixel regions PG1, PG2, PB, and PR disposed in the edge regions ER, the first to third separation structures 103, 105, and 107 may be shifted toward the center region CR, as shown in FIGS. 18A and 18B.

Figure 18B:
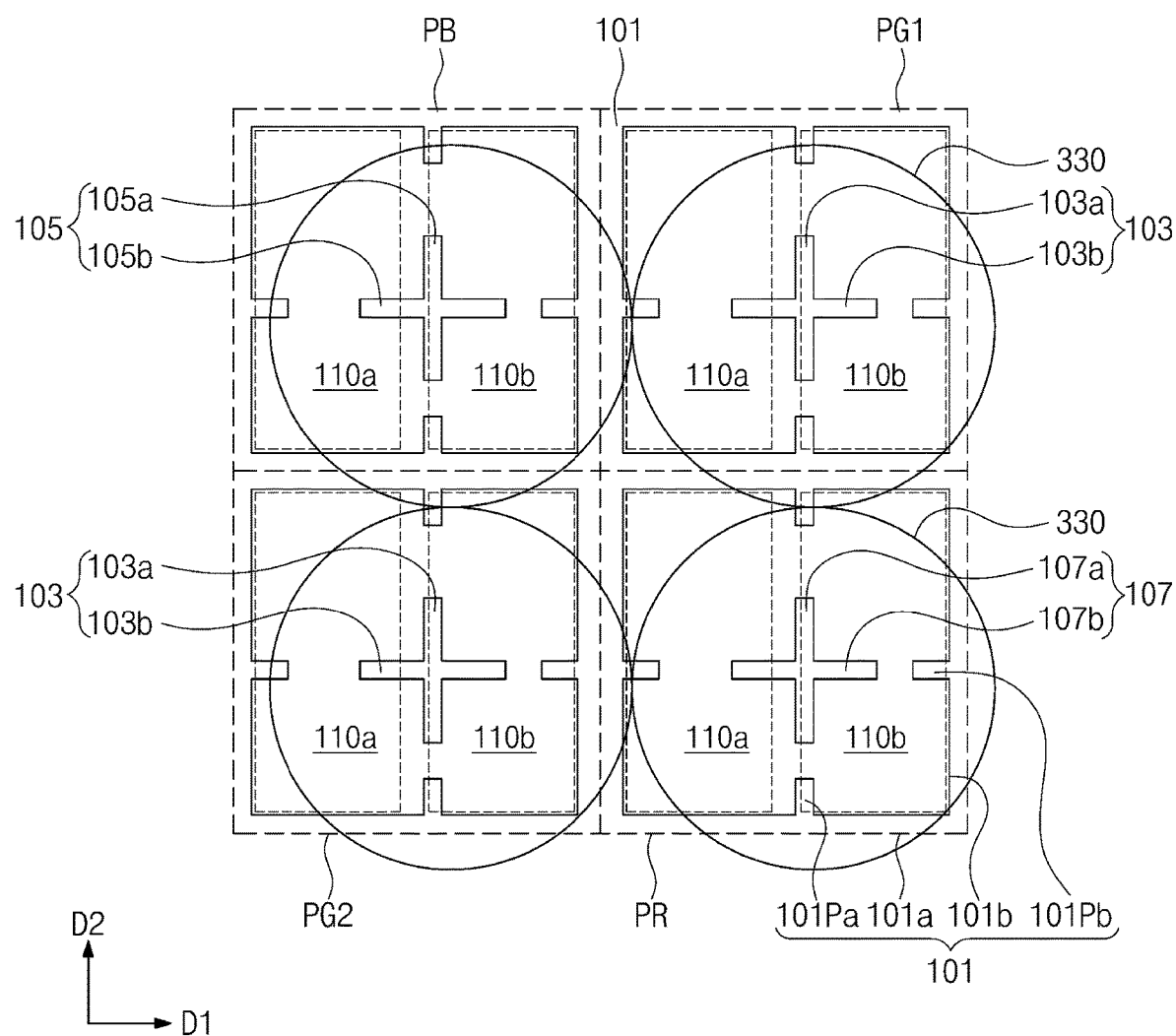

In detail, referring to FIGS. 18A and 18B, when viewed in a plan view, a center C1 of the first separation structure 103 may be offset with respect to a center PC1 of each of the first pixel regions PG1 and PG2, and a center C2 of the second separation structure 105 may be offset with respect to a center PC2 of the second pixel region PB. Here, the center C1 of the first separation structure 103 may be an intersecting point of the first and second separation portions 103a and 103b, and the center C2 of the second separation structure 105 may be an intersecting point of the first and second separation portions 105a and 105b.

As shown in FIGS. 18A and 18B, the first separation structures 103 may be positioned to be different from each other, in terms of distances to respective ones of the first pixel isolation portions 101a in the first direction D1. In addition, the first separation structures 103 may be positioned to be different from each other, in terms of distances to respective ones of the second pixel isolation portions 101b in the second direction D2.

Furthermore, as shown in FIGS. 18A and 18B, the micro lenses 330, which are provided to correspond to the pixel regions PG1, PG2, PB, and PR, respectively, may be shifted toward the center region CR of the pixel array region R1 (e.g., see FIG. 2), when viewed in a plan view. A center MC of the micro lens 330 may be offset with respect to a corresponding one of the centers PC1 and PC2 of the pixel regions, when viewed in a plan view. Alternatively, the center MC of the micro lens 330 may be offset with respect to the center C1 of the first separation structure 103, when viewed in a plan view.

A horizontal distance between the center MC of the micro lens 330 and the center PC1 or PC2 of each of the pixel regions PG1, PG2, PB, and PR may be substantially equal to a horizontal distance between the center of the first separation structure 103 and the center PC1 or PC2 of each of the first pixel regions PG1 and PG2. Alternatively, the horizontal distance between the center MC of the micro lens 330 and the center PC1 or PC2 of each of the pixel regions PG1, PG2, PB, and PR may be different from a horizontal distance between the center C1 of the first separation structure 103 and the center PC1 of each of the first pixel regions PG1 and PG2.

Referring to FIG. 18A, in the edge region ER of the pixel array region R1 (e.g., see FIG. 2), the centers of the first and second separation structures 103 and 105 may be offset with respect to the centers of the first and second pixel regions PG1, PG2, and PB, respectively, and the center of the third separation structure 107 composed of the separation impurity region may not be offset with respect to the center of the third pixel region PR.

The center of the first separation structure 103 may be spaced apart from the center of each of the first pixel regions PG1 and PG2 by a first horizontal distance, when viewed in a plan view. The center of the second separation structure 105 may be spaced apart from the center of the second pixel region PB by a second horizontal distance, which is substantially equal to the first horizontal distance, when viewed in a plan view.

A horizontal distance between the center of the second pixel region PB and the center of the second separation structure 105, in the second pixel region PB, may be different from a horizontal distance between the center of each of the first pixel regions PG1 and PG2 and the center of the first separation structure 103, in the first pixel regions PG1 and PG2.

Referring to FIG. 18B, the centers of the first to third separation structures 103, 105, and 107 may be offset with respect to the centers of the first to third pixel regions PG1, PG2, PB, and PR, respectively.

Furthermore, referring to FIGS. 18A and 18B, the pixel isolation structure 101 may include the first and second pixel isolation portions 101a and 101b and the first and second protruding portions 101Pa and 110Pb. In FIG. 18A, the first and second protruding portions 101Pa and 110Pb may locally protrude toward the center of each pixel region. By contrast, in FIG. 18B, the first and second protruding portions 101Pa and 110Pb may locally protrude toward the center of each of the separation structures 103, 105, and 107.

Figure 18C:
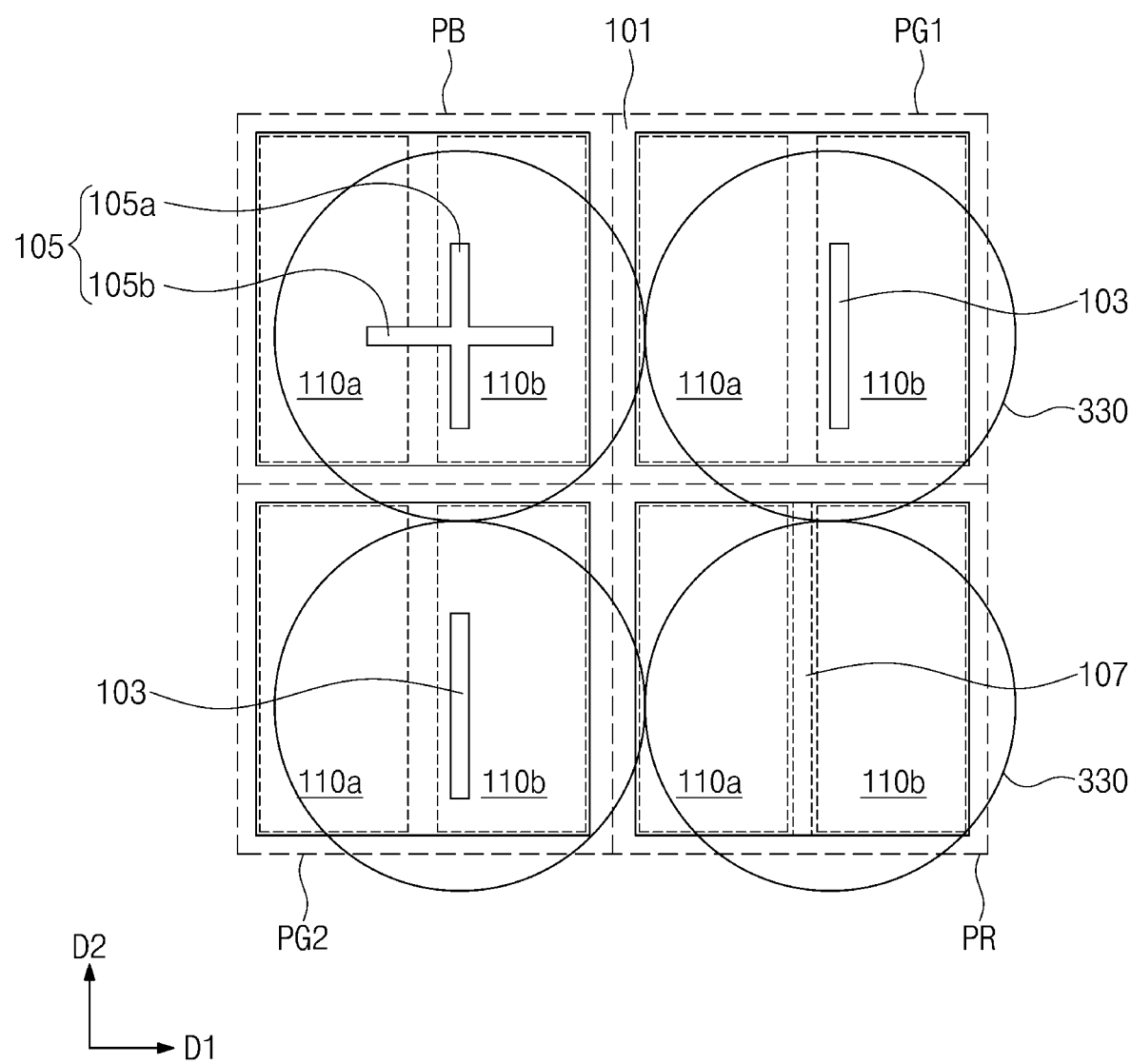
Figure 18D:
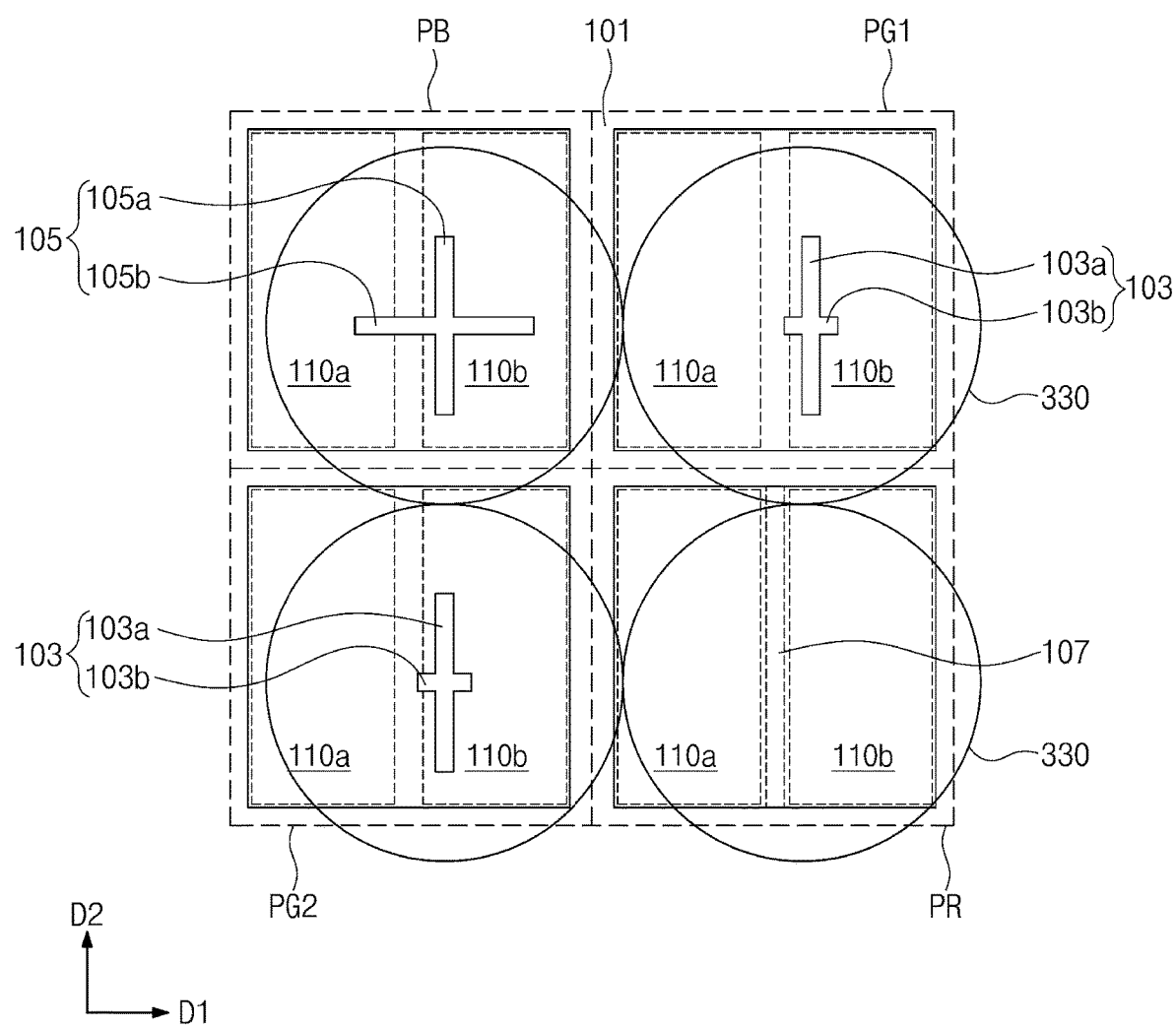

Referring to FIGS. 18C and 18D, the first and second protruding portions 101Pa and 101Pb of the pixel isolation structure 101 of FIGS. 18A and 18B may be omitted. In each of the first pixel regions PG1, the first separation structure 103 may be provided between the first and second photoelectric conversion regions 110a and 110b. In the second pixel region PB, the second separation structure 105, which includes the first and second separation portions 105a and 105b crossing each other, may be provided between the first and second photoelectric conversion regions 110a and 110b. In the edge region ER of the pixel array region R1 (e.g., see FIG. 2), the centers of the first and second separation structures 103 and 105 may be offset with respect to the centers of the first and second pixel regions PG1, PG2, and PB, respectively. In addition, the micro lenses 330, which are provided to correspond to the pixel regions PG1, PG2, PB, and PR, respectively, may be shifted toward the center region CR of the pixel array region R1 (e.g., of FIG. 2), when viewed in a plan view.

Figure 18E:
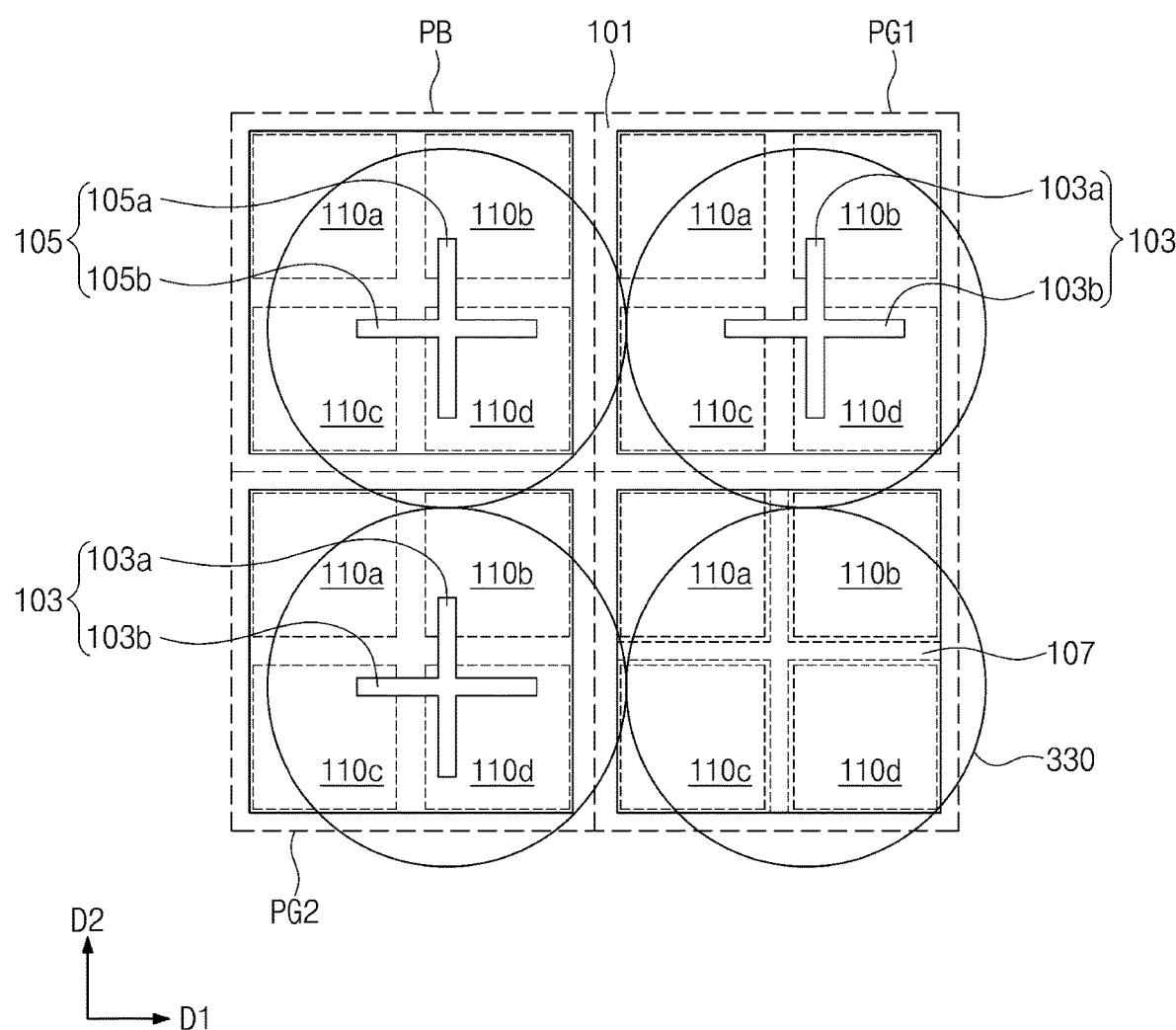
Figure 18F:
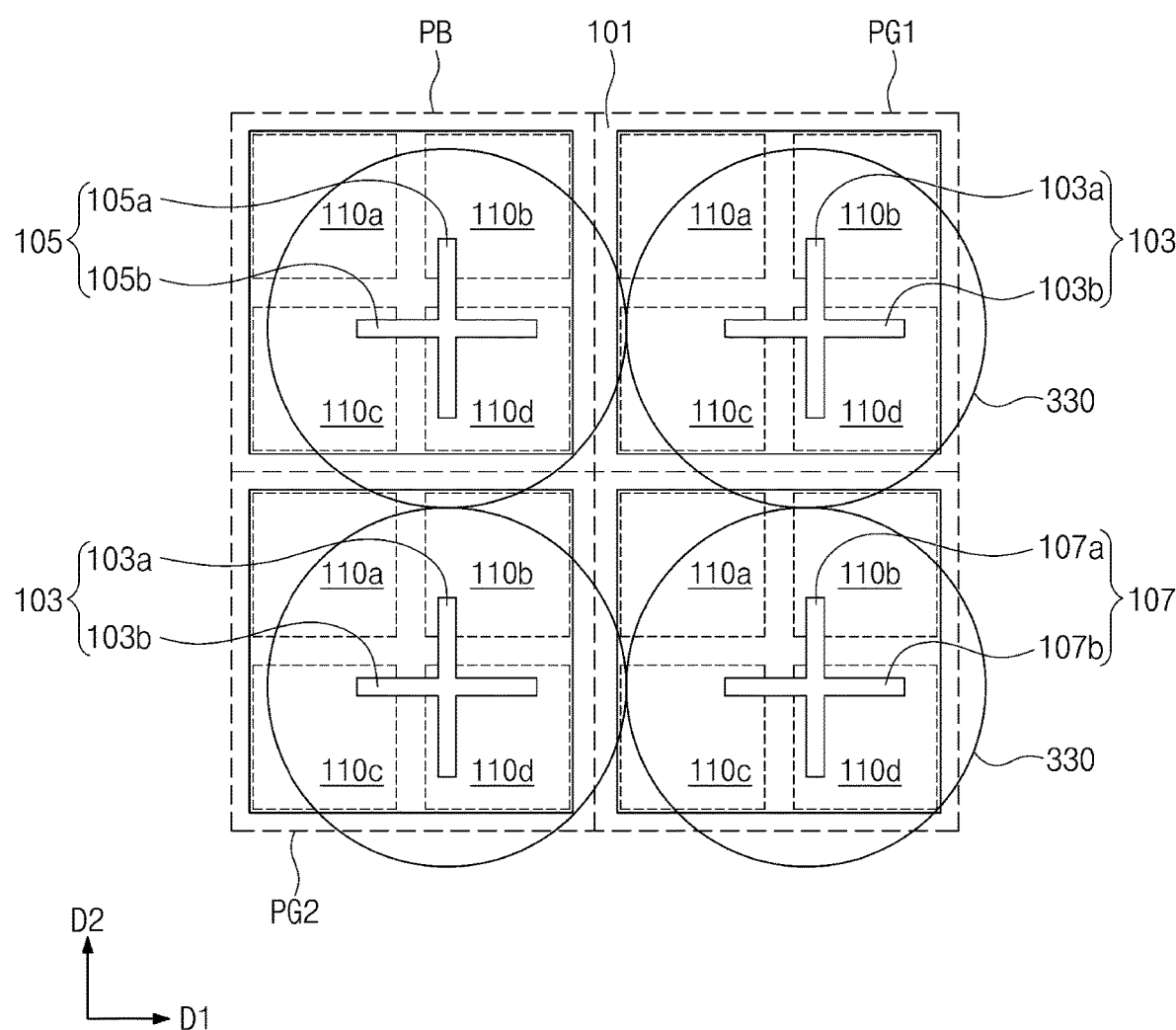

Referring to FIGS. 18E and 18F, the first to fourth photoelectric conversion regions 110a, 110b, 110c, and 110d may be provided in each of the first to third pixel regions PG1, PG2, PB, and PR.

Referring to FIG. 18E, the first or second separation structure 103 or 105, which includes the first and second separation portions 103a and 103b or 105a and 105b crossing each other, may be provided in each of the first and second pixel regions PG1, PG2, and PB. Referring to FIG. 18F, the first or second separation structure 103 or 105, which includes the first and second separation portions 103a and 103b or 105a and 105b crossing each other, may be provided in each of the first to third pixel regions PG1, PG2, PB, and PR.

As described above, the centers of the first to third separation structures 103, 105, and 107 shown in FIGS. 18E and 18D may be offset with respect to the centers of the first and second pixel regions PG1, PG2, and PB, respectively, in the edge region ER of the pixel array region R1 (e.g., of FIG. 2). In addition, the micro lenses 330, which are provided to correspond to the pixel regions PG1, PG2, PB, and PR, respectively, may be shifted toward the center region CR of the pixel array region R1 (e.g., of FIG. 2), when viewed in a plan view.

The inventive concept described with reference to FIGS. 5A to 19B may be applied to an image sensor having a color filter array structure of a tetra, nona, or hexadeca arrangement.

FIG. 20 is a plan view illustrating an active pixel sensor array of an image sensor according to an embodiment of the inventive concept. Sectional views taken along lines I-I', II-II', III-III', and IV-IV' of FIG. 20 may be the same as or similar to those shown in FIGS. 6A to 6D, respectively.

Referring to FIG. 20 and FIGS. 6A to 6D, the semiconductor substrate 100 may include pixel group regions GG1, GG2, GB, and GR. The pixel group regions GG1, GG2, GB, and GR may include first to third pixel group regions GG1, GG2, GB, and GR. The first pixel group regions GG1 and GG2 may be arranged in a diagonal direction with respect to each other. The first pixel group regions GG1 and GG2 may include first pixel regions PG1 and PG2. The first pixel regions PG1 and PG2 may include first right pixel regions PG1 and first left pixel regions PG2. The first pixel group regions GG1 and GG2 may include a first right pixel group region GG1 and first left pixel group regions GG2.

The pixel regions PG1, PG2, PB, and PR included in each of the pixel group regions GG1, GG2, GB, and GR may be arranged to form n columns and m rows. Here, the numbers n and m may be each independently a natural number that is greater than or equal to 2. In the present embodiment, the first right pixel group region GG1 may include four first right pixel regions PG1, which are arranged in a 2×2 matrix (i.e., in two columns and two rows). The first left pixel group region GG2 may include four first left pixel regions PG2, which are arranged in a 2×2 matrix (i.e., in two columns and two rows). The second pixel group region GB may include four second pixel regions PB, which are arranged in a 2×2 matrix (i.e., in two columns and two rows). The third pixel group region GR may include four third pixel regions PR, which are arranged in a 2×2 matrix (i.e., in two columns and two rows). FIG. 20 illustrates an example of an image sensor having a tetra arrangement structure.

Light beams having different wavelength ranges may be incident into the first to third pixel regions PG1, PG2, PB, and PR, respectively. Light beams with a first wavelength range may be incident into the first pixel regions PG1 and PG2, and light beams, which have a second wavelength range shorter than the first wavelength range, may be incident into the second pixel regions PB. Light beams, which have a third wavelength range longer than the first wavelength range, may be incident into the third pixel regions PR. For example, green light may be incident into the first pixel regions PG1 and PG2, red light may be incident into the second pixel region PB, and blue light may be incident into the third pixel region PR.

The first pixel group regions GG1 and GG2 may correspond to a group of the first pixel regions PG1 and PG2, which are used to sense the light beam with the first wavelength range. For example, only the green color filters 320G may be disposed in the first pixel regions PG1 and PG2 of the first pixel group region GG1 and GG2. The second pixel group region GB may correspond to a group of the second pixel regions PB, which are used to sense the light beam with the second wavelength range. For example, only the blue color filters 320B may be disposed in the second pixel regions PB of the second pixel group region GB. The third pixel group region GR may correspond to a group of the third pixel regions PR, which are used to sense the light beam with the third wavelength range. For example, only the red color filters 320R may be disposed in the third pixel regions PR of the third pixel group region GR.

The first separation structure 103 may be disposed in each of the first pixel regions PG1 and PG2 of the first pixel group regions GG1 and GG2. The first separation structure 103 may be a bar-shaped structure extending in the second direction D2, when viewed in a plan view. The second separation structure 105 may be disposed in each of the second pixel regions PB of the second pixel group regions GB. The second separation structure 105 may include the first separation portion 105a, which extends in the second direction D2, and the second separation portion 105b, which extends in the first direction D1 and crosses the first separation portion 105a, when viewed in a plan view. For example, the second separation structure 105 may be a cross-shaped structure, when viewed in a plan view. The third separation structure 107 may be disposed in each of the third pixel regions PR of the third pixel group regions GR. The first separation structure 103 and the second separation structure 105 may be spaced apart from the pixel isolation structure 101.

The first separation structure 103 and the second separation structure 105 may include an insulating material, whose refractive index is different from that of the semiconductor substrate 100 (e.g., silicon). The third separation structure 107 may be a separation impurity region, which is doped with impurities and is of the same conductivity type as the semiconductor substrate 100. Here, the third separation structure 107 may be in contact with a side surface of the pixel isolation structure 101. Except for the afore-described differences, the image sensor of FIG. 20 may have substantially the same or similar structural features as those in the previous embodiments.

In an embodiment, the first and second separation structures 103 and 105, which are formed of an insulating material having a different refractive index from that of the semiconductor substrate 100, may be provided in the first and second pixel regions PG1, PG2, and PB sensing the green and blue lights to physically prevent a cross-talk phenomenon between the first and second photoelectric conversion regions 110a and 110b. In this case, it may be possible to precisely separate signals, which are sensed by left and right photoelectric conversion regions 110a and 110b, and to precisely readout a difference between the signals. This may make it possible to realize an improved auto-focusing function.

Meanwhile, since the wavelength of the red light is longer than those of the green and blue lights, the red light may have a relatively large penetration depth, and thus, the red light may be scattered by a surface of an insulating layer with a different refractive index. Owing to this scattering, signals sensed by the left and right photoelectric conversion regions 110a and 110b may suffer from an increased noise issue. However, in the present embodiment, in the third pixel regions PR sensing the red light, the third separation structure 107 may have an impurity doped region preventing this scattering, and thus, it may be possible to effectively suppress the noise issue.

FIG. 21 is a plan view illustrating an active pixel sensor array of an image sensor according to an embodiment of the inventive concept.

Referring to FIG. 21, in the image sensor according to the present embodiment, the first to third separation structures 103, 105, and 107 may be respectively disposed in the first to third pixel regions PG1, PG2, PB, and PR of the first pixel group regions GG1 and GG2. Each of the first to third separation structures 103, 105, and 107 may include an insulating material, whose refractive index is different from that of the semiconductor substrate 100 (e.g., silicon). Except for the afore-described differences, the image sensor of FIG. 21 may be configured to have substantially the same or similar structural features as those of FIG. 20.

FIG. 22 is a plan view illustrating an active pixel sensor array of an image sensor according to an embodiment of the inventive concept.

Referring to FIG. 22, the first right pixel group region GG1 may include nine first right pixel regions PG1, which are arranged in a 3×3 matrix (i.e., in three columns and three rows). The first left pixel group region GG2 may include nine first left pixel regions PG2, which are arranged in a 3×3 matrix (i.e., in three columns and three rows). The second pixel group region GB may include nine second pixel regions PB, which are arranged in a 3×3 matrix (i.e., in three columns and three rows). The third pixel group region GR may include nine third pixel regions PR, which are arranged in a 3×3 matrix (i.e., in three columns and three rows). FIG. 22 illustrates an example of an image sensor having a nona arrangement structure. The first to third separation structures 103, 105, and 107 may be respectively disposed in the first to third pixel regions PG1, PG2, PB, and PR of the first pixel group regions GG1 and GG2. Each of the first separation structures 103 may be a cross-shape structure, when viewed in a plan view. Alternatively, each of the first separation structures 103 may be a bar-shaped structure, as shown in FIG. 20, when viewed in a plan view. Each of the second separation structures 105 may be a cross-shape structure, when viewed in a plan view. Each of the third separation structures 107 may be a cross-shape structure, when viewed in a plan view, and may include an insulating material, whose refractive index is different from that of the semiconductor substrate 100. In an embodiment, each of the third separation structures 107 may be a doped region, which is doped with impurities and is of the same conductivity type as the semiconductor substrate, like the embodiment of FIG. 20. Except for the afore-described differences, the image sensor of FIG. 22 may be configured to have substantially the same or similar structural features as those of FIG. 21.

FIG. 23 is a plan view illustrating an active pixel sensor array of an image sensor according to an embodiment of the inventive concept.

Referring to FIG. 23, the first right pixel group region GG1 may include sixteen first right pixel regions PG1, which are arranged in a 4×4 matrix (i.e., in four columns and four rows). The first left pixel group region GG2 may include sixteen first left pixel regions PG2, which are arranged in a 4×4 matrix (i.e., in four columns and four rows). The second pixel group region GB may include sixteen second pixel regions PB, which are arranged in a 4×4 matrix (i.e., in four columns and four rows). The third pixel group region GR may include sixteen third pixel regions PR, which are arranged in a 4×4 matrix (i.e., in four columns and four rows). FIG. 23 illustrates an example of an image sensor having a hexadeca arrangement structure. Except for the afore-described differences, the image sensor of FIG. 23 may be configured to have substantially the same or similar structural features as those of FIG. 22.

FIG. 24 is a plan view illustrating an active pixel sensor array of an image sensor according to an embodiment of the inventive concept.

Referring to FIG. 24, one pixel group region GP may include a plurality of pixel regions PX sensing light within the same wavelength range. The pixel regions PX may be located near the edge region ER of FIG. 2. The pixel group region GP may be one of the first to third pixel group regions GG1, GG2, GB, and GR described with reference to FIGS. 20 to 23. Separation structures SR may be disposed in the pixel regions PX, respectively. All of the separation structures SR may have the same shape, when viewed in a plan view. The micro lenses 330 may be disposed on the pixel regions PX, respectively. A center PC of each of the pixel regions PX may be located on a center line CL of each of the pixel regions PX. In the present embodiment, the center PC of each pixel region PX may overlap with a center SC of each separation structure SR, when viewed in a plan view. By contrast, the center MC of each micro lens 330 may be spaced apart from the center PC of each pixel region PX in a specific direction by a specific distance. Except for the afore-described differences, the image sensor of FIG. 24 may be configured to have substantially the same or similar structural features as those in the previous embodiments.

FIG. 25 is a plan view illustrating an active pixel sensor array of an image sensor according to an embodiment of the inventive concept.

Referring to FIG. 25, the pixel regions PX may be located near the edge region ER of FIG. 2. In the present embodiment, when viewed in a plan view, the center SC of each separation structure SR may be spaced apart from the center PC of each pixel region PX in a specific direction by a specific distance. The center MC of each micro lens 330 may be spaced apart from the center SC of each separation structure SR in a specific direction by a specific distance. In the present embodiment, by shifting the position of the separation structure SR from the center PC of the pixel region PX and/or from the center MC of the micro lens 330, it may be possible to increase an amount of light incident into the photoelectric conversion regions 110a and 110b, even without changing a position of a module lens of a camera. This may make it possible to improve an auto-focusing function of the image sensor. Except for the afore-described differences, the image sensor of FIG. 25 may be configured to have substantially the same or similar structural features as those of FIG. 24.

FIG. 26 is a plan view illustrating an active pixel sensor array of an image sensor according to an embodiment of the inventive concept.

Referring to FIG. 26, one pixel group region GP may include a plurality of pixel regions PX1-PX4 sensing light within the same wavelength range. The pixel regions PX1-PX4 may include first to fourth pixel regions PX1-PX4. Each of first to fourth separation structures SR1-SR4 may be disposed in the semiconductor substrate 100 of FIG. 6A and in a corresponding one of the first to fourth pixel regions PX1-PX4. Each of first to fourth micro lenses 331-334 may be disposed on the semiconductor substrate 100 of FIG. 6A and in a corresponding one of the first to fourth pixel regions PX1-PX4.

In the present embodiment, centers SC1-SC4 of the first to fourth separation structures SR1-SR4 may be located at different positions. For example, the center SC1 of the first separation structure SR1 may be located between the center PC1 of the first pixel region PX1 and a center MC1 of the first micro lens 331. The center SC1 of the first separation structure SR1 may be spaced apart from the center PC1 of the first pixel region PX1 in a fourth direction D4.

The center SC2 of the second separation structure SR2 may be absent between the center PC2 of the second pixel region PX2 and a center MC2 of the second micro lens 332, and may be located at the right of the center PC2 of the second pixel region PX2 and behind the center line CL. The center SC2 of the second separation structure SR2 may be spaced apart from the center PC2 of the second pixel region PX2 in a fifth direction D5. The fourth direction D4 may not be parallel to the fifth direction D5.

The center SC3 of the third separation structure SR3 may be located between the center PC3 of the third pixel region PX3 and a center MC3 of the third micro lens 333 but may be closer to the center PC3 of the third pixel region PX3 than the center MC3 of the third micro lens 333. The center SC3 of the third separation structure SR3 may be spaced apart from the center PC3 of the third pixel region PX3 by a first distance DS1.

The center SC4 of the fourth separation structure SR4 may be absent between the center PC4 of the fourth pixel region PX4 and a center MC4 of the fourth micro lens 334 and may be located at the left of the center PC4 of the fourth pixel region PX4 and in front of the center line CL. The center SC4 of the fourth separation structure SR4 may be spaced apart from the center PC4 of the fourth pixel region PX4 by a second distance DS2. The first distance DS1 may be different from the second distance DS2.

In the present embodiment, by making a difference in shifting positions of the separation structures SR1-SR4 in the pixel regions PX1-PX4, which are included in one pixel group region to sense the same light, it may be possible to increase an amount of light incident into the photoelectric conversion regions 110a and 110b, even without changing a position of a module lens of a camera. This may make it possible to improve an auto-focusing function of the image sensor. Except for the afore-described differences, the image sensor of FIG. 26 may be configured to have substantially the same or similar structural features as those of FIG. 24.

According to an embodiment of the inventive concept, a separation structure between first and second photoelectric conversion regions may reduce a difference between a cross-talk among pixel regions adjacent to each other in a first direction and a cross-talk among pixel regions adjacent to each other in a second direction. Thus, it may be possible to prevent or suppress a noise level from being changed depending on positions of the pixel regions. Furthermore, since the separation structure is spaced apart from the pixel isolation structure, light may be incident into the first and second photoelectric conversion regions between the separation structure and the pixel isolation structure. Thus, an amount of light incident into the first and second photoelectric conversion regions may be increased, and this may increase a difference between signals, which are output from the first and second photoelectric conversion regions of each pixel region. By comparing the signals output from the first and second photoelectric conversion regions, it may be possible to improve an operation property in an auto-focusing operation of controlling a position of a lens.

In short, according to an embodiment of the inventive concept, it may be possible to improve a cross-talk property in each pixel region and to improve an auto-focusing operation property of an image sensor.

While example embodiments of the inventive concepts have been particularly shown and described, it will be understood by one of ordinary skill in the art that variations in form and detail may be made therein without departing from the spirit and scope of the attached claims.

Spatially relative terms, such as "front," "rear," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. The device may be otherwise oriented (rotated 90 degrees or at other orientations) and the spatially relative descriptors used herein interpreted accordingly.

In addition, ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

What is claimed is:

1. An image sensor, comprising:
a semiconductor substrate including a first pixel group region and a second pixel group region, the first pixel group region comprising first pixel regions, which are arranged in n columns and m rows and are used to sense a first light, the second pixel group region comprising second pixel regions, which are arranged in n columns and m rows and are used to sense a second light, where the numbers n and m are each independently a natural number that is greater than or equal to 2;
a pixel isolation structure disposed in the semiconductor substrate to separate the first and second pixel regions from each other;
first and second photoelectric conversion regions disposed in each of the first and second pixel regions of the semiconductor substrate; and
a first separation structure disposed in each of the first pixel regions and in the semiconductor substrate between the first and second photoelectric conversion regions,
wherein the first separation structure is spaced apart from the pixel isolation structure.

2. The image sensor of claim 1, wherein the first separation structure comprises an insulating material whose refractive index is different from a refractive index of the semiconductor substrate.

3. The image sensor of claim 1, wherein the first separation structure is a bar-shaped structure crossing a region between the first and second photoelectric conversion regions or a cross-shaped structure, when viewed in a plan view.

4. The image sensor of claim 1, further comprising a second separation structure, which is disposed in each of the second pixel regions and in the semiconductor substrate between the first and second photoelectric conversion regions,
wherein a wavelength of the second light is greater than a wavelength of the first light, and
the second separation structure is an impurity-doped region formed in the semiconductor substrate.

5. The image sensor of claim 1, further comprising a second separation structure, which is disposed in each of the second pixel regions and in the semiconductor substrate between the first and second photoelectric conversion regions,
wherein the first separation structure has the same shape as that of the second separation structure, when viewed in a plan view.

6. The image sensor of claim 1, further comprising first micro lenses, which are respectively disposed on the first pixel regions of the semiconductor substrate,
wherein centers of the first micro lenses are spaced apart from centers of the first pixel regions, respectively, when viewed in a plan view.

7. The image sensor of claim 6, wherein centers of the first separation structures overlap with the centers of the first pixel regions, respectively, when viewed in a plan view.

8. The image sensor of claim 6, wherein centers of the first separation structures are spaced apart from the centers of the first pixel regions and the centers of the first micro lenses, when viewed in a plan view.

9. The image sensor of claim 1, wherein the first pixel regions comprise a first right pixel region and a first left pixel region,
the first separation structures comprise a first right separation structure disposed in the first right pixel region and a first left separation structure disposed in the first left pixel region,
a center of the first right separation structure is spaced apart from a center of the first right pixel region in a first direction,
a center of the first left separation structure is spaced apart from a center of the first left pixel region in a second direction, and
the first direction is not parallel to the second direction.

10. The image sensor of claim 1, wherein the first pixel regions comprise a first right pixel region and a first left pixel region,
the first separation structures comprise a first right separation structure disposed in the first right pixel region and a first left separation structure disposed in the first left pixel region,
a center of the first right separation structure is spaced apart from a center of the first right pixel region by a first distance,
a center of the first left separation structure is spaced apart from a center of the first left pixel region by a second distance, and
the first distance is different from the second distance.

11. An image sensor, comprising:
a semiconductor substrate including a first pixel group region and a second pixel group region, the first pixel group region comprising first pixel regions, which are arranged in n columns and m rows and are used to sense a first light, the second pixel group region comprising second pixel regions, which are arranged in n columns and m rows and are used to sense a second light, where the numbers n and m are each independently a natural number that is greater than or equal to 2; and
first micro lenses respectively disposed on the first pixel regions of the semiconductor substrate,
wherein centers of the first micro lenses are spaced apart from centers of the first pixel regions, respectively, when viewed in a plan view.

12. The image sensor of claim 11, further comprising:
a pixel isolation structure disposed in the semiconductor substrate to separate the first and second pixel regions from each other;
first and second photoelectric conversion regions disposed in each of the first and second pixel regions of the semiconductor substrate; and
first separation structures disposed in the first pixel regions, respectively, and in the semiconductor substrate between the first and second photoelectric conversion regions,
wherein the first separation structure is spaced apart from the pixel isolation structure.

13. The image sensor of claim 12, wherein centers of the first separation structures overlap with the centers of the first pixel regions, respectively, when viewed in a plan view.

14. The image sensor of claim 12, wherein centers of the first separation structures are respectively spaced apart from the centers of the first pixel regions and the centers of the first micro lenses, when viewed in a plan view.

15. The image sensor of claim 12, wherein the first pixel regions comprise a first right pixel region and a second left pixel region,
the first separation structures comprise a first right separation structure disposed in the first right pixel region and a second left separation structure disposed in the first left pixel region,
a center of the first right separation structure is spaced apart from a center of the first right pixel region in a first direction,
a center of the first left separation structure is spaced apart from a center of the first left pixel region in a second direction, and
the first direction is not parallel to the second direction.

16. The image sensor of claim 12, wherein the first pixel regions comprise a first right pixel region and a second left pixel region,
the first separation structures comprise a first right separation structure disposed in the first right pixel region and a second left separation structure disposed in the first left pixel region,
a center of the first right separation structure is spaced apart from a center of the first right pixel region by a first distance,
a center of the first left separation structure is spaced apart from a center of the first left pixel region by a second distance, and
the first distance is different from the second distance.

17. An image sensor, comprising:
a semiconductor substrate including a first pixel group region, a second pixel group region, and a third pixel group region, the first pixel group region comprising first pixel regions arranged in n columns and m rows to sense a first light, the second pixel group region comprising second pixel regions arranged in n columns and m rows to sense a second light, the third pixel group region comprising third pixel regions arranged in n columns and m rows to sense a third light, where the numbers n and m are each independently a natural number that is greater than or equal to 2;
a pixel isolation structure disposed in the semiconductor substrate to separate the first to third pixel regions from each other;
first and second photoelectric conversion regions disposed in each of the first to third pixel regions of the semiconductor substrate;
a first separation structure disposed in each of the first pixel regions and in the semiconductor substrate between the first and second photoelectric conversion regions;
a second separation structure disposed in each of the second pixel regions and in the semiconductor substrate between the first and second photoelectric conversion regions; and
a third separation structure disposed in each of the third pixel regions and in the semiconductor substrate between the first and second photoelectric conversion regions,
wherein the first separation structure and the second separation structure are spaced apart from the pixel isolation structure.

18. The image sensor of claim 17, wherein a wavelength of the second light is longer than a wavelength of the first light and is shorter than a wavelength of the third light, and
the first separation structure has a cross shape and the second separation structure has a bar shape, when viewed in a plan view.

19. The image sensor of claim 18, wherein the third separation structure is an impurity-doped region formed in the semiconductor substrate.

20. The image sensor of claim 17, further comprising first micro lenses respectively disposed on the first pixel regions of the semiconductor substrate,
wherein centers of the first micro lenses are spaced apart from centers of the first pixel regions, respectively, when viewed in a plan view.

* * * * *